(12) United States Patent
Yamamoto et al.

(10) Patent No.: US 8,635,400 B2
(45) Date of Patent: *Jan. 21, 2014

(54) STORAGE SYSTEM HAVING A PLURALITY OF FLASH PACKAGES

(71) Applicant: Hitachi, Ltd., Tokyo (JP)

(72) Inventors: Akira Yamamoto, Sagamihara (JP); Sadahiro Sugimoto, Kawasaki (JP); Akihiko Araki, Yokohama (JP); Masayuki Yamamoto, Sagamihara (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/761,251

(22) Filed: Feb. 7, 2013

(65) Prior Publication Data

US 2013/0151763 A1 Jun. 13, 2013

Related U.S. Application Data

(63) Continuation of application No. 12/670,241, filed as application No. PCT/JP2009/003437 on Jul. 22, 2009, now Pat. No. 8,392,648.

(51) Int. Cl.
*G06F 12/00* (2006.01)

(52) U.S. Cl.
USPC .......... 711/103; 711/100; 711/114; 711/154; 711/165; 711/E12.008

(58) Field of Classification Search
USPC .......... 711/100, 103, 114, 154, 165, E12.008
See application file for complete search history.

(56) References Cited

U.S. PATENT DOCUMENTS

| | | | |
|---|---|---|---|
| 5,930,193 | A | 7/1999 | Achiwa et al. |
| 7,260,670 | B2 | 8/2007 | Kawai |
| 8,015,371 | B2 | 9/2011 | Araki et al. |
| 2007/0055713 | A1 | 3/2007 | Nagai et al. |
| 2007/0174673 | A1 | 7/2007 | Kawaguchi et al. |
| 2007/0233931 | A1 | 10/2007 | Tanaka et al. |
| 2008/0010398 | A1 | 1/2008 | Jiang |
| 2010/0017649 | A1 | 1/2010 | Wu et al. |

FOREIGN PATENT DOCUMENTS

| | | |
|---|---|---|
| JP | 3507132 B2 | 3/2004 |
| JP | 200766259 A | 3/2007 |
| JP | 2007199922 A | 8/2007 |
| JP | 2007-265265 A | 10/2007 |
| JP | 2008-15769 A | 1/2008 |

*Primary Examiner* — Jasmine Song

(74) *Attorney, Agent, or Firm* — Mattingly & Malur, PC

(57) ABSTRACT

A storage system 100, which has a plurality of flash packages 230, has a function for minimizing the imbalance of the number of deletions of each block inside the flash package 230 and a block-unit capacity virtualization function, and efficiently manifests lessening of the imbalance of the number of deletions and reduction in the data storage capacity for the entire storage system 100 by having functions for calculating the number of deletions and the data occupancy of each flash package 230, and for transferring data between the flash packages 230 on the basis of the values of these number of deletions and data occupancy.

14 Claims, 33 Drawing Sheets

LOGICAL VOLUME INFORMATION 2000

SCHEDULE INFORMATION 2700

REAL PAGE INFORMATION 2100

PACKAGE GROUP INFORMATION 2300

FLUSH PACKAGE INFORMATION 2500

PACKAGE INFORMATION 3000

CHIP INFORMATION 3100

VIRTUAL BLOCK INFORMATION 3200

PHYSICAL BLOCK INFORMATION 3300

STORAGE SYSTEM HAVING A PLURALITY OF FLASH PACKAGES

This is a continuation application of U.S. Ser. No. 12/670,241, filed Jan. 22, 2010. This application claims priority from National Stage of PCT/JP2009/003437, filed Jul. 22, 2009. The entire disclosures of both of these applications are hereby incorporated by reference.

TECHNICAL FIELD

The present invention relates to a storage system.

BACKGROUND ART

When rewriting data, the memory characteristics of the flash memory make it impossible to directly overwrite data into a physical area in which the data is being stored originally. When performing a data rewrite, it is necessary to rewrite the data after a delete process has been executed in a unit called a block, which is the flash memory delete unit. There exists an upper limit in the deletion times of each block. There is high possibility that the data can not be stored into the block whose deletion times are more than this upper limit.

For this reason, when adopting a system that fixedly allocates a data-storage address to each block of a flash memory, the rewrite frequency will normally differ for each address, thereby resulting in variations in the number of deletions per block. Consequently, in a case where the number of deletions for a specific block exceeds the limit, it becomes impossible to store allocated address data in this block. In order to solve for this problem, a technology called wear leveling is known as a technique for reducing this variation (for example, Patent Literature 1). The basic thinking behind wear leveling is to reduce the imbalance of the number of deletions of a real block by providing, as an externally presented address layer, a logical address layer that is separate from the physical address and changing the logical address allocated to the physical address as needed, for example, allocating a address with a small number of deletions to a frequently accessed logical address. Even in a case where the physical address changes, the logical address remains the same, thereby enabling data to be accessed from the outside via the same address, making it possible to maintain good usability.

Next, technology for reducing the capacity of stored data will be discussed. Technology for reducing the capacity of data stored in a storage system has been attracting attention in recent years. One typical such technology is capacity virtualization technology. Capacity virtualization is technology for presenting to the host side a virtual capacity that is larger than a storage system's physical capacity. This technology makes good use of a characteristic feature whereby the amount of data, which is actually stored in the capacity of a user-defined user volume (the storage device seen by the user) in a case where the user is actually using the storage, does not readily attain the defined capacity of this volume. That is, whereas a defined physical capacity is secured when a volume is defined in a case where capacity virtualization technology is not used. On the other hand, in a case where capacity virtualization technology is applied, capacity is first secured when data is actually stored in the storage system. In accordance with this, the ability to reduce the capacity of the stored data makes it possible to enhance usability, and, in addition, the user may simply define a value with plenty of room to spare instead of having to strictly define the volume capacity. In this technology, the physical storage area secured at a data write is called a page. In general, the size of the page is extremely diverse, but in the present invention it is supposed that the size of the page is larger than the size of the block, which is the flash memory delete unit. By contrast, in a flash memory, whereas the delete unit is generally the block as mentioned above, a read/write unit inside the block is called a page. Naturally, the size of the block in the flash memory is larger than the size of the page. However, in the present invention, the term page will refer to a page in the capacity virtualization technology. Further, to reiterate, the size of the page in the present invention shall be larger than the size of the flash memory block.

However, the above-mentioned capacity virtualization technology is not necessarily a required condition for the storage system of the present invention. On the other hand, technology for transferring a page between storage devices (typically, HDD (Hard Disk Drives)) in page units to realize enhanced performance in a storage system having capacity virtualization technology is known (Patent Literature 2). Furthermore, a technology for transferring a page between storage devices having different price-performance ratios for enhancing the price-performance ratio is also known. Prior to storing user data in a HDD, a specific pattern, for example, all 0s, is normally used to format the HDD. A technology in which the storage system detects this specific pattern written by the host at this time, and frees up an already allocated page is also known (Patent Literature 3).

CITATION LIST

Patent Literature

[PTL 1]
Japanese Patent Publication No. 3507132
[PTL 2]
Japanese Patent Application Laid-open No. 2007-66259
[PTL 3]
Japanese Patent Application Laid-open No. 2007-199922

SUMMARY OF INVENTION

Technical Problem

In a large-capacity storage system that uses the flash memory of the present invention as a storage medium, the number of flash memory chips, for example, will reach tens of thousands. For this reason, a typical configuration is one in which hundreds of flash packages equipped with hundreds of chips are connected to the storage system controller.

The problems that the present invention is to solve are, firstly, in a large-scale storage system comprising a large number of flash memory chips as storage media, to efficiently reduce the imbalance associated with the number of deletions for the flash memories in the entire storage system, and secondly, to reduce the capacity of the data stored in the flash memories. The first problem will be discussed first. Wear-leveling technology is extremely important in a storage system equipped with flash memories. However, in a case where the conventional concept of wear leveling is applied as-is in a storage system having tens of thousands of flash memories, which is the object of the present invention, the wear-leveling technology will attempt to reduce the imbalance of the number of block deletions for all of the tens of thousands of flash memory chips, giving rise to the problem of increased wear-leveling control overhead.

The second problem will be explained. In a storage system that applies capacity virtualization technology, a page is secured when a data write is performed. Therefore, making the page size smaller has a big effect on reducing capacity. However, in a case where this technology is applied, sequential addresses on volume as seen from the host are likely to be stored randomly on the HDD because each page is allocated randomly. Normally, accessing sequential areas of the HDD (a sequential access) is markedly faster than accessing random areas (a random access), and as such, host application software is constructed with this performance difference in mind. Therefore, even when capacity virtualization is implemented, the page size must be made larger to a certain extent in order to maintain performance with respect to a sequential access. Consequently, the problem is that reductions in capacity are not efficient enough (As already mentioned, it was decided to make the size of the page larger than the size of the flash memory block in the present invention).

Solution to Problem

A first characteristic feature of the present invention for solving the above-mentioned first problem is the carrying out of hierarchical wear leveling. That is, wear leveling is configured in accordance with higher-level wear leveling and lower-level wear leveling. Making wear leveling hierarchical makes it possible to efficiently reduce the imbalance of the number of block deletions of all of the tens of thousands of flash memory chips in the entire storage system. Since the first characteristic feature of the present invention is the carrying out of hierarchical wear leveling, no particular unit is stipulated for higher-level wear leveling (This is an arbitrary unit). The lower-level wear leveling is aimed at reducing the imbalance of the number of block deletions in a flash package, which is equipped with a plurality of chips (for example, hundreds of chips), and a known technology such as that of Patent Literature 1 may be used. Fundamentally, the unit for lower-level wear leveling is generally the block, which is the delete unit of the flash memory. Furthermore, the present invention is valid even when a single flash package is used as a SSD (Solid State Disk Drive). In a case where a flash package has a processor, one method of lower-level wear leveling is for this processor to reduce the imbalance of the number of block deletions of the flash memories inside this package. However, lower-level wear leveling may also be carried out by the processor of the storage system controller. The second characteristic feature of the present invention is that the higher-level wear leveling is carried out in the page unit introduced for the capacity virtualization of the storage system (This signifies that the storage system controller having a capacity virtualization function is not an indispensable condition in a case where only the first characteristic feature of the present invention is realized). In a storage system that realizes capacity virtualization, performing transfer control in page units will become the mainstream in the future, and carrying out the higher-level wear leveling of a flash memory in pages will be very advantageous in making it possible to integrate this higher-level wear leveling into the control of this page unit. Also, carrying out wear leveling at a size that is larger than the block called a page will make it possible to reduce overhead.

The higher-level wear leveling of the present invention may reduce the imbalance of the number of block deletions, or this higher-level wear leveling may exercise control such that a prediction time until the number of block deletions reaches the limit is longer than a certain fixed time period.

A third characteristic feature of the present invention for solving the second problem is to realize hierarchical capacity virtualization. Higher-level capacity virtualization is realized by the storage system controller as in the past, and the virtual capacity is provided to the host. Therefore, the third characteristic feature of the present invention for solving the second problem is lower-level capacity virtualization, which virtualizes the capacity of the flash package, defines as virtual capacity a capacity that is larger than the actual flash memory capacity possessed by the flash package, and when data is to be written at the lower level, checks whether or not a block has been allocated, and when a block has not been allocated, allocates a block for the first time. In accordance with this, it is possible to actually delay the allocation trigger, and to make the allocation capacity the size of the block, which is smaller than the page. Also, since there is practically very little difference in performance between a random access and a sequential access in flash memory properties, making the allocation size smaller does not cause significant performance problems.

A fourth characteristic feature for solving the second problem of the present invention includes using the lower-level capacity virtualization function to free up capacity in block units and to make an effective reduction in capacity a possibility even in a case where all 0s or some other such formatting information has been recognized. However, the characteristics of the flash memory make it necessary to carry out a delete one time in order to allocate a freed-up block to another area. Furthermore, in a case where all 0s or some other such formatting pattern has been written in accordance with a normal write command, it is also possible to recognize the formatting pattern, free up the corresponding block, and reduce the capacity of the data stored in the storage system. In a case where the flash package has a processor, one method of lower-level capacity virtualization is for this processor to virtualize the capacity inside this package. However, the processor of the storage system controller may also carry out the lower-level capacity virtualization. Further, a capacity virtualization function, which regards the storage medium as a flash memory, has a virtual capacity that is larger than the real capacity, and regards a block, which is the delete unit, as the allocation unit, may be provided to the host without a conventional higher-level capacity virtualization function.

Advantageous Effects of Invention

According to the present invention, it is possible to realize efficient wear leveling in a large-capacity storage system connected to a large number of flash packages each mounted with a large number of flash memories. In addition, it is also possible to reduce the capacity of the data that is stored without incurring hardly any degradation in performance compared to the prior art.

DESCRIPTION OF EMBODIMENTS

Figure 1:
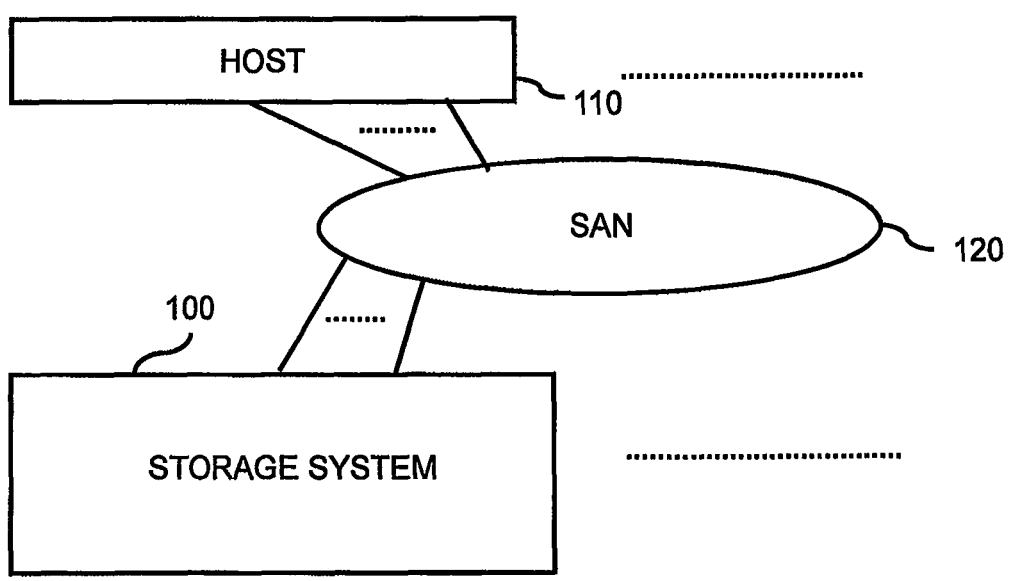
FIG. 1 is a diagram showing an information system having a storage system 100 related to a first embodiment of the present invention.

This embodiment will be explained in detail below by referring to the drawings.

FIG. 1 shows an information system having a storage system related to the first embodiment of the present invention.

The information system comprises a storage system 100, a host 110, and a SAN (Storage Area Network) 120 for connecting them. The host 110 carries out the reading and writing of data from and to the storage system 100 by way of the SAN 120. Although not shown in FIG. 1, the storage system 100 may be connected to another storage system 100 by way of the SAN, and may execute a remote copy function corresponding to disaster recovery between the storage systems 100.

The host 110 is a system (for example, a computer) for running a user application. The host 110 accesses a storage system 100-provided logical volume via the SAN 120. The logical volume may be a logical volume (a volume configured from a plurality of virtual pages) in accordance with the above-mentioned higher-level capacity virtualization, and may be a normal logical volume (not having above-mentioned higher-level capacity virtualization). However, the following explanation will be premised on a logical volume that conforms to capacity virtualization. Furthermore, a protocol (for example, the Fibre Channel protocol) capable of sending an SCSI (Small Computer System Interface) command is used in the SAN 120.

In a storage system that configures a large number of flash memories as a storage medium, this embodiment realizes a technology for reducing the imbalance of the number of deletions of the flash memory as a first technology, and a technology for reducing the capacity of the data stored in the flash memory as a second technology. The first technology is hierarchical wear-leveling technology, and the second technology is hierarchical capacity virtualization technology. In this embodiment, both hierarchical wear-leveling technology and hierarchical capacity virtualization technology are realized, but the present invention will be valid even in a case where these technologies are realized alone as simply hierarchical wear-leveling technology, or simply hierarchical capacity virtualization technology. Further, in the embodiment of this example, the control unit in a higher-level wear-leveling technology and a higher-level capacity virtualization technology is a unit called the page in both technologies. The page in the embodiment of this example is the page disclosed in the capacity virtualization technology described in the prior Patent Literature 2. Furthermore, in the below explanation of the present invention, the higher-level control unit in hierarchical wear leveling is the page, but the present invention will be valid even in a case where this control unit is not the page. For example, the control unit for higher-level wear leveling may be based on the block, which is the delete unit of the flash memory, the same as the control unit for the lower-level wear leveling. In the embodiment of this example, the size of the page is larger than the block, which is the delete unit of the flash memory. Since a read/write unit in a flash memory is normally called a page, the page is smaller than the block. However, as already mentioned, in the embodiment of this example, the page signifies the page referred to in the capacity virtualization technology, and the size thereof is larger than that of the block. Further, the control unit in the lower-level wear-leveling technology and the lower-level capacity virtualization technology is basically one block, which is the delete unit of the flash memory, but may also be an integral multiplication unit of a block. However, in the embodiment of this example, the explanation will be given based on one block being the control unit. The present invention will also be valid even in a case where a lower-level capacity virtualization function, which uses a flash memory as the storage medium, has a virtual capacity that is larger than the real capacity, and uses a block, which is the delete unit, as the allocation unit, is provided to the host 110 without a conventional higher-level capacity virtualization function. In this embodiment, technology for extending the life of the flash memory beyond a certain time period is realized in addition to technology for reducing the imbalance of the number of deletions of the flash memory. For this reason, taking into account the fact that a broader technology has been added, the wear-leveling function may also be called the long life control.

Figure 2:
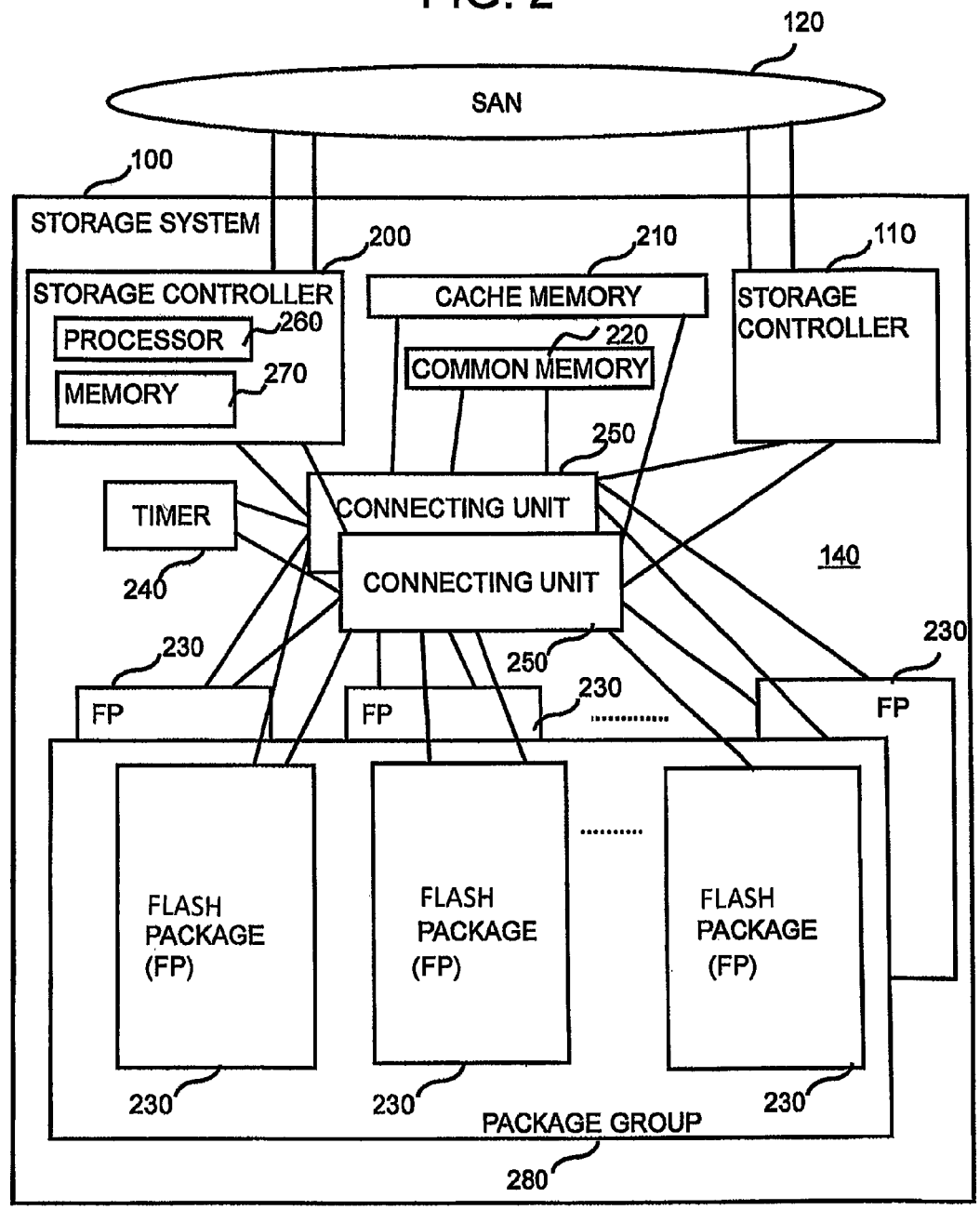
FIG. 2 is a diagram showing the configuration of the storage system 100.

FIG. 2 shows the configuration of the storage system 100.

The storage system 100 comprises a plurality of flash packages 230, one or more storage controllers 200, a cache memory 210, a common memory 220, a timer 240, and one or more connecting units 250 for connecting these components. Furthermore, the present invention is valid even in a case where a single flash package 230 is a single SSD (Solid State Drive). The controller 140 may also be provided with a hard disk drive (HDD) or other such disk device in addition to the flash packages 230. Furthermore, in the present invention, the higher-level long life control (wear-leveling function) and the higher-level capacity virtualization function are executed by the storage controller 200. By contrast, the lower-level long life control (wear-leveling function) and the lower-level capacity virtualization function may be executed by the storage controller 200 or the flash package 230. However, in this embodiment, the explanation will focus on a flash package 230-implemented mode.

The timer 240 is capable of being referenced from all the storage controllers 200. The information denoted by the timer 240 need not be a time, and, for example, may be a counter value showing a value equivalent to an elapsed time.

The storage capacities (total storage capacity of the real block) of all the flash packages 230 need not be the same (that is, flash packages 230 having different storage capacities may co-exist), but in this embodiment, it is supposed that the storage capacities (total storage capacity of the real block) of all the flash packages 230 are the same.

The storage controller 200 receives either a write request and the data appended thereto or a read request from the host 110 by way of the SAN 120. The storage controller 200 comprises a memory 270 and a processor 260. The memory 270 stores a program and information. The processor 260 executes a computer program stored in the memory 270.

The connecting unit 250 is a device (for example, a crossbar switch) for connecting the respective components of the storage system 100. In this embodiment, each storage controller 200 and each flash package 230 is connected to a plurality of connecting units 250. However, it is not always necessary for these components to be connected to a plurality of connecting units 250, and, for example, one flash package 230 and/or one storage controller 200 may be connected to only one connecting unit 250.

The cache memory 210 and the common memory 220 are configured from volatile memory (for example, DRAM (Dynamic Random Access Memory), but are made non-volatile in accordance with a battery or the like. However, the present invention is valid even in a case where the cache memory 210 has not been made non-volatile, and the present invention is valid even in a case where the common memory 220 has not been made non-volatile. Also, the cache memory 210 may be duplexed, and the common memory 220 may be duplexed. Of the data stored in the flash package 230, for example, the data that is frequently accessed from the storage controller 200 is stored in the cache memory 210. The storage controller 200 may end a write process at the point in time when the data appended to the write request received from the host 110 is written to the cache memory 210, or may end the write process at the point in time when this data is stored in the flash package 230 from the cache memory 210. The common memory 220 stores control information for the cache memory 210 and management information related to the storage system 100.

The flash package 230 is recognized as a single storage device from the storage controller 200. For enhanced reliability, the storage controller 200 comprises a RAID (Redundant Array of Independent (or Inexpensive) Disks) function that makes it possible to recover the data of the flash package 230 even in a case where an error occurs in a prescribed number (for example, one or two) of the flash packages 230 (Furthermore, the "D" in the term "RAID" stands for "Disk", but when a failure occurs in a certain storage device, the function for restoring the data of the failed device based on redundant data of a different storage device is also applicable to a storage device other than a Disk). In the case of the RAID function, a single RAID configuration is constructed from a plurality of flash packages 230. A group that accords with this RAID configuration will be called a "package group" below. However, when the storage system 100 need not have a RAID configuration, this invention is valid.

Figure 3:
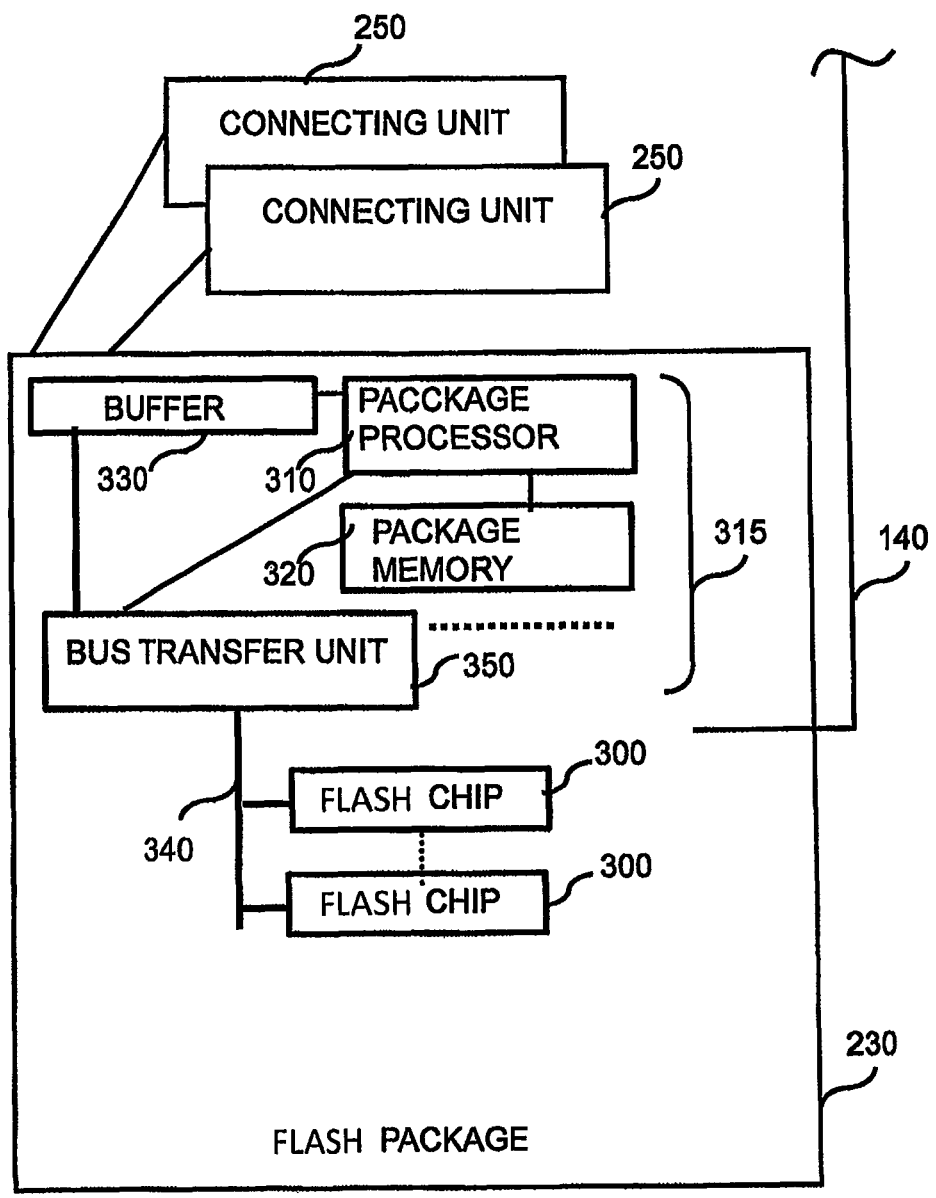
FIG. 3 is a diagram showing the configuration of a flash package 203.

FIG. 3 shows the configuration of the flash package 230.

The flash package 230 comprises a plurality of flash chips 300 and a package controller 315.

The package controller 315 comprises a package processor 310, a package memory 320, a buffer 330, a package bus 340, and a package bus transfer unit 350. The package processor 310 processes a write request or a read request from the storage controller 200.

The buffer 330 stores data that is written/read between the storage controller 200 and the flash chip 300. In this embodiment, the buffer 330 is a volatile memory. The processing of a write request from the storage controller 200 ends at the point in time when the data that accords with this write request is written to the flash chip 300. However, the present invention is valid even in a case where the buffer 330 is made non-volatile, and the data is written to the flash chip 300 after reporting the completion of the write request to the storage controller 200. A computer program that is executed by the package processor 310 and flash package 230 management information are stored in the package memory 320. However, the present invention is valid even in a case where the package memory 320 has been made non-volatile.

The package bus 340 is for transferring data between the buffer 330 and the flash chip 300, and one or more such buses 340 exist. One or more flash chips 300 are connected to a single package bus 340.

The package transfer unit 350 exists corresponding to the package bus 340, and executes a data transfer between the buffer 330 and the flash chip 300 in accordance with a request from the package processor 310.

Figure 4:
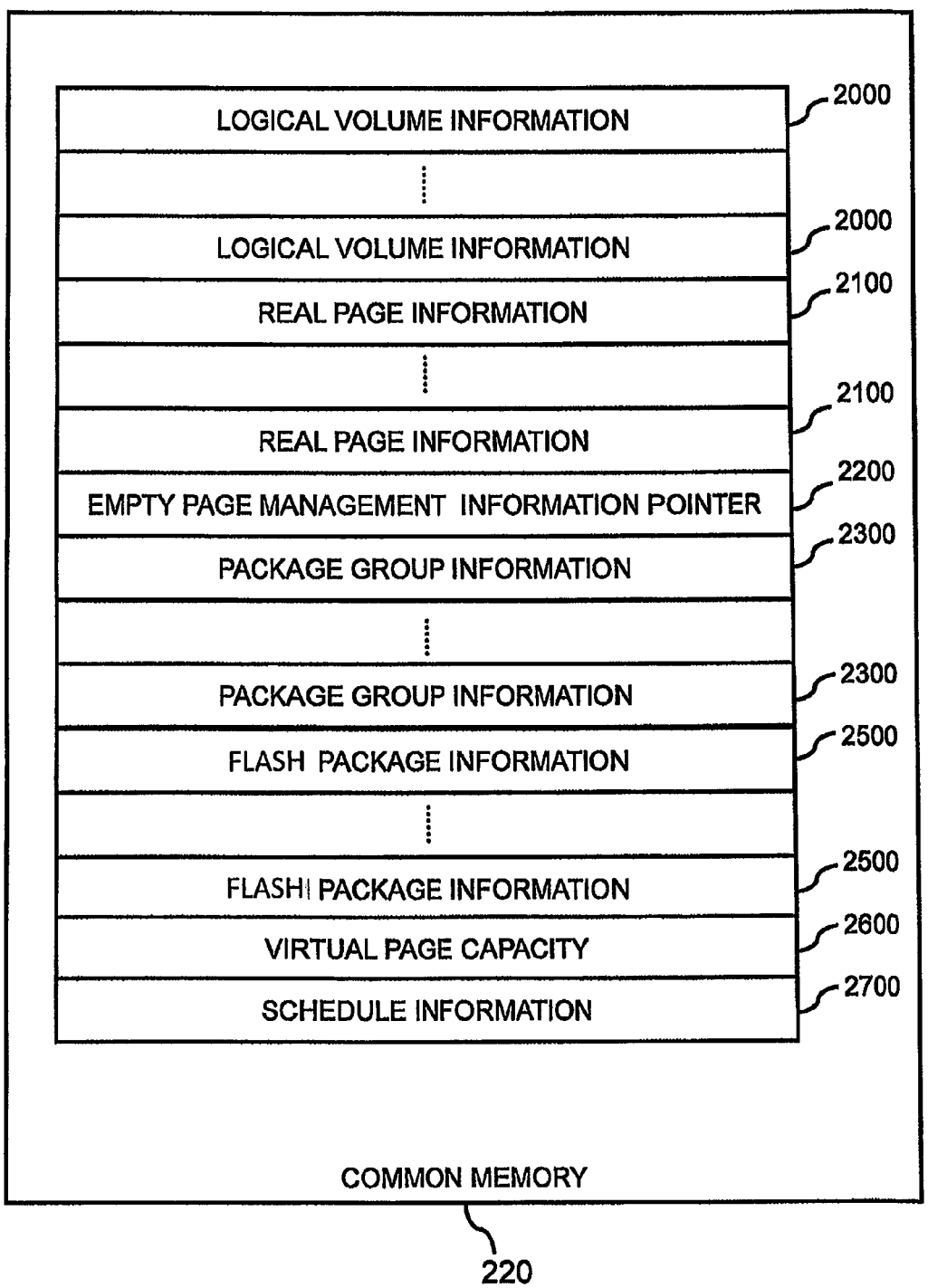
FIG. 4 is a diagram showing information that is stored in a common memory 220.

FIG. 4 shows information that is stored in the common memory 220.

The common memory 220, for example, stores logical volume information 2000, schedule information 2700, real page information 2100, an empty page information management pointer 2200, package group information 2300, flash package information 2500, and a virtual page capacity 2600. This information is needed for the higher-level long life control and the higher-level capacity virtualization function.

The virtual page capacity 2600 is information denoting the capacity of a virtual page. Furthermore, there are cases where the capacity (size) of the virtual page is not the same as the capacity (size) of the real page. For example, the relationship between the virtual page capacity and the real page capacity depends on the RAID configuration. Specifically, for example, in the case of RAID 1 in which data is written in duplicate, the real page capacity becomes twice that of the virtual page capacity. Further, for example, in a case where redundancy data of the capacity of a single storage device is stored in the capacity of N storage devices as in RAID 5, the capacity of the real page is (N+1)/N the capacity of the virtual page. Further, for example, in a case where there is no redundancy as in RAID 0, the capacity of the real page is the same as the capacity of the virtual page. Furthermore, in this embodiment, the virtual page capacity 2600 is the same for all virtual pages in the storage system 100, but the present invention is valid even in a case where the virtual page capacities 2600 in the storage system 100 are not same.

In this embodiment, the storage system 100 has the above-mentioned higher-level capacity virtualization function, but the storage system 100 does not have to have this function. The storage area allocation unit for the higher-level capacity virtualization function is a "page", and the storage area allocation unit for the lower-level capacity virtualization function is a "block".

Figure 8:
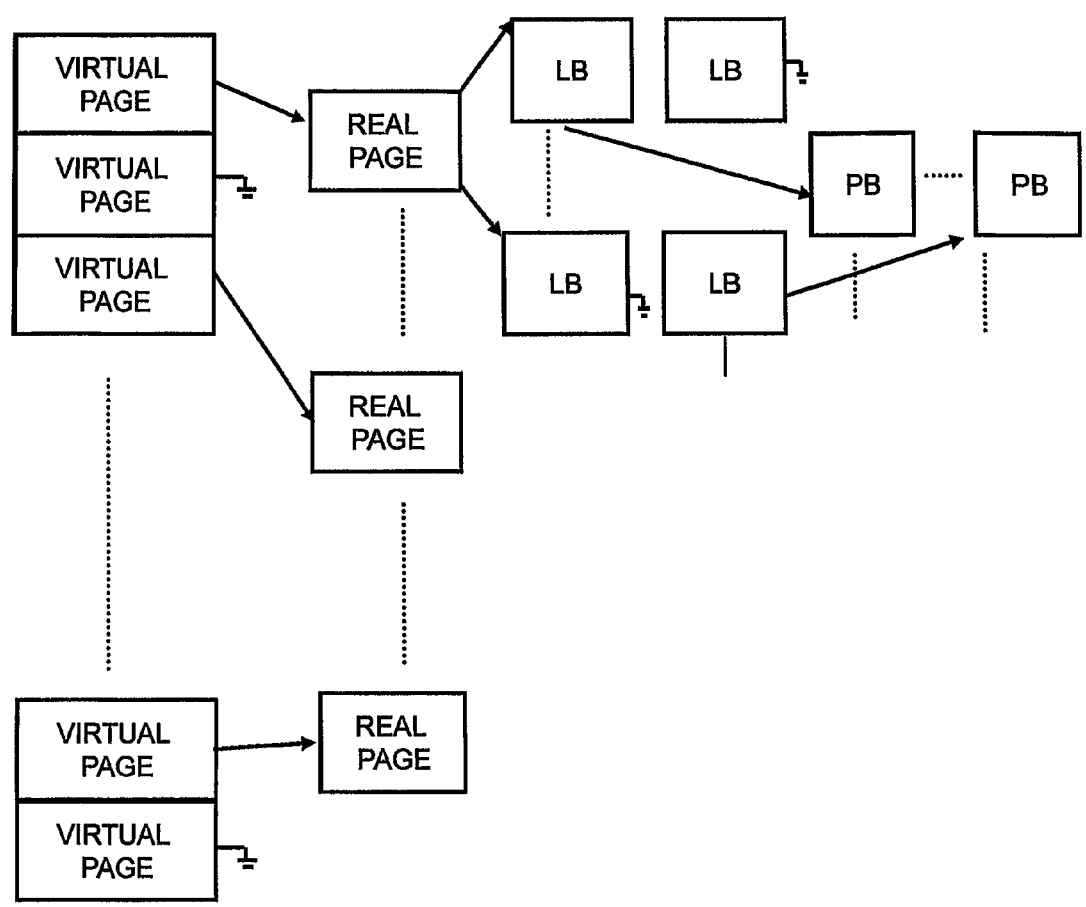
FIG. 8 is a diagram showing the corresponding relationships among a plurality of types of storage areas in the first embodiment of the present invention.

FIG. 8 shows the corresponding relationships among a plurality of types of storage areas.

In this embodiment, each flash package 230 is equipped with a capacity virtualization function, and provides the storage controller 200 with capacity that appears to be greater than the actual physical capacity. In this embodiment, the capacity virtualization unit of the flash package 230 is the block, which is the delete unit of the flash memory. Below, the block seen from the storage controller 200 will be called a "virtual block" and the block actually allocated by the flash package 230 will be called a "real block". Therefore, in this embodiment, the real page is configured from virtual blocks. Further, in this embodiment, the capacity space configured by the virtual block is larger than the capacity space configured by the real block. FIG. 8 shows the relationships between the virtual page, the real page, the virtual block and the real block. As already mentioned, the real page comprises redundant data not found in the virtual page. By contrast, the data included in the virtual block and the real block are the same. In this embodiment, the flash package 230 also appears to the storage controller 200 to have more virtual blocks than the number of real blocks. However, in this embodiment, the storage controller 200 is aware of how many real blocks the flash package 230 actually possesses, and reallocates the real pages. A characteristic feature in this embodiment is the fact that the flash package 230 allocates a real block upon receiving a write request for a virtual block to which a real block has yet to be allocated.

The flow of processing of an access from the storage controller 200 to the real block will be explained below. Furthermore, the storage controller 200 manages the corresponding relationship (page corresponding relationship) of which real page has been allocated to which virtual page. However, the lower-level long life control (wear-leveling function) and the lower-level capacity virtualization function will be explained below using the flash package 230-implemented mode.

The storage controller 200, upon receiving a write request from the host 110, determines based on the page corresponding relationship whether or not a real page has been allocated to the virtual page (the write-destination virtual page) specified from this write request. In a case where the result of this determination is negative, the storage controller 200 allocates an unallocated real page to the write-destination virtual page, and writes the data appended to the write request to the allocated real page.

The storage controller 200, upon writing the data to the real page, sends a write request specifying the address based on this real page to the package controller 315 that manages this address. The package controller 315 receiving this write request, based on the block corresponding relationship, determines whether or not a real block has been allocated to the virtual block (the write-destination virtual block) having the address specified in this write request. In a case where the result of this determination is negative, the package controller 315 allocates an unallocated real block (an empty real block) to the write-destination virtual block, and writes the data targeted by this write request to the allocated real block.

The storage controller 200, upon receiving a read request from the host 110, specifies based on the page corresponding relationship the real page allocated to the virtual page (the read-source virtual page) specified from this read request. The storage controller 200 reads out the data from the specified real page and sends the read-out data to the host 110.

The storage controller 200, upon reading out the data from the real page, sends a read request specifying the address based on this real page to the package controller 315 that manages this address. The package controller 315 receiving this read request specifies the real block allocated to the virtual block having the address specified in this read request based on the block corresponding relationship. The package controller 315 reads out the data from the specified real block and sends this data to the storage controller 200.

Furthermore, for example, in a NAND flash memory, ordinarily the delete unit is called a "block" and the write unit is called a "page". Specifically, a single physical page is configured from a plurality of physical sectors, and a single real block is configured from a plurality of physical pages. However, there should be no confusion whatsoever that "page" as used in this embodiment is clearly a unit of area allocation performed by the higher-level capacity virtualization function.

The various information shown in FIG. 4 will be explained below.

Figure 5:
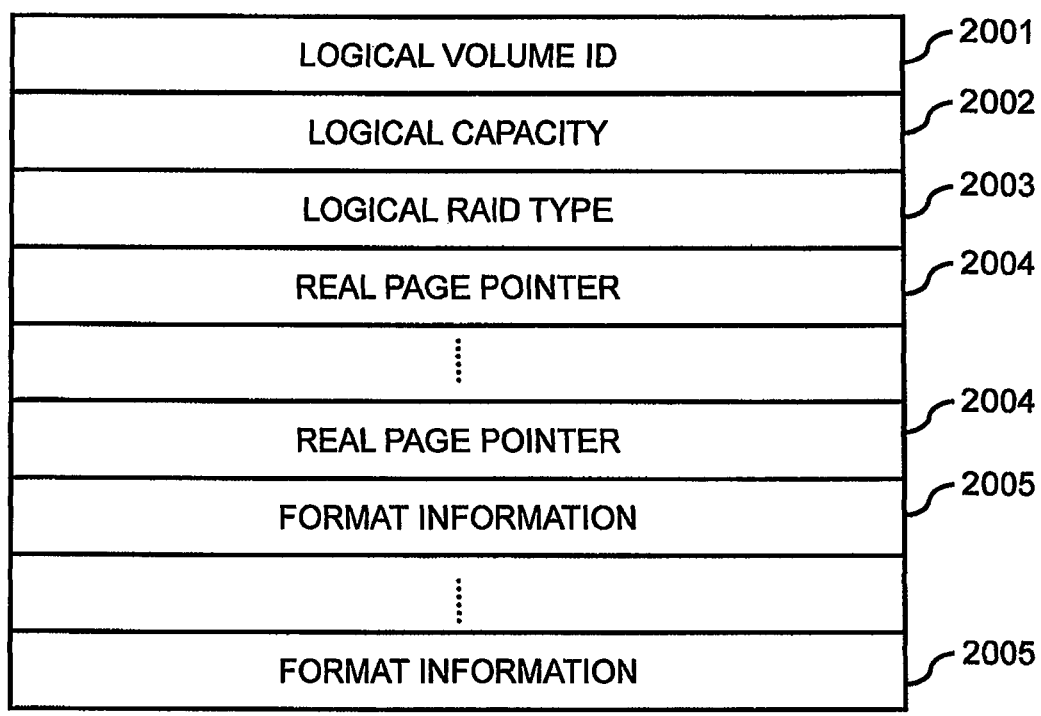
FIG. 5 is a diagram showing logical volume information 2000.

FIG. 5 shows the logical volume information 2000.

The logical volume is a logical storage device that is accessed from the host 110. An access request issued from the host 110 comprises the ID of the logical volume (for example, the LUN (Logical Unit Number)), an address from inside the logical volume (for example, the LBA (Logical Block Address)), and the length of either the write or read data. The access-destination logical volume is specified from the logical volume ID, and one or more virtual pages of the access destination in this logical volume are specified from the address and data length.

The logical volume information 2000 is information that exists for each logical volume. The information 2000 will be explained below by giving a single logical volume (called the "target volume" in the explanation of FIG. 5) as an example.

The information 2000 comprises a logical volume ID 2001, a logical capacity 2002, a logical RAID type 2003, a real page pointer 2004 and format information 2005.

The logical volume ID 2001 is the ID of the target volume.

The logical capacity 2002 denotes the capacity of the target volume as viewed from the host 110.

The logical RAID type 2003 is information denoting the type (the RAID type (for example, RAID 0, RAID 1)) of RAID configuration corresponding to the target volume. Furthermore, in a case where the RAID type is the type (for example, RAID 5 or RAID 6) in which a prescribed number (M) of redundant data generated from N data in N storage devices is stored in M storage devices, the specific number for N is included in the information 2003. However, it is not possible to specify an arbitrary RAID type; it must be the RAID type of at least one of the package groups 280.

The real page pointer 2004 is the pointer to the real page information 2100 allocated to the virtual page of the target volume. The number of real page pointers 2004 is equivalent to the number of virtual pages of the target volume (for example, the number obtained by dividing the logical volume capacity 2002 by the virtual page capacity 2600, and +1 in a case where there is a surplus). The real page corresponding to the initial real page pointer 2004 is the real page allocated to the virtual page at the head of the target volume. Thereafter, the pointer corresponding to the real page allocated to the subsequent virtual page is stored in the subsequent real page pointer 2004. In accordance with the higher-level capacity virtualization function, a real-page allocation is not triggered by defining the target volume, but rather is triggered by the receipt of a write request specifying a virtual page (triggered by the occurrence of a write to the virtual page). Therefore, a real page pointer 2004 corresponding to a virtual page for which a write has yet to be generated is information (for example, a NULL value) signifying unallocated.

The format information 2005 is also information that exists for each virtual page of the target volume. The host 110 often initializes a storage device (for example, the logical volume) using specified information (for example, the above-mentioned pattern data) prior to storing application program data. The pattern data may be appended to an ordinary write request, or it may be appended to an explicit request (called the write same command below). Including the pattern data (repetitive information) in the format information 2005 makes it possible to recognize that this pattern data is stored in the virtual page corresponding to this information 2005. For this reason, it is possible to release the allocation of the real page to the virtual page in which the pattern data is stored (to release this real page). In this embodiment, in a case where the storage controller 200 receives the write same command, the storage controller 200 notifies the lower-level capacity virtualization function (for example, the package controller 315) of the virtual block corresponding to the real page allocated to the virtual page specified by the write same command (specifically, a release request specifying this virtual block is sent). The allocation of the real block to the virtual block specified in this release request is released (freed). This cuts back on the storage capacity that is consumed. Furthermore, in a case where the pattern data (for example, formatting data such as all 0's) is written in response to an ordinary write request, the storage controller 200 recognizes the pattern data, and may cause the lower-level capacity virtualization function to release the real block with respect to the write-destination virtual block of the pattern data. Further, in a case where the format information 2005 has been set, there is no need to allocate a real page to the virtual page corresponding to this format information 2005, and as a result the real page pointer 2004 corresponding to this virtual page constitutes information (for example, a NULL value) signifying non-allocation. In a case where data other than the pattern data stored in the format information 2005 is the write target, a real page is allocated to the write-destination virtual page and the format information 2005 constitutes invalid information (for example, a NULL value).

Figure 6:
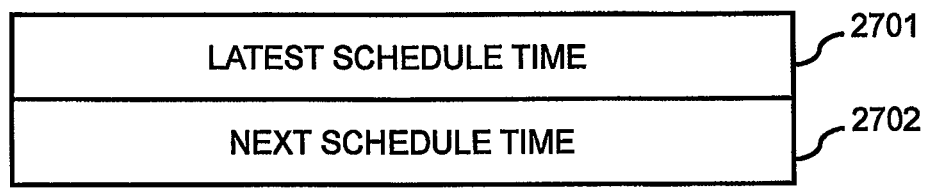
FIG. 6 is a diagram showing schedule information 2700.

FIG. 6 shows the schedule information 2700.

In this embodiment, the higher-level long life control is started in accordance with a prescribed schedule. The information 2700 comprises the latest schedule time 2701 and the next schedule time 2702.

The latest schedule time 2701 is the time (past) at which the higher-level long life control was recently executed.

The next schedule time 2702 is the scheduled time (future) when the higher-level long life control will be executed next.

Furthermore, the higher-level long life control may be executed at an arbitrary point in time either instead of or in addition to the predetermined schedule. For example, the higher-level long life control may be executed when at least one of the following occurs, i.e., when the storage controller 200 is requested by the user to execute the higher-level long life control, and when an error occurs in a write to the real page (a write to the real block).

Figure 7:
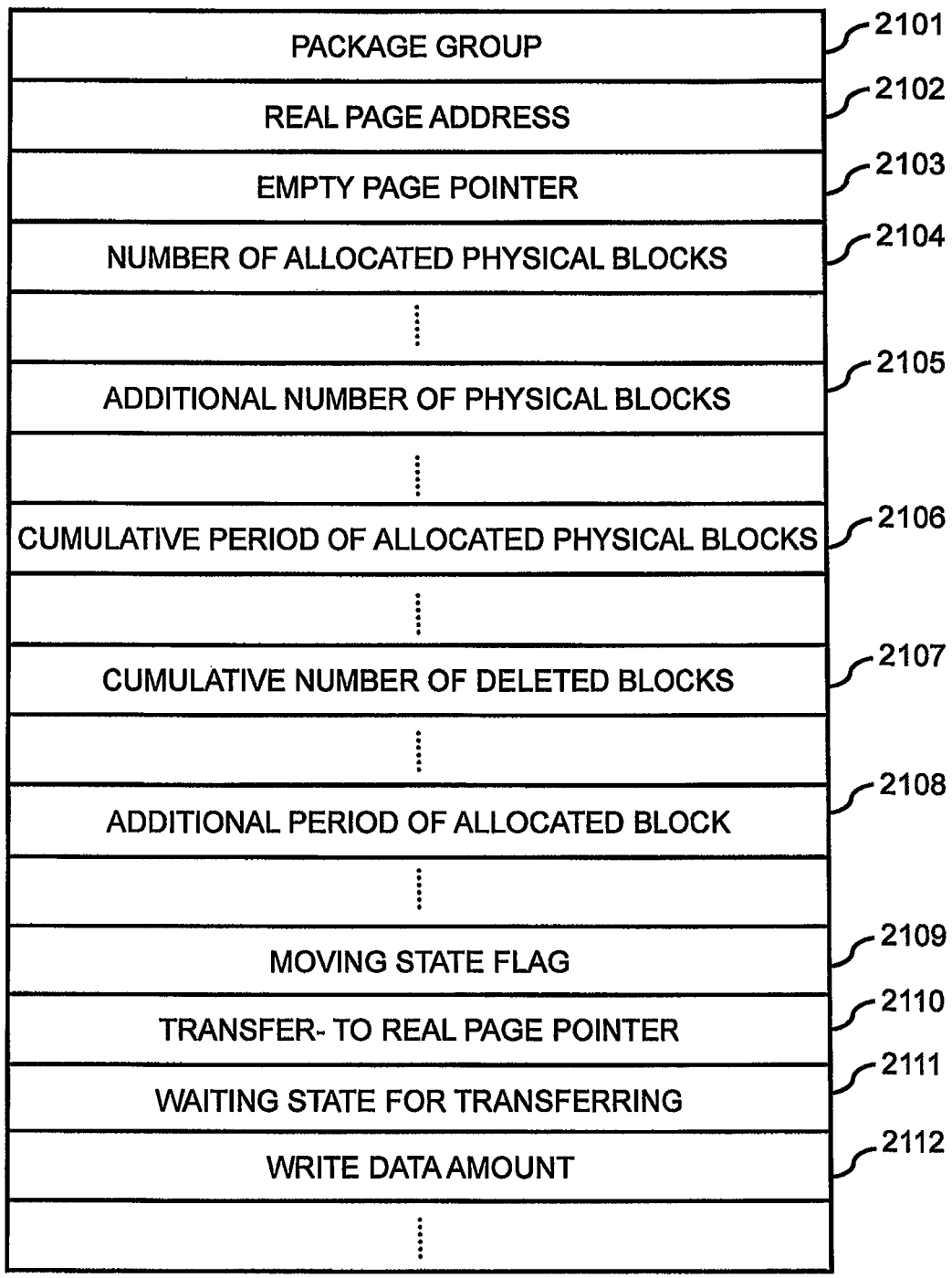
FIG. 7 is a diagram showing real page information 2100.

FIG. 7 shows the real page information 2100.

The information 2100 is real page management information, and exists for each real page. The information 2100 will be explained in detail below by using a single real page (called the "target real page" in the explanation of FIG. 7) as an example.

The information 2100 comprises a package group 2101, a real page address 2102, an empty page pointer 2103, a number of allocated real blocks 2104, an additional number of real blocks 2105, a cumulative period of allocated real blocks 2106, a cumulative number of deleted blocks 2107, an additional period of allocated real blocks 2108, moving state flag 2109, a transfer-to-real-page pointer 2110, a waiting state for transferring 2111, and a write data amount 2112.

The package group 2101 is information showing which package group 280-based real page is the target real page, and for example, is the identifier (package group ID) of the package group 280 that constitutes the basis of the target real page.

The real page address 2102 is information showing which relative address the target real page is allocated to within the package group 280 constituting the basis of the target real page.

The empty page pointer 2103 is a valid value in a case where the target real page has not been allocated to the virtual page. In accordance with this, this valid value specifies the empty page information 2100 corresponding to another physical page that has not been allocated to the virtual page. In a case where the virtual page has been allocated to the target real page, the empty page pointer 2103 becomes a NULL value.

The number of allocated real blocks 2104 and the additional number of real blocks 2105 exists only for the number of flash packages 230 of the package group 280 constituting the basis of the target real page.

In this embodiment, the package controllers 315 of the respective flash packages 230 have the lower-level capacity virtualization function. For this reason, the storage controller 200 is provided with a virtual capacity that appears to be larger than the actual physical capacity. The capacity virtualization unit for the flash package 230 is the "block" as was explained above. As explained using FIG. 8, a plurality of virtual blocks is allocated to a real page, and a real block is allocated to each virtual block. Therefore, the real page is referred to as being configured from a plurality of virtual blocks. Further, in this embodiment, the capacity space consisting of all the virtual blocks included in a flash package 203 is larger than the capacity space consisting of all the real blocks included in a flash package 203.

As already explained, in this embodiment, redundancy data that is not included in the data for the virtual page is stored in the real page. By contrast, the data for the virtual block is the same as the data stored in the real block. In this embodiment, the flash package 230 makes it appear to the storage controller 200 that it has more virtual blocks than the number of real blocks. However, in this embodiment, the storage controller 200 is aware of how many real blocks the flash package 230 actually has, and reallocates the real pages.

In the case of the mode in which the flash package 230 implements the lower-level long life control (the wear-leveling function) and the lower-level capacity virtualization function, when data is to be written to the target real page, the storage controller 200 sends a write request specifying an address inside the virtual block allocated to the target real page to the flash package 230 that manages this virtual block. In a case where a real block has yet to be allocated to the virtual block specified in this write request, the flash package 230 allocates a real block to this virtual block. In a case where a real block has been newly allocated, the package controller 315 notifies the storage controller 200 that the new real block has been allocated. Consequently, the storage controller 200 detects the fact that the real block has been allocated to the target real page, and updates either the number of allocated real blocks 2104 or the number of additional real blocks 2105.

The number of allocated real blocks 2104 is the number of real blocks, from among the target real page-allocated real blocks of the flash package 230 corresponding to this information 2104, which were allocated to the target real page prior to the latest schedule time 2701. Furthermore, "prior to the latest schedule time 2701" may or may not include the latest schedule time 2701.

The additional number of real blocks 2105 is the number of real blocks, from among the target real page-allocated real blocks of the flash package 230 corresponding to this information 2105, which were allocated to the target real page subsequent to the latest schedule time 2701. Furthermore, "subsequent to the latest schedule time 2701" may or may not include the latest schedule time 2701. For example, in a case where "prior to the latest schedule time 2701" includes the latest schedule time 2701, "subsequent to the latest schedule time 2701" does not include the latest schedule time 2701, and conversely, in a case where "prior to the latest schedule time 2701" does not include the latest schedule time 2701, "subsequent to the latest schedule time 2701" does include the latest schedule time 2701.

The cumulative period of allocated real blocks 2106, the cumulative number of deleted blocks 2107, the additional period of allocated blocks 2108, and the cumulative amount of write data 2112 also respectively exist only for the number of flash packages 230 of the package group 280 constituting the basis of the target real page. However, this information is not attribute information of the virtual block comprising the target real page, but rather is attribute information related to data in the allocation-destination virtual page of the target real page. Therefore, in a case where another real page is allocated to this virtual page instead of to the target real page, and the data inside the target real page is transferred to this other physical page, the cumulative period of allocated real blocks 2106, the cumulative number of deleted blocks 2107, the additional period of allocated blocks 2108, and the cumulative amount of write data 2112 are also passed along as the management information of this other real page.

The cumulative period of allocated real blocks 2106 is the total of the elapsed time for all the virtual blocks allocated to the target real page. As used here, "elapsed time" is the period for the virtual block from the trigger by which the real block was allocated to this virtual block allocated to the target real page until the latest schedule time 2701. Furthermore, it is also possible for this trigger to occur for another real page in the past without occurring for the target real page.

The cumulative number of deleted blocks 2107 is the total of the number of deletions for all the virtual blocks allocated to the target real page. As used here, "the number of deletions" is the number of deletions of this real block from the trigger by which the real block was allocated to the virtual block allocated to the target real page.

The write data amount 2112 is information included in the real page information 2100 instead of (or in addition to) the cumulative number of deleted blocks 2107. The write data amount 2112 exists only for the number of flash packages 230 of the package group 280 constituting the basis of the target real page, and is attribute information related to the data for the virtual page that is the allocation destination of the target real page. The write data amount 2112 is the total of the write data for all the virtual blocks allocated to the target real page. As used here, the "write data amount" is the amount (size) of the write-targeted data of the real block to which the virtual block is allocated from the trigger by which the real block was allocated to the virtual block allocated to the target real page. Based on the write data amount 2112, it is possible to compute a value corresponding to the cumulative number of deleted blocks 2107. This will be explained in detail further below.

The additional period of allocated blocks 2108 is the length of time during which the real block allocated to the virtual block has been allocated subsequent to the latest schedule time 2701. When one real block is newly allocated, a length of time (the difference time) corresponding to the difference between the next schedule time 2702 and the time at which allocation was performed is added to the additional period of allocated blocks 2108. The reason for adding this difference time will be explained below.

The moving state flag 2109, the transfer-to-real-page pointer 2110 and the waiting state for transferring 2111 are information used when data inside the target real page is transferred to another real page. The moving state flag 2109 is ON when the data inside the target real page is being transferred to the other real page. The transfer-to-real-page pointer 2110 is information denoting the real page address of the transfer destination of the data inside the target real page. The waiting state for transferring 2111 is a flag that is ON when the decision to transfer the data inside the target real page has been made.

Figure 9:
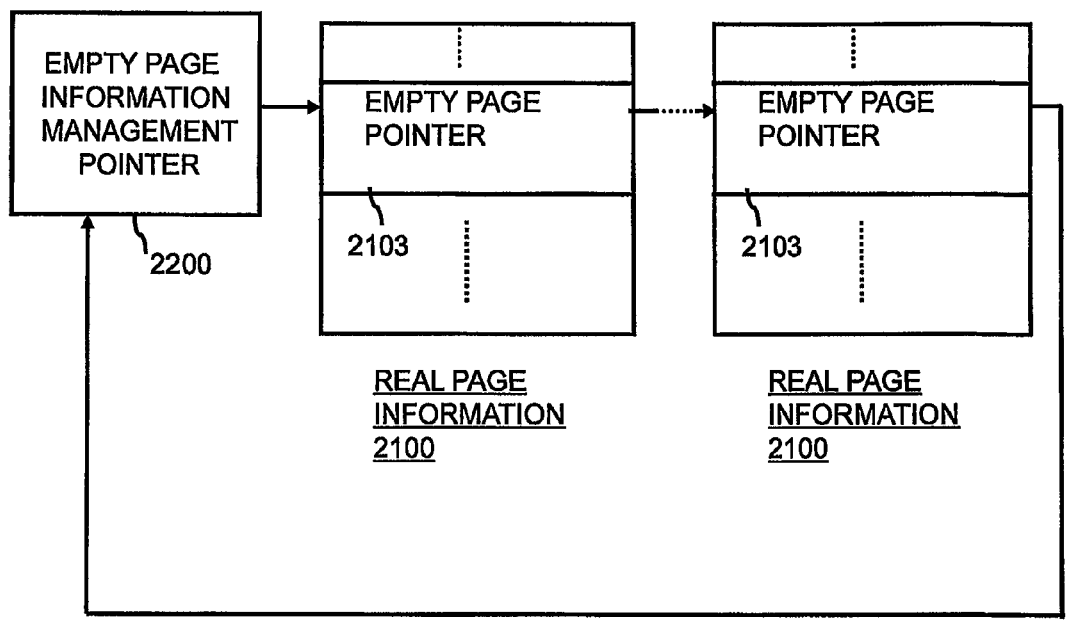
FIG. 9 is a diagram denoting a group of empty pages managed by an empty page information management pointer 2200.

FIG. 9 reveals a group of empty pages managed by the empty page information management pointer 2200.

The empty page information management pointer 2200 is information provided for each package group 280.

The "empty page" is a real page (an unallocated real page) that has not been allocated to a virtual page. The real page information 2100 corresponding to the empty page is called the "empty page information". The empty page information management pointer 2200 specifies the address at the head of the empty page information. Subsequently, the empty page pointer 2103 within the first real page information 2100 specifies the next empty page information. In FIG. 9, the empty page pointer 2103 of the final empty page information shows the empty page information management pointer 2200, but this may be a NULL value. The storage controller 200, upon receiving from the host 110 a write request specifying the virtual page to which the real page has not been allocated, searches based on the empty page information management pointer 2200 for an empty page within any package group 280 (for example the package group 280 having the largest number of empty pages) having the same RAID type as the logical RAID type 2003, and allocates the detected empty page to the virtual page.

Figure 10:
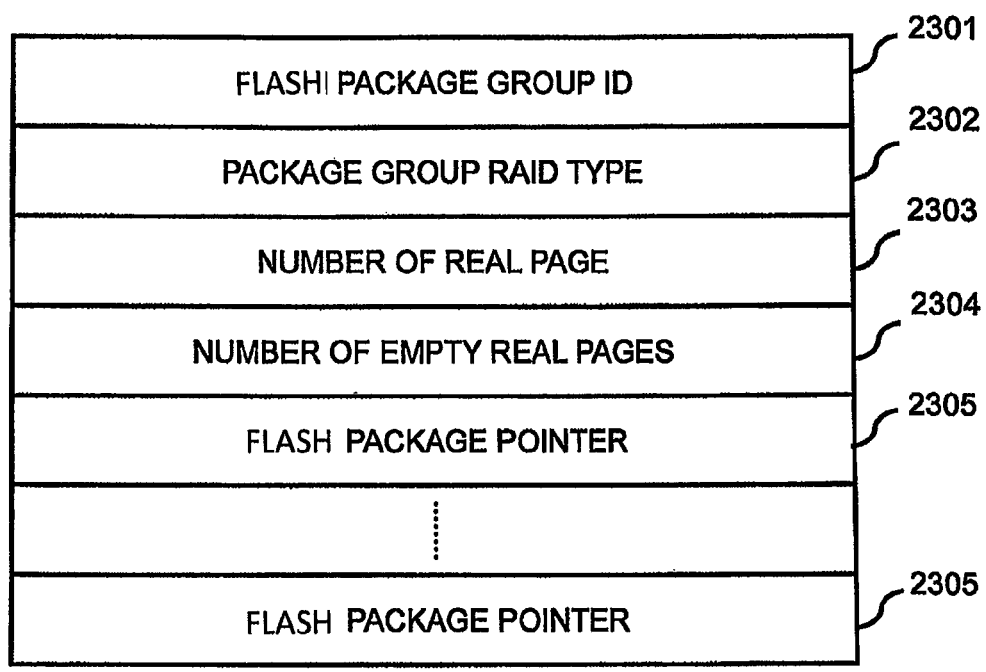
FIG. 10 is a diagram showing package group information 2300.

FIG. 10 shows the package group information 2300.

The package group information 2300 exists for each package group 280. The package group information 2300 will be explained below by giving a single package group 280 (called the "target package group 280" in the explanation of FIG. 10) as an example.

The package group information 2300 comprises a flash package group ID 2301, a package group RAID type 2302, a number of real pages 2303, a number of empty real pages 2304, and a flash package pointer 2305.

The flash package group ID 2301 is the identifier of the target package group 280.

The package group RAID type 2302 is the RAID type of the target package group 280. The RAID type in this embodiment is as described in the explanation of the logical RAID type 2003.

The number of real pages 2303 denotes the number of real pages of the target package group 280, and the number of empty real pages 2304 denotes the number of empty real pages of the target package group 280.

The flash package pointer 2305 is the pointer to the flash package information 2500 of the flash package 230 belonging to the target package group 280. The number of flash package pointers 2305 is the same as the number of flash packages 230 of the target package group 280, but this value is determined in accordance with the package group RAID type 2302.

Figure 11:
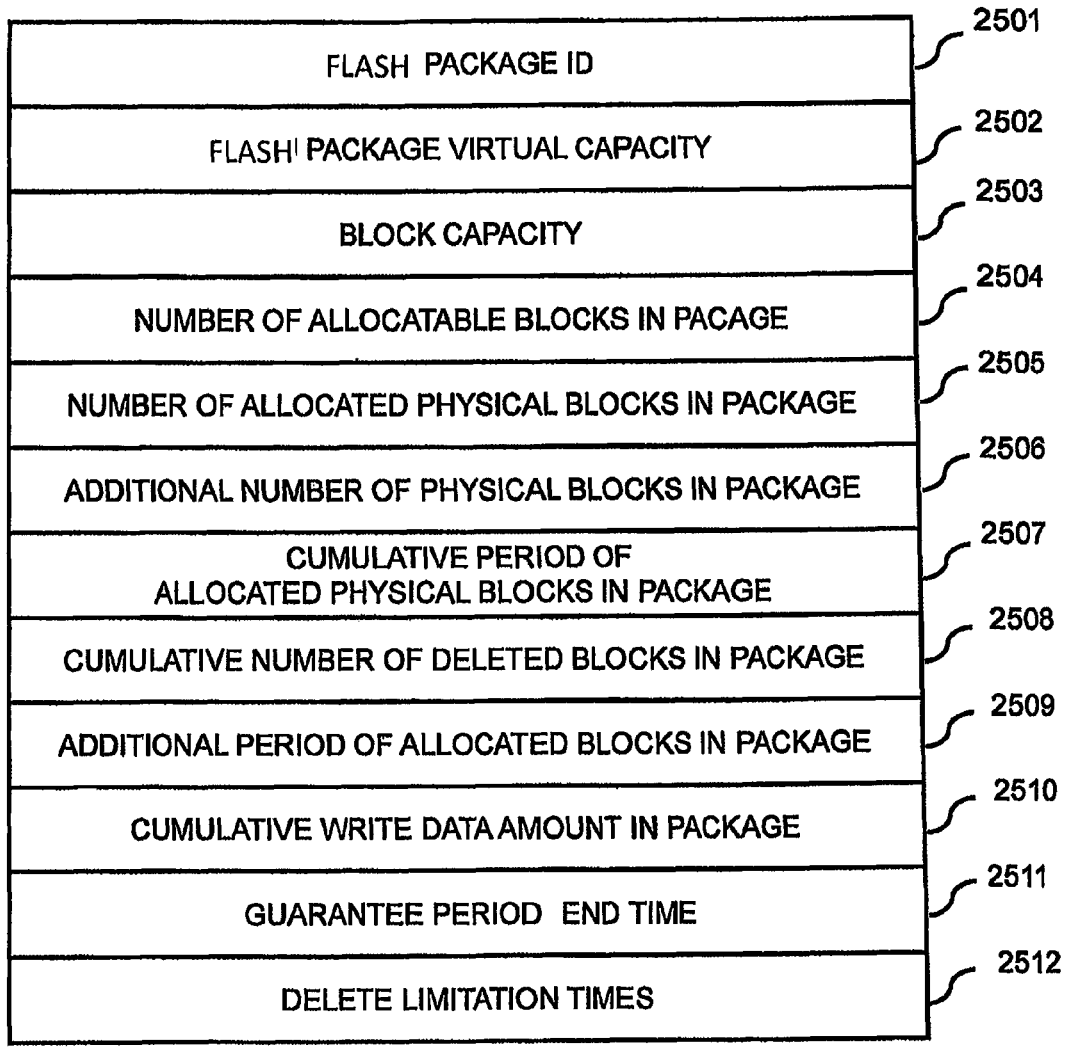
FIG. 11 is a diagram showing flash package information 2500.

FIG. 11 shows the flash package information 2500.

The flash package information 2500 exists for each flash package 230. The information 2500 will be explained below by giving a single flash package (called the "target flash package" in the explanation of FIG. 11) as an example.

The information 2500 comprises a flash package ID 2501, a flash package virtual capacity 2502, a block capacity 2503, a number of allocatable blocks in package 2504, a number of allocated real blocks in package 2505, an additional number of real blocks in package 2506, a cumulative period of allocated real blocks in package 2507, a cumulative number of deleted blocks in package 2508, an additional period of allocated blocks in package 2509, a cumulative write data amount in package 2510, a guarantee period end time 2511, and deletion limitation times 2512.

The flash package ID 2501 is the identifier of the target flash package 230.

The flash package virtual capacity 2502 is the virtual capacity of the target flash package 230.

The block capacity 2503 is the data capacity included in the virtual block and the real block. The data for the virtual block and the data stored in the real block are the same. Therefore, the value obtained by dividing the flash package capacity 2502 by the block capacity 2503 constitutes the number of virtual blocks of the target flash package 230.

The number of allocatable real blocks 2504 is the number of real blocks capable of being allocated inside the target flash package 230. For example, when x real blocks inside the flash package 230 constitute an error state (defective blocks), x is subtracted from the value denoted by the number of allocatable blocks 2504. In the case of the mode in which the flash package 230 implements the lower-level long life control (the wear-leveling function) and the lower-level capacity virtualization function, when the number of allocatable blocks decreases, the package controller 315 notifies the storage controller 200 that the number of allocatable blocks has decreased.

The number of allocated real blocks in package 2505 is the total of the number of allocated real blocks 2104 for all the real pages based on the target package group 280.

The additional number of real blocks in package 2506 is the total of the additional number of real blocks 2105 for all the real pages based on the target package group 280.

The cumulative period of allocated real blocks in package 2507 is the total of the cumulative period of allocated real blocks 2106 for all the real pages based on the target package group 280.

The cumulative number of deleted blocks in package 2508 is the total of the cumulative number of deleted blocks 2107 for all the real pages based on the target package group 280.

The additional period of allocated blocks in package 2509 is the total of the additional period of allocated blocks 2108 for all the real pages based on the target package group 280.

The cumulative write data amount in package 2510 is the total of the write data amount 2112 for all the real pages based on the target package group 280. However, the write data amount 2512 is information that exists instead of the cumulative number of deleted blocks 2107, and does not always exist.

The guarantee period end time 2511 is the time period (time) at which the guarantee period for the target flash package 230 ends.

The deletion limitation times 2512 denotes the limited number of times that a real block of the target flash package 230 can be deleted. There are a number of types of flash memory, and the limitation on the number of deletions differs for each one. For example, generally speaking, this limitation is reportedly around 100,000 deletions for the SLC (Single Level Cell), and between 5,000 and 10,000 deletions for the MLC (Multi Level Cell).

Next, the flash package 230 management information stored in the package memory 320 of the flash package 230 will be explained.

Figure 12:
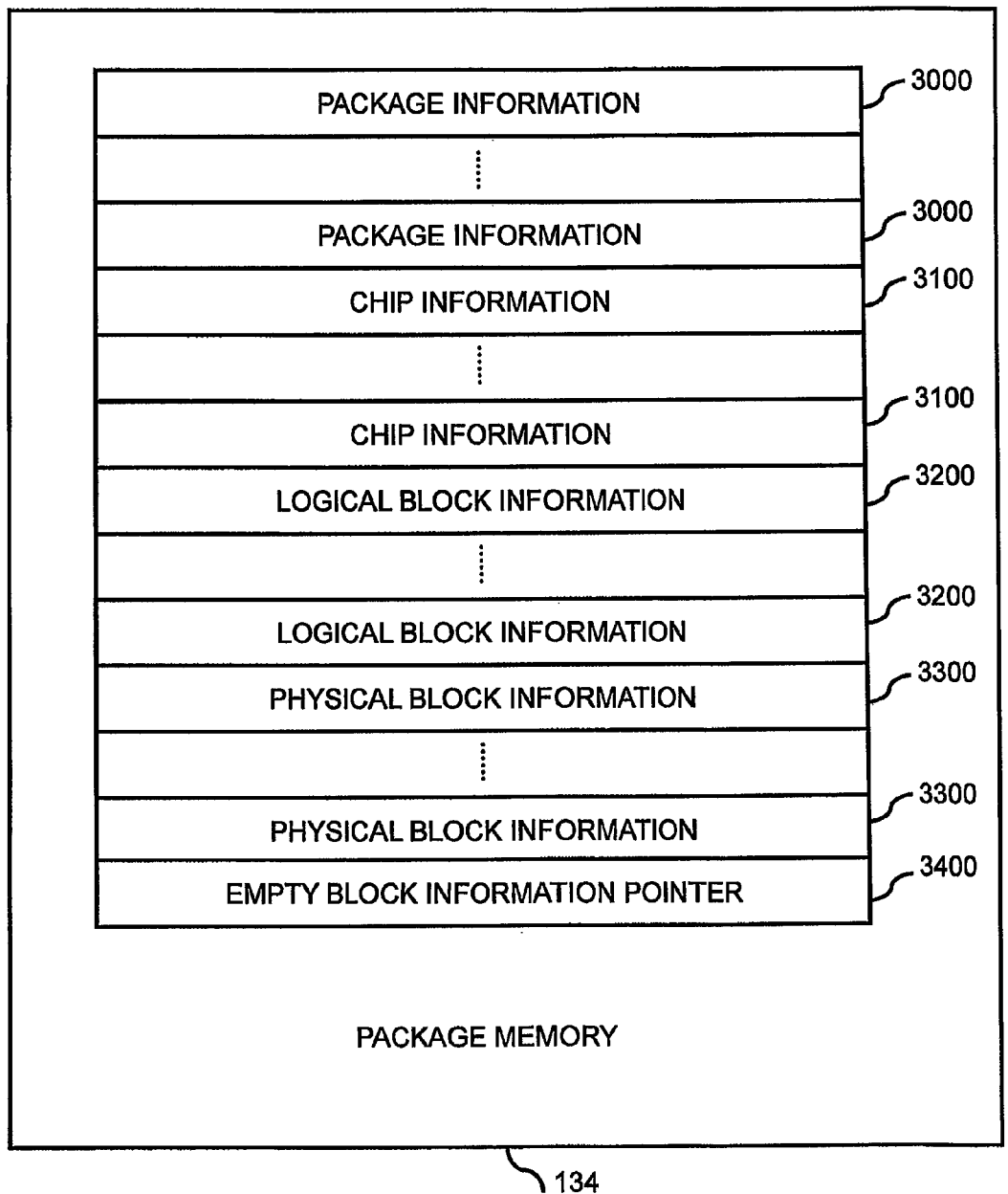
FIG. 12 is a diagram showing management information stored in a package memory 320.

FIG. 12 shows the management information stored in the package memory 320.

Figure 13:
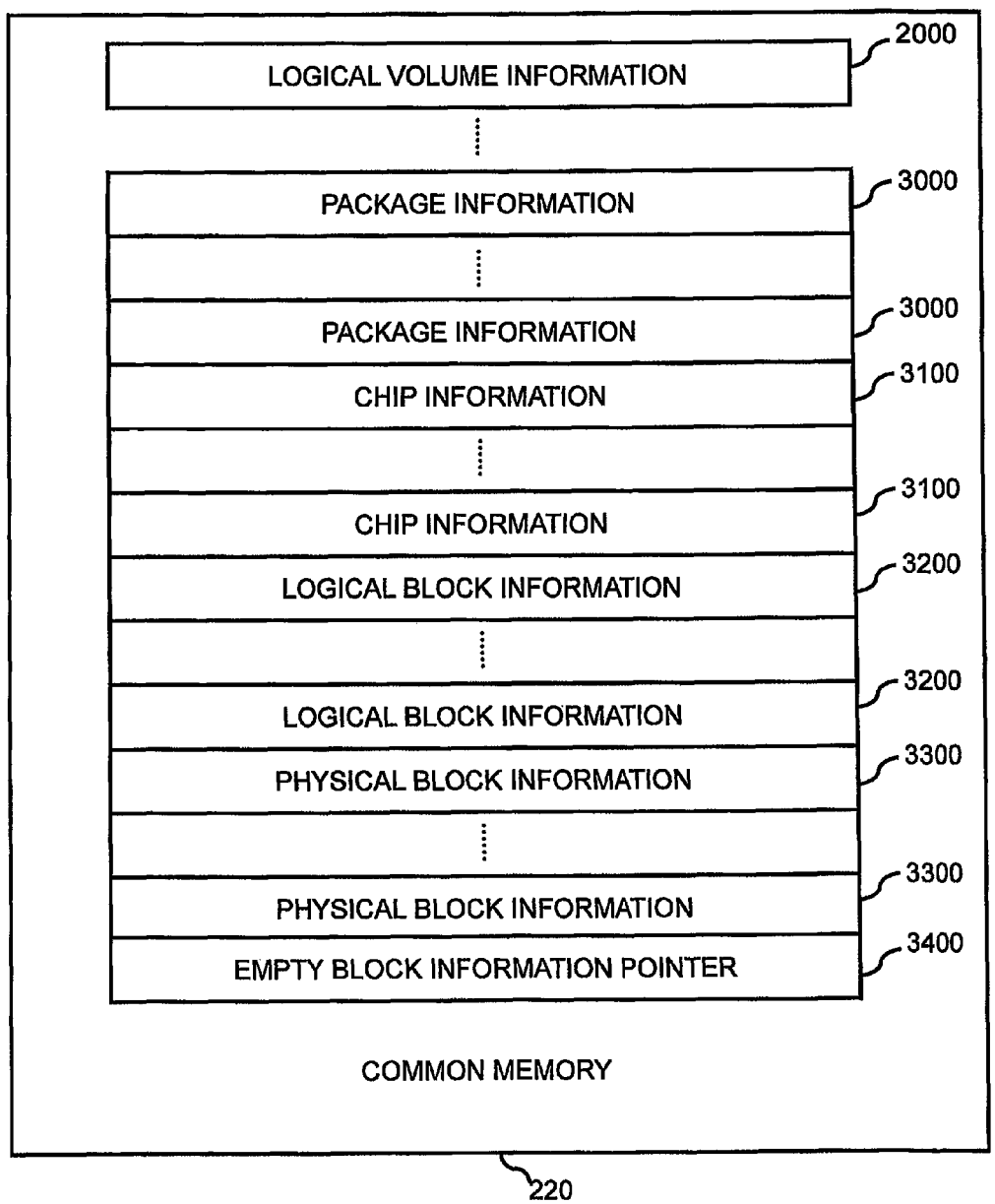
FIG. 13 is a diagram showing an example in which management information, which is the same as the management information shown in FIG. 12, is stored in the common memory 160.

This management information comprises package information 3000, chip information 3100, virtual block information 3200, real block information 3300, and an empty real block information pointer 3400. This management information is used in the lower-level wear-leveling control and the lower-level capacity virtualization function. In this embodiment, the flash package 230 carries out the lower-level long life control (the wear-leveling function), and has the lower-level capacity virtualization function. The lower-level long life control (the wear-leveling function) and the lower-level capacity virtualization function may be realized by the storage controller 200. In accordance with this, for example, substantially the same management information as the management information shown in FIG. 12 is stored in the common memory 220 as shown in FIG. 13. Because the management information shown in FIG. 13 is referenced and updated by the storage controller 200, it can differ slightly from the management information shown in FIG. 12.

In this embodiment, as described above, the flash package 230 realizes the lower-level long life control (the wear-leveling control) and the lower-level capacity virtualization function, and holds the management information shown in FIG. 12. The information 3000, 3100, 3200, 3300, and 3400 included in this management information will be explained in detail below.

Figure 14:
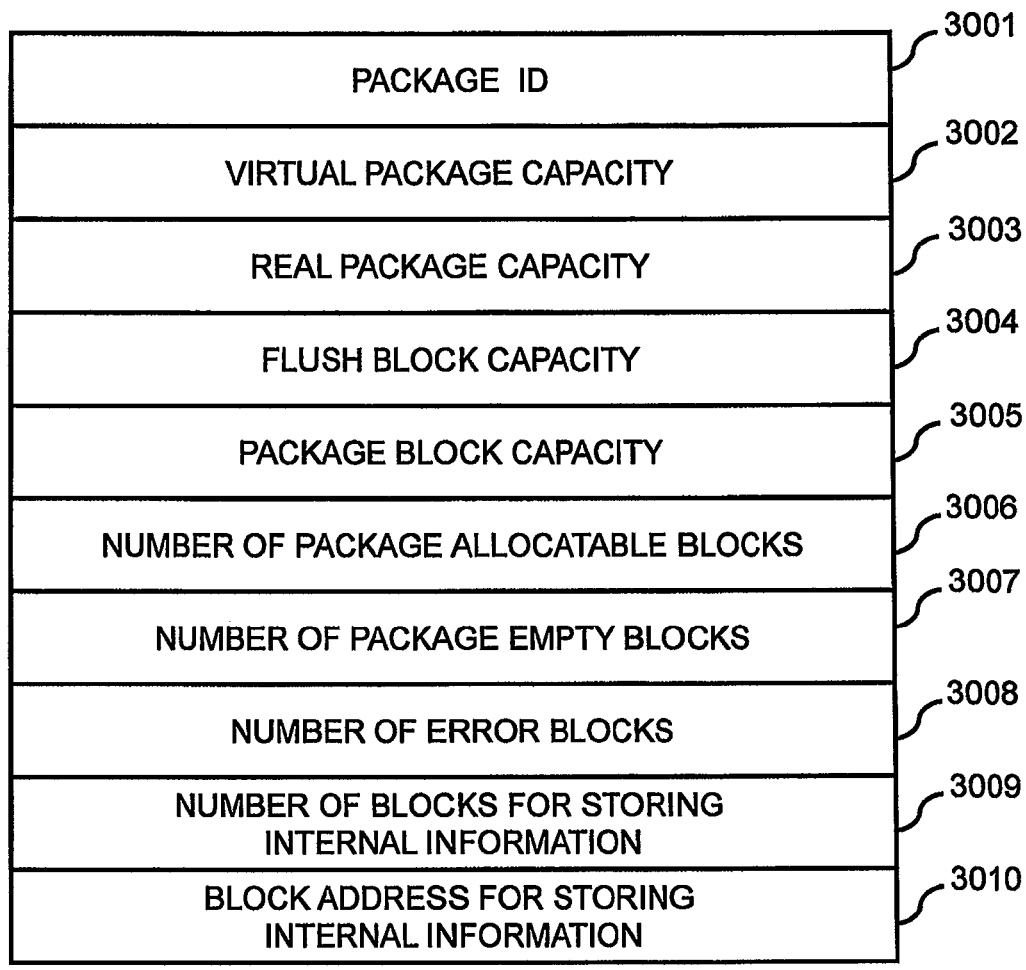
FIG. 14 is a diagram showing package information 3000.

FIG. 14 shows the package information 3000.

The package information 3000 will be explained below by giving a single flash package 230 (called the "target flash package" in the explanation of FIG. 14) as an example.

The package information 3000 comprises a package ID 3001, a virtual package capacity 3002, a real package capacity 3003, a flash block capacity 3004, a package block capacity 3005, a number of package allocatable blocks 3006, a number of package empty blocks 3007, a number of error blocks 3008, a number of blocks for storing internal information 3009, and a block address for storing internal information 3010.

The package ID 3001 is the identifier for the target flash package 230.

The virtual package capacity 3002 shows the virtual storage capacity of the target flash package 230 as viewed from the storage controller 200.

The real package capacity 3003 shows the storage capacity in which the storage controller 200 is actually able to store data inside the target package group 280.

The flash block capacity 3004 is the physical capacity of the block, which is the deletion unit of the flash memory. By contrast, the package block capacity 3005 is the capacity of the data stored in the virtual block and real block. In this embodiment, the flash block capacity 3004 (physical capacity of real block) is larger than the package block capacity (capacity (size)) stored in real block. The reason the two capacities 3004 and 3005 differ is primarily due to performance enhancement and extending the life of the block. These reasons will be explained below. Hypothetically, it is supposed that the two capacities 3004 and 3005 are the same. In this case, data is stored in all of the real blocks of the flash memory. It is supposed that the package controller 315 has received from the storage controller 200 a request (an ordinary write request) for rewriting a portion of the data inside the real block. Since the real block of the flash memory is not capable of a rewrite, the package controller 315 must read out all the data of this real block to the buffer 330, update only the rewrite part, and after deleting the relevant real block one time, store all the post-update data in the relevant real block. In a case where this kind of processing is executed each time the flash package 230 receives a write request, processing time is prolonged. To solve for this, in this embodiment, the value of the package block capacity 3005 is a smaller value than that of the flash block capacity 3004. Consequently, an empty capacity will exist in the real block, and when rewrite data enters the empty capacity, an additional write is carried out in the empty capacity. Furthermore, in a case where this additional write has been performed, the flash package 230 manages which address (may be a relative address) date inside the corresponding virtual block is written. In a case where the empty capacity becomes smaller and the rewrite data can no longer be entered, a delete process is carried out. In accordance with this, since the delete process may be carried out one time for every $n^{th}$ (n being an integer of 1 or higher) write request, it is possible to enhance performance. Further, reducing the number of delete processes also contributes toward extending the life of the flash memory.

The number of package allocatable blocks 3006 shows the number of real blocks, of the plurality of real blocks of the target flash package 230, capable of storing data received from the storage controller 200.

The number of package empty blocks 3007 shows the number of real blocks (empty real blocks), of the real blocks that are capable of storing data from the storage controller 200, that are not allocated to the virtual block.

The number of error blocks 3008 shows the number of real blocks (defective blocks) that are in an error state and are no longer able to store data.

The number of blocks for storing internal information 3009 shows the number of real blocks constituting the save-destination (for example, the save destination at the time of a power outage or an error) for the package information 3000, the chip information 3100, the virtual block information 3200, the real block information 3300, and the empty real block information pointer 3400 stored in the package memory 320. The block address for storing internal information 3010 shows the address of the save-destination real block. Due to the importance of the package information 3000, the chip information 3100, the virtual block information 3200, the real block information 3300, and the empty real block information pointer 3400, the saved information may be given a weight of n (where n is an integer of 2 or higher). Also, since a save operation may not be able to be carried out very often, the number of times the real block is deleted may cease to be a problem. The total of the number of package allocatable blocks 3006, the number of error blocks 3008, and the number of blocks for storing internal information 3009 is the number of real blocks of the target flash package 230.

Figure 15:
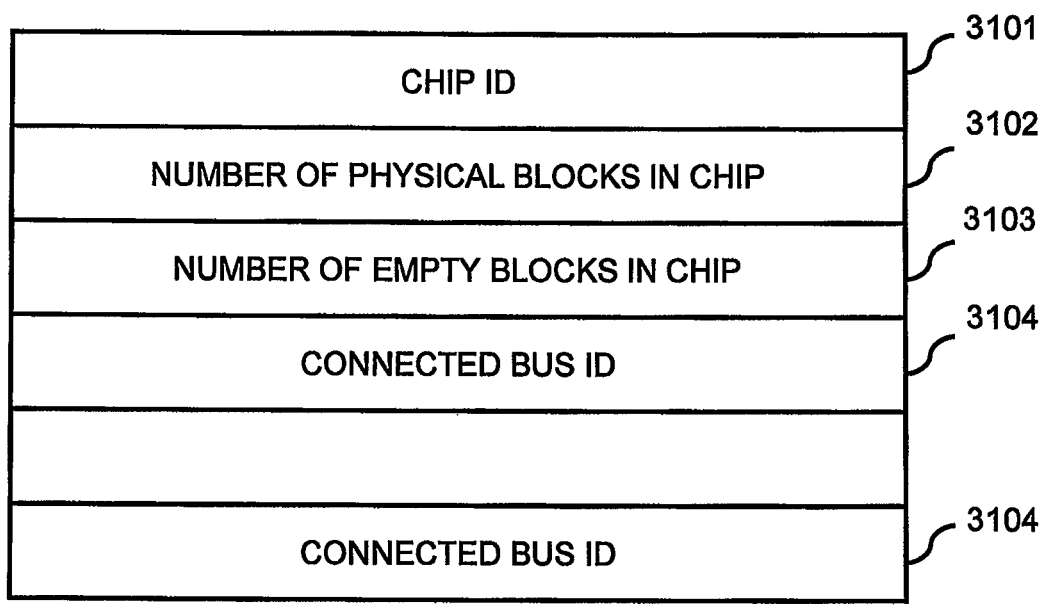
FIG. 15 is a diagram showing chip information 3100.

FIG. 15 shows the chip information 3100.

The chip information 3100 is information that exists for each flash chip 300. The chip information 3100 will be explained below by giving a single flash chip (called the "target chip" in the explanation of FIG. 15) as an example.

The chip information 3100 comprises a chip ID 3101, a number of real blocks in chip 3102, a number of empty blocks in chip 3103, and a connected bus ID 3104.

The chip ID 3101 is the identifier for the target chip 300.

The number of real blocks in chip 3102 shows the number of real blocks of the target chip 300.

The number of empty blocks in chip 3103 shows the number of empty blocks of the target chip 300.

The connected bus ID 3104 is the identifier for the package bus 340 to which the target chip 300 is connected.

Figure 16:
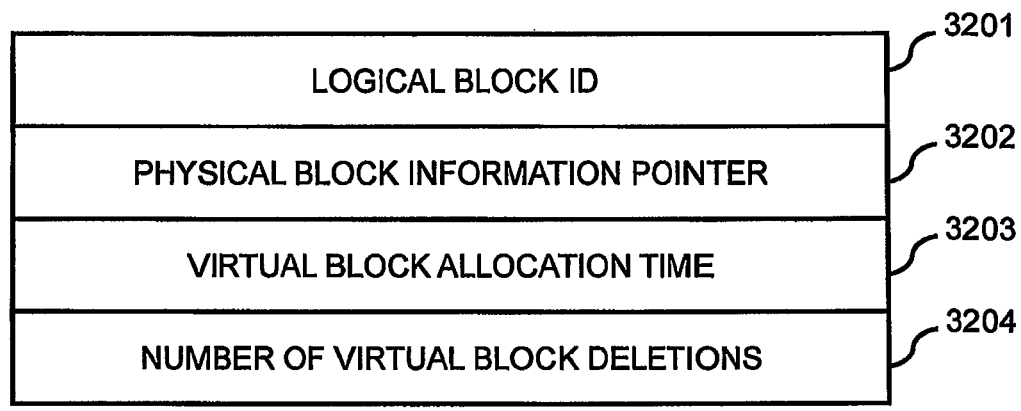
FIG. 16 is a diagram showing virtual block information 3200.

FIG. 16 shows the virtual block information 3200.

The virtual block information 3200 is information that exists for each virtual block. The virtual block information 3200 will be explained below by giving a single virtual block (called the "target virtual block" in the explanation of FIG. 16) as an example. Furthermore, the virtual block information 3200 is lined up in virtual block address order. The initial virtual block information 3200 corresponds to the head of the virtual block.

The virtual block information 3200 comprises a virtual block ID 3201, a virtual block information pointer 3202, a virtual block allocation time 3203 and a number of virtual block deletions 3204.

The virtual block ID 3201 is the identifier for the target virtual block.

The real block information pointer 3202 is the pointer to the real block information 3300 of the real block allocated to the target virtual block.

The virtual block allocation time 3203 is the time at which a write request specifying an address inside the target virtual block to which a real block has not been allocated was received from the storage controller 200.

The number of virtual block deletions 3204 is the number of deletions of the real block allocated to the target virtual block subsequent to the virtual block allocation time 3203. The virtual block allocation time 3203 and the number of virtual block deletions 3204 are handed over to the transfer-destination real page when data inside the real page comprising the target virtual block is transferred to another real page for executing hierarchical long life control and hierarchical capacity virtualization. In this handover process, the storage controller 200 reads out the virtual block allocation time 3203 and the number of virtual block deletions 3204 for the respective virtual blocks allocated to the transfer-source real page, and hands them over to the virtual block allocation time 3203 and the number of virtual block deletions 3204 of the respective virtual blocks allocated to the transfer-destination real page.

Figure 17:
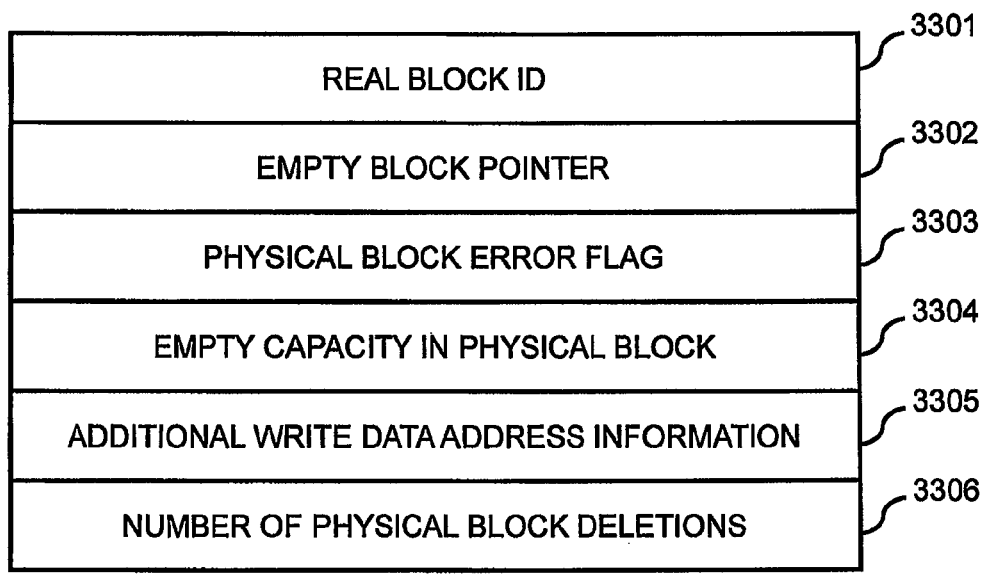
FIG. 17 is a diagram showing real block information 3300.

FIG. 17 shows the real block information 3300.

The real block information 3300 is information that exists for each real block. The information 3300 will be explained below by giving a single real block (called the "target real block" in the explanation of FIG. 17) as an example.

The real block information 3300 comprises a real block ID 3301, an empty block pointer 3302, a real block error flag 3303, an empty capacity in real block 3304, additional write data address information 3305, and a number of real block deletions 3306.

The real block ID 3301 is the identifier for the target real block. This ID 3301 shows the address of the flash chip 300 to which the real block corresponds.

The empty block pointer 3302, in a case where the target real block is an empty real block (a case in which the target real block is not allocated to any virtual block), specifies the real block information 3300 of the next empty real block.

The real block error flag 3303 is ON when the target real block is in an error state and is no longer able to store data.

The empty capacity in real block 3304 shows the current empty capacity of the target real block. Initially, for example, this value is the difference obtained from (the flash block capacity 3004—package block capacity 3005). The package processor 310 receives from the storage controller 200 a write request for writing the data having a size less than this empty capacity to the target real block, and writes the data targeted by the write request to this empty capacity. Subsequent to the write, the value of the empty capacity in real block 3304 decreases by the amount of the written data.

The additional write data address information 3305 is the set-value of the data length and relative address of all the data inside the real block for which an additional write was performed to the initial empty capacity (the capacity area of (the flash block capacity 3004—package block capacity 3005)).

The number of real block deletions 3306 shows the number of times the target real block has been deleted up until the present.

Figure 18:
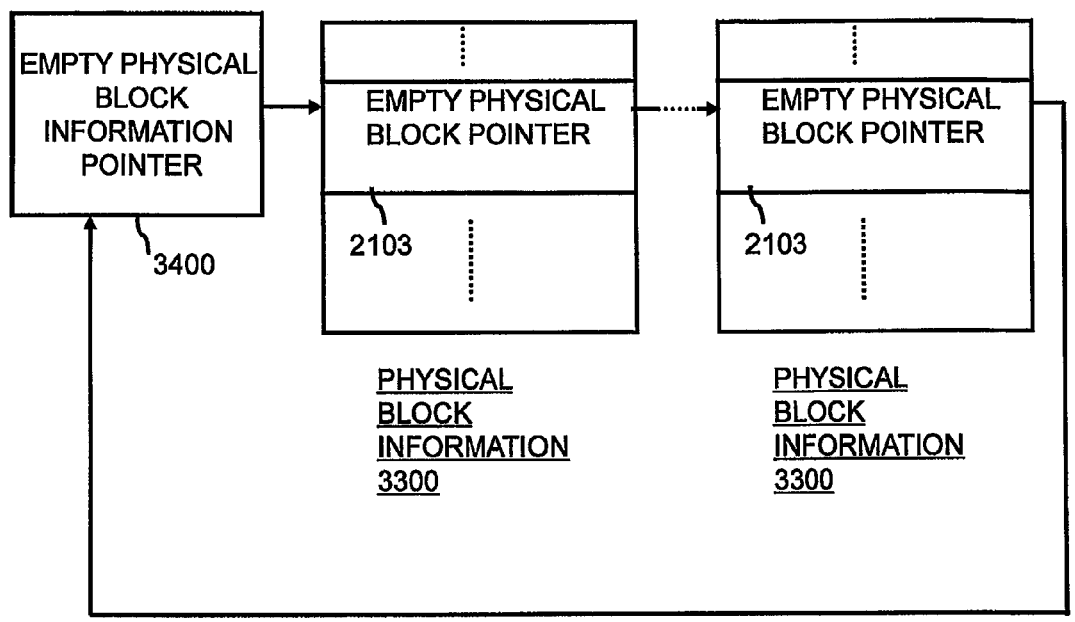
FIG. 18 is a diagram denoting a group of empty blocks managed by an empty real block information pointer 3400.

FIG. 18 denotes a set of empty real blocks managed by the empty block information pointer 3400.

The empty block information management pointer 3400 points to the address of the real block information 3300 of the first empty block. Next, the empty block pointer 3302 inside the real block information 3300 of the first empty block shows the real block information 3300 of the next empty block. In FIG. 18, the empty real block pointer 2103 of the real block information 3300 of the last empty block shows the empty real block information pointer 3400, but this may be a NULL value. The package processor 310, upon receiving a write request specifying an address inside the virtual block to which a real block has not been allocated, retrieves from any flash chip 300 (for example, the chip having the largest number of empty blocks) an empty block on the basis of the empty real block information pointer 3400 corresponding to this chip, and allocates the retrieved empty block (real block) to the virtual block.

The processing carried out by the storage controller 200 and the package controller 315 will be explained next.

First, the processing carried out by the storage controller 200 will be explained. The processing carried out by the storage controller 200 is realized by the processor 260 executing a program that is stored inside the memory 270. The processing explained below by giving the program inside the memory 270 as the subject is actually carried out by the processor 260.

Figure 19:
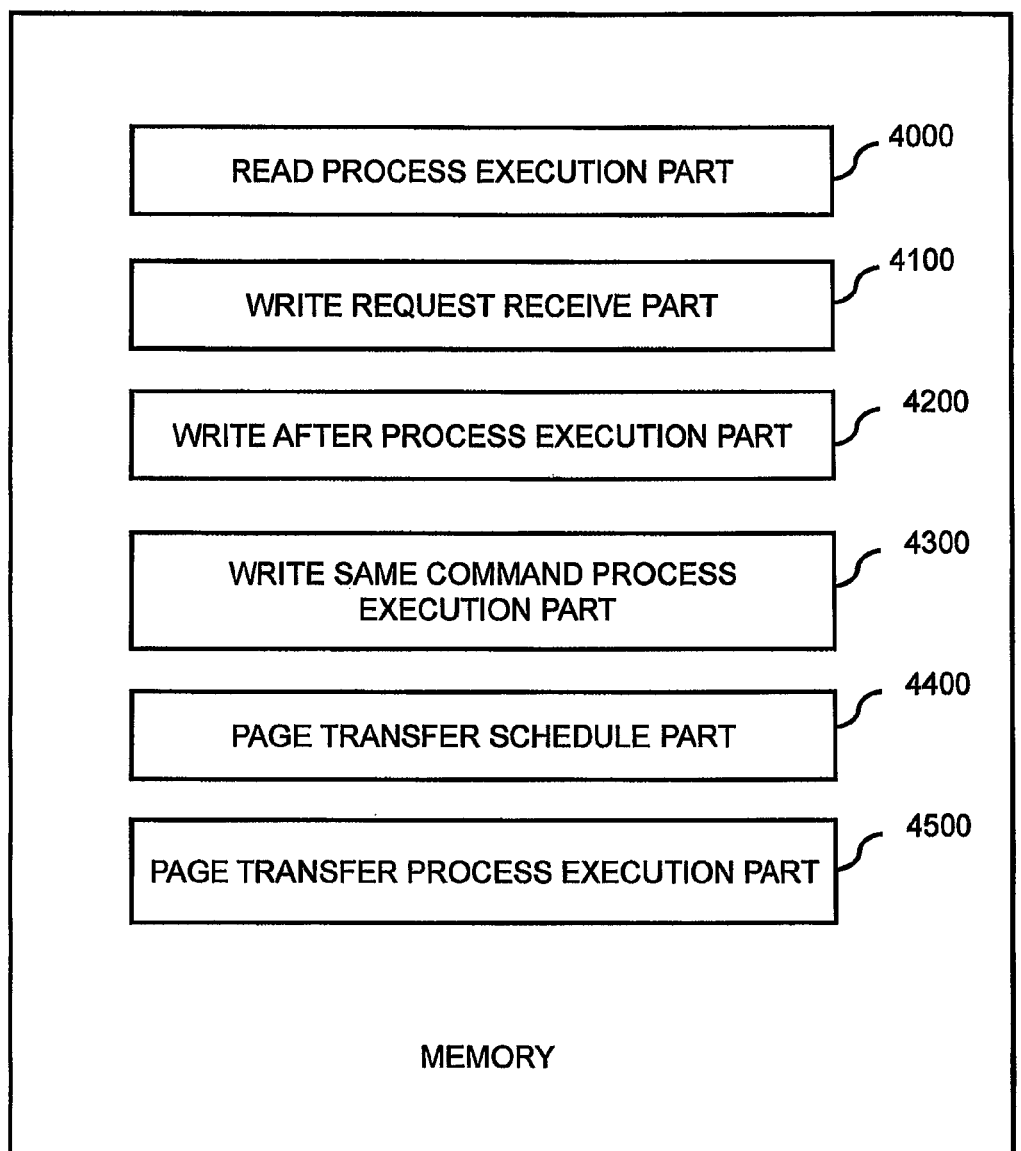
FIG. 19 is a diagram showing programs stored in a memory 270.

FIG. 19 shows the programs stored in the memory 270.

The programs, for example, include a read process execution part 4000, a write request receive part 4100, a write after process execution part 4200, a write same command process execution part 4300, a page transfer schedule part 4400, and a page transfer process execution part 4500. These programs comprise the higher-level long life control and the higher-level capacity virtualization function. Furthermore, it has already been explained, but, in this embodiment, the package controller 315 realizes the lower-level long life control and the lower-level capacity virtualization function, but the lower-level long life control and the lower-level capacity virtualization function may also be realized by the storage controller 200. Since both the lower-level programs and the higher-level programs will be executed by the storage controller 200 in this case, the inter-program interface will differ, but basically the contents executed by the higher-level programs will not differ much. Therefore, in this embodiment, the flows of processing respectively carried out by the read process execution part 4000, the write request receive part 4100, the write after process execution part 4200, the write same command process execution part 4300, the page transfer schedule part 4400, and the page transfer process execution part 4500 will be explained in detail premised on the fact that the package controller 315 realizes the lower-level long life control and the lower-level capacity virtualization function.

Figure 20:
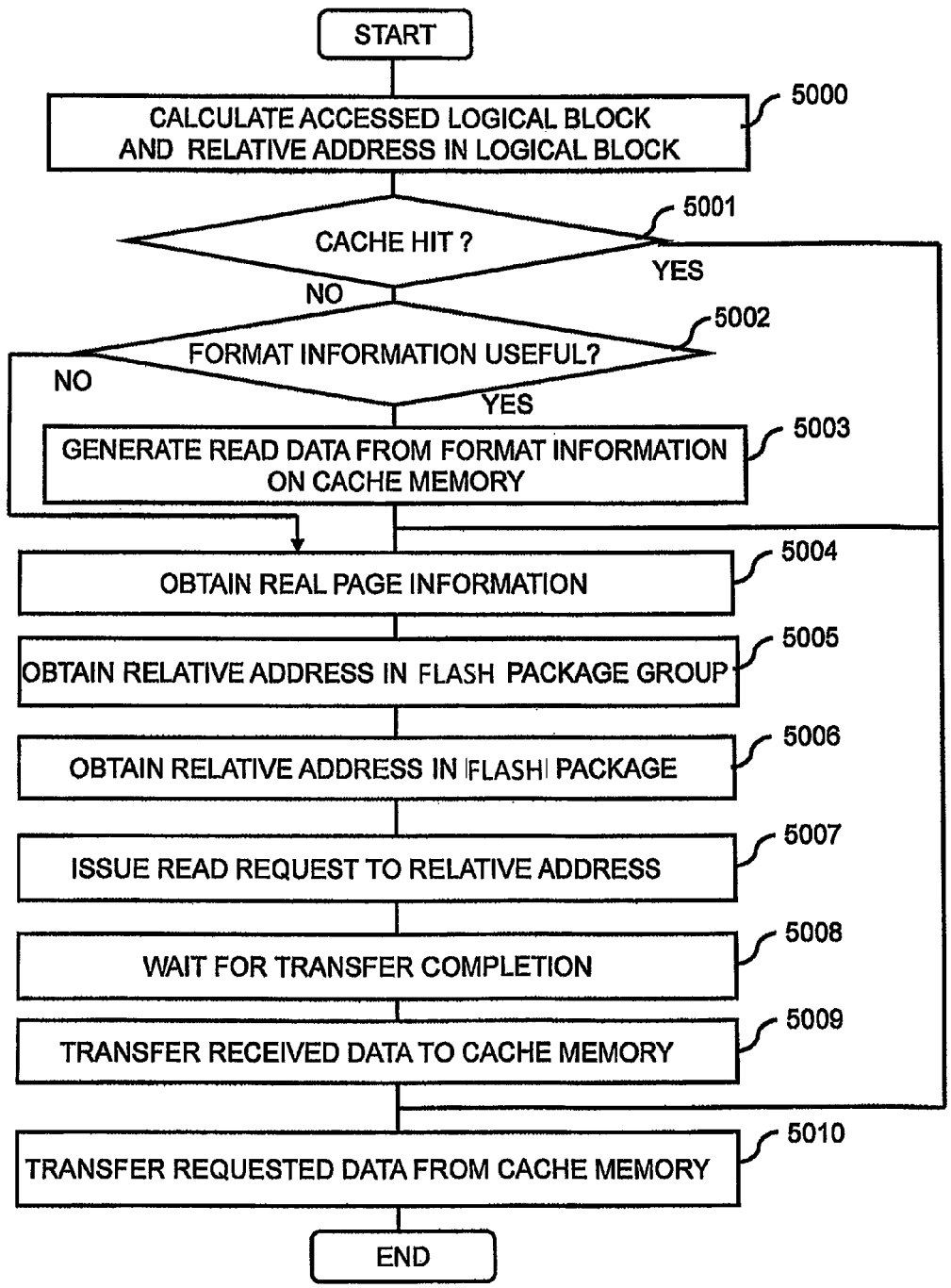
FIG. 20 is a diagram showing the flow of processing of a read process execution part 4000.

FIG. 20 shows the flow of processing of the read process execution part 4000.

The read process execution part 4000 is executed when the storage controller 200 receives a read request from the host 110. In the explanation of FIG. 20, data targeted by the read request will be called "read-targeted data", and a read-request-specified logical volume, virtual page, and area in this virtual page will be called the "read-source logical volume", the "read-source virtual page" and the "read-source area".

Step 5000: The execution part 4000 calculates the relative addresses of the read-source virtual page and the read-source area from the read-targeted address specified in the received read request.

Step 5001: The execution part 4000 determines whether or not the read-targeted data exists in the cache memory 210 (whether or not there was a cache hit). In the case of a cache hit, Step 5010 is carried out, and in the case of a cache miss, Step 50002 is carried out.

Step 5002: In the case of a cache miss, the execution part 4000 first determines whether or not the format information 2005 corresponding to the read-source virtual page is a valid value. In the case of an invalid value, the execution part 4000 jumps to Step 5004.

Step 5003: In a case where the format information 2005 is valid, as for the execution part 4000, this pattern data (repetitive information) is stored in the read-source area. For this reason, the execution part 4000 stores the pattern data of this information 2005 in the cache memory 210, and jumps to Step 5010.

Step 5004: It is necessary to load the read-targeted data into the cache memory 210 at this point. First, the execution part 4000 acquires from the real page pointer 2004 inside the information 2000 corresponding to the read-source logical volume the real page information 2100 corresponding to the real page (called the "read-source real page" in the explanation of FIG. 20 below) allocated to the read-source virtual page.

Step 5005: The execution part 4000 obtains the package group 280 to which the read-source real page belongs and the first address inside the package group 280 of the read-source real page from the package group 2101 and real page address 2102 inside the acquired real page management information 2100.

Step 5006: The execution part 4000 calculates the relative address inside the read-source real page from the relative address inside the read-source virtual page and the package group RAID type 2302. The execution part 4000 specifies which address of which flash package 230 is to be accessed based on the calculated relative address inside the real page and the package group RAID type 2302 and flash package pointer 2305 corresponding to the read-source real page.

Step 5007: The execution part 4000 sends the read request specifying the address specified in Step 5006 to the flash package 230 specified in this Step 5006.

Step 5008: the execution part 4000 waits for the data targeted in the read request to be sent from the send-destination flash package 230 of the read request.

Step 5009: The execution part 4000 stores the data sent from the flash package 230 in the cache memory 150.

Step 5010: The execution part 4000 sends the read-targeted data stored in the cache memory 210 to the host 110.

Figure 21:
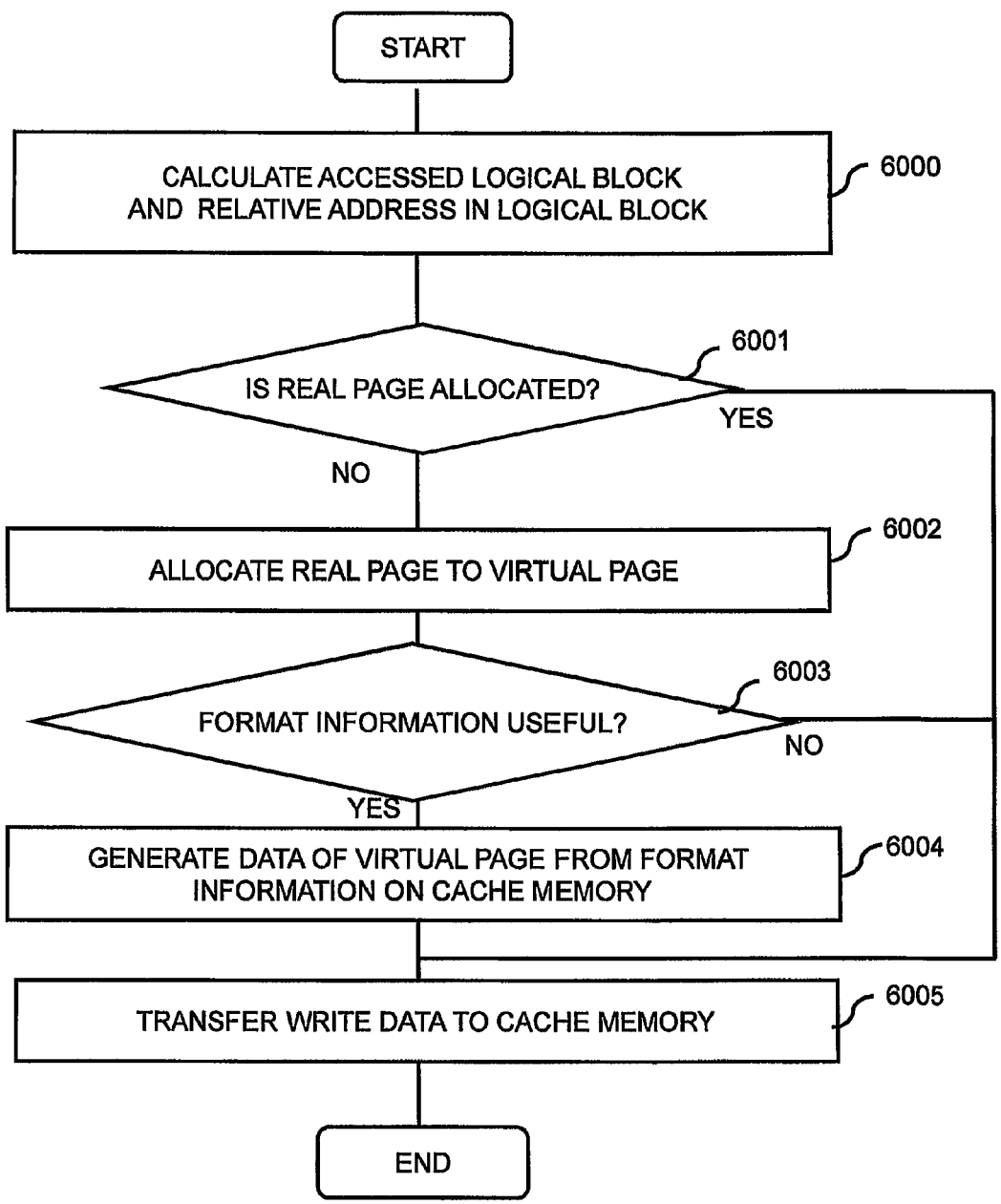
FIG. 21 is a diagram showing the flow of processing of a write request receive part 4100.

FIG. 21 shows the flow of processing of the write request receive part 4100.

The write request receive part 4100 is executed when the storage controller 200 receives a write request from the host 110. In the explanation of FIG. 21, data appended to the write request will be called the "write-targeted data", and a write-request-specified logical volume, virtual page, and area in this virtual page will be called the "write-destination logical volume", the "write-destination virtual page", and the "write-destination area".

Step 6000: The receive part 4100 calculates the relative addresses of the corresponding write-destination virtual page and write-destination area from the address targeted for the write by the received write request.

Step 6001: The receive part 4100 references the real page pointer (the pointer inside the information 2000 corresponding to the write-destination logical volume) 2004 corresponding to the write-destination virtual page to determine whether or not the real page has been allocated to the write-destination virtual page obtained in Step 6000. In a case where the real page has not been allocated, the receive part 4100 carries out Step 6002, and in a case where the real page has been allocated, the receive part 4100 jumps to Step 6003.

Step 6002: The receive part 4100 allocates the empty page to the write-destination virtual page. Specifically, for example, the receive part 4100 carries out (a) through (e) below:
(a) Decides which package group 280-based real page will be allocated to the write-destination logical page by referencing the RAID type 2002 inside the information 2000 corresponding to the write-destination virtual volume and the package group RAID type 2303 and number of empty pages 2304 inside the package group information 2300;
(b) References the empty page information management pointer 2400 corresponding to the decided package group 280, and updates the real page pointer 2004 corresponding to the write-destination virtual page so as to show the first empty page information 2100 (This results in the empty page being allocated to the write-destination virtual page);
(c) Updates the empty page information management pointer 2400 so as to show the subsequent real page information 2100 (the real page information 2100 specified by the empty physical page pointer 2103 inside the real page information 2100 of the real page allocated to the virtual page);
(d) Sets the empty physical page pointer 2103 inside the real page information 2100 of the real page allocated to the write-destination virtual page to the NULL value; and
(e) Reduces the value showing the number of empty pages 2304 of the package group information 2300 corresponding to the allocated real page.

In this embodiment, the process for allocating the empty page to the virtual page is executed when a write-request has been received, but this allocation process may be executed by the time when the data is stored in the flash package 230. Thereafter, processing jumps to Step 6005.

Step 6003: The receiving part 4100 determines whether or not the format information 2005 corresponding to the write-destination virtual page is a valid value. In the case of an invalid value, the receive part 4100 jumps to Step 6005.

Step 6004: Executing this write request causes the format information 2005 corresponding to the write-destination virtual page to become an invalid value. For this reason, for this write request, it is necessary to perform writing using the current format information 2005 corresponding to the write-destination virtual page in an area other than the write-destination area in the write-destination virtual page. Therefore, the receive part 4100 stores the pattern data of the format information 2005 corresponding to the write-destination virtual page in the cache memory 210 at this point (The write-targeted data in this write request is received in the next Step 6005). Further, the receive part 4100 attaches information showing which address should be written of which flash package 230 to this pattern data. To acquire this information, the receive part 4100 executes the processing of Steps 5004 and 5005 of FIG. 20 here. After this, the format information 2005 corresponding to the write-destination virtual page is set to an invalid value.

Step 6005: The receive part 4100 stores the write-targeted data from the host 110 in the cache memory 210. In a case where the pattern data was stored in the cache memory 210 in Step 6004, the repetitive pattern of the write-destination area is replaced by the write-targeted data received at this time. At this time as well, information showing to which address of which flash package 230 writing should be carried out is attached to this pattern data. To acquire this information, the processing of Steps 5004 and 5005 of FIG. 20 are also executed here.

The package group 280 has a RAID configuration. For this reason, there will be cases in which redundancy data will have to be generated in the write-targeted data stored in the cache memory 210. Also, since the real page has an area for storing redundancy data, the write-destination address inside the real page of the redundancy data corresponding to the write-targeted data is also uniquely determined. The redundancy data is also stored in the cache memory 210 one time. Furthermore, information showing to which address of which flash package 230 writing should be carried out is also attached to the redundancy data in the cache memory 210 the same as the write-targeted data. The write-targeted data and the redundancy data are written to the flash package 230 by the write after process execution part 5200. As seen from the write after process execution part 5200, since these data are both written to the flash package 230, there is no need to distinguish between the two (that is, there is no need to distinguish between which is the write-targeted data and which is the redundancy data). Similarly, there is also no need for the flash package 230 to distinguish between the two.

Figure 22:
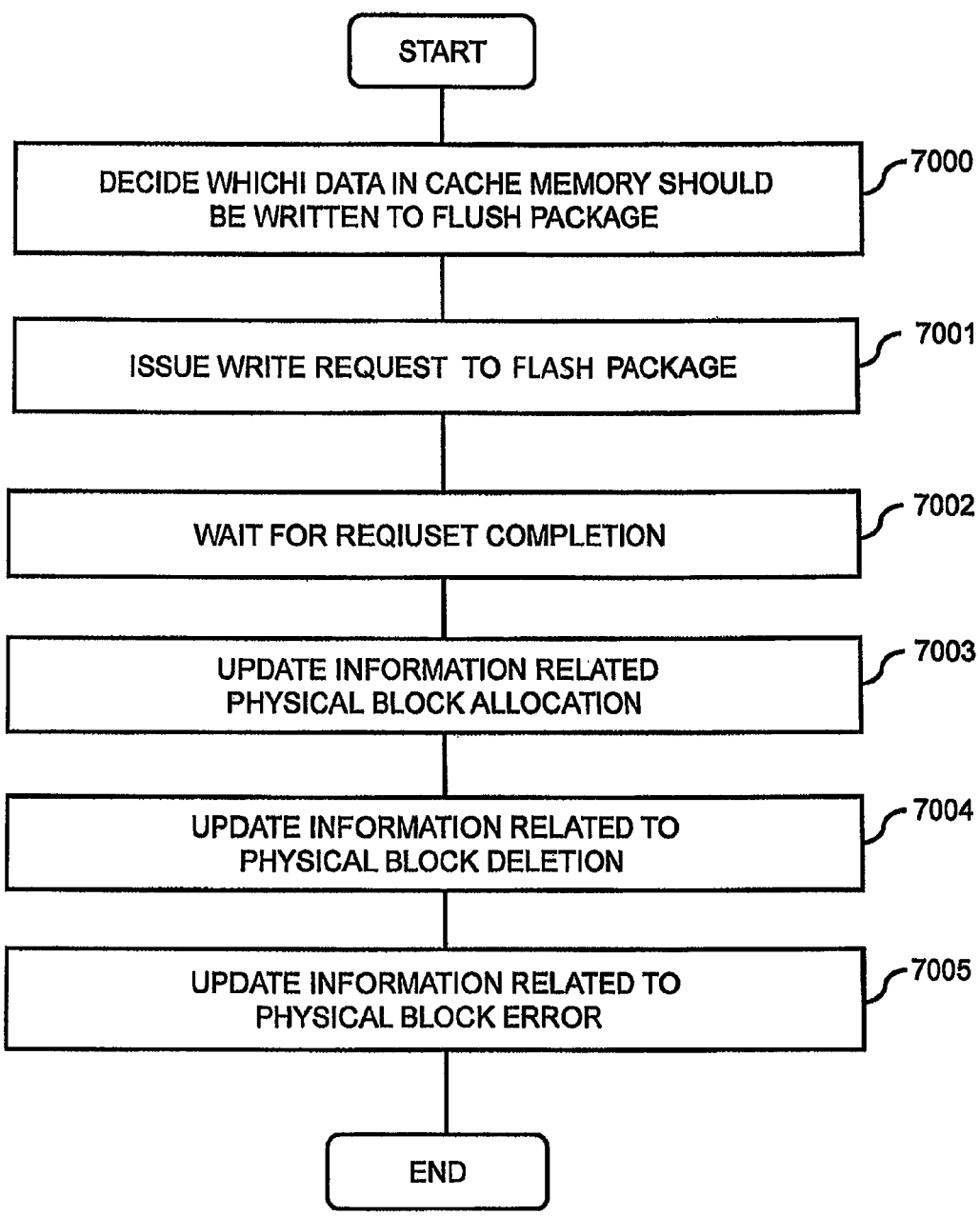
FIG. 22 is a diagram showing the flow of processing of a write after process execution part 4200.

FIG. 22 shows the flow of processing of the write after process execution part 4200.

The write after process execution part 4200 is executed arbitrarily (for example, regularly). The execution part 4200 carries out write after processing for writing the write-targeted data and redundancy data inside the cache memory 210 to the flash package 230. However, the execution part 4200 processes both the write-targeted data and the redundancy data as data to be written to the flash package 230 (called "destage-targeted data" in the explanation of FIG. 22) without distinguishing between the two.

Step 7000: The execution part 4200 determines the destage-targeted data by searching the cache memory 210. Furthermore, in a case where the moving state flag 2109 corresponding to the write-destination real page (the real page to which the virtual block having the write-destination address is allocated) in ON, the data inside the write-destination real page is in the process of being transferred. In this case, the execution part 4200 stops the write of the destage-targeted data determined, and retrieves another destage-targeted data.

Step 7001: The execution part 4200 acquires the address information furnished in the retrieved destage-targeted data, and sends the destage-targeted data and a write request specifying the write-destination address specified on the basis of the address information in the flash package 230 specified based on the address information. Further, the execution part 4200 furnishes the current time acquired from the timer 240 (a counter uniquely determined inside the storage system 100 may also be used) to the write request sent to the flash package 230. The time furnished to the write request is used to calculate the average number of deletions, which will be described further below (specifically, this time is used to update the cumulative period of allocated real blocks 2106 and the cumulative period of allocated real blocks in package 2507).

Step 7002: The execution part 4200 waits to receive a write completion report (a completion report with respect to the write request) from the flash package 230.

Step 7003: The execution part 4200 executes (a) through (c) below:
(a) Determines, based on the write completion report from the flash package 230, whether or not the real block has been allocated to the virtual block (the write-destination virtual block) having the address specified in the write request;
(b) In a case in which the real block has been allocated (in a case where the determination result of (a) is affirmative), adds the number of allocated real blocks (called the "number of real blocks allocated this time" in the explanation of FIG. 22) to the additional number of real blocks 2105 corresponding to the write-destination real page and the additional number of real blocks in package 2506 corresponding to the write-destination package (the flash package constituting the basis of the write-destination real page) 230; and
(c) Multiplies the value of (the next schedule time 2701—the current time (the current value of the timer 240)) by the number of real blocks allocated this time, and adds this multiplication value to the additional period of allocated real blocks 2108 corresponding to the write-destination real page and the additional period of allocated blocks in package 2509 corresponding to the write-destination package 230. In (c), for example, in a case where the number of real blocks allocated this time is 3, and the (the next schedule time 2701—the current time) is 40 minutes, the multiplication value becomes 120 minutes, and 120 minutes is respectively added to the time period 2108 corresponding to the write-destination real page and the time period 2509 corresponding to the write-destination package 230.

Step 7004: The execution part 4200 executes (a) and (b) below:
(a) Determines, based on the write completion report from the flash package 230, whether or not a delete process was generated for the real block; and
(b) In a case where a delete process has been generated (a case in which the determination result of (a) is affirmative), adds the number of deletions generated (for example, in a case where the delete process is generated one time for two real blocks, the number of deletions is 2) to the cumulative number of deleted blocks 2107 corresponding to the write-destination real page and the cumulative number of deleted blocks in package 2508 corresponding to the write-destination package (In a case of the write data amount 2112 and the cumulative write data amount in package 2510, the amount of destage-targeted data written via this write after process is respectively added to the information of 2112 and 2510).

Step 7005: The execution part 4200 executes (a) and (b) below:
(a) Determines, based on the write completion report from the flash package 230, whether or not there is a real block for which the number of block deletions is greater than a fixed value (constitutes an error state); and
(b) In a case where there is a real block in the error state (a case in which the determination result of (a) is affirmative), subtracts the number of real blocks that are in the error state from the number of allocatable blocks in package 2504 corresponding to the write-destination package.

Figure 23:
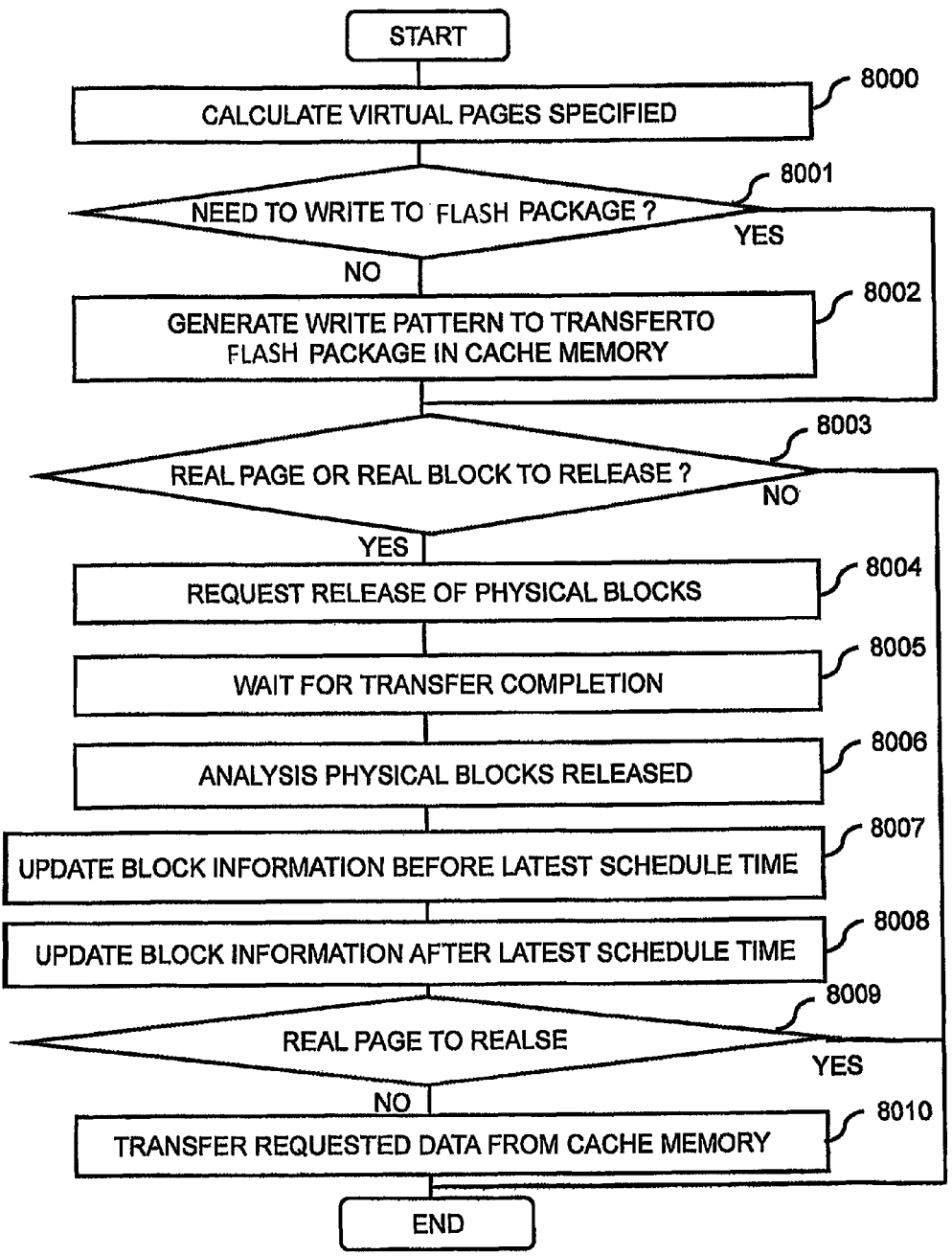
FIG. 23 is a diagram showing the flow of processing of a write same command process execution part 4300.

FIG. 23 shows the flow of processing of the write same command process execution part 4300.

The write same command process execution part 4300 is executed when the storage controller 200 receives a write same command from the host 110. The write same command is a request for repeatedly writing pattern data (for example, a short pattern data) to a certain storage area. The storage controller 200, rather than writing this pattern data to the storage area (the storage area inside the virtual page) specified in the write same command, stores the fact that the pattern data is stored in the virtual page corresponding to the specified storage area, and releases the real page allocated to this virtual page (releases the allocation of the real page). This cuts back on the amount of storage capacity consumed. Furthermore, a delete process with respect to the released real block is required in order to allocate the real block (called the "released real block" in the explanation of FIG. 23), which is allocated to the virtual block corresponding to the released physical page, to another virtual block. In this embodiment, the storage controller 200 specifies the delete process for the released real block to the flash package 230 upon receiving the write same command. The write same command may be sent from the storage controller 200 to the package controller 315, and the package controller 315 may carry out the real block release and delete process in response to this request. Furthermore, in a case where pattern data (for example, formatting data), such as all 0's, is written in response to a normal write request, either the storage controller 200 or the package controller 315 may recognize the pattern data and release the real block.

Step 8000: The execution part 4300 specifies a group of virtual pages related to the storage area (called the write-specified area below) specified in the received write same command. The write-specified area, for example, corresponds to a portion of the virtual page area (called the virtual area portion below), the entire area of one or more virtual pages, or a combination thereof.

Step 8001: In this embodiment, specifying the entire virtual page makes the real page the target for a release. Further, there is a possibility that specifying the entire virtual block could release the real block inside the flash package 160. In the case of a RAID 0 or a RAID 1, specifying the entire virtual block makes it possible to release the corresponding real block. However, even when the entire virtual block has been specified, in a case where one redundancy data is created from N data as in RAID 5, it is not possible to simply release the corresponding real block. In this embodiment, in a case where all of the N virtual blocks configuring the RAID 5 have been specified, the corresponding N real blocks and the one real block storing the redundancy data thereof are released. In a case where a portion of the area of the virtual block, or a portion of the area of the N virtual blocks configuring the RAID 5 has been specified, the specified information pattern must be written to the specified storage area. In this Step, the execution part 4300 classifies the storage areas into an area in which the information pattern must be written to the flash package 230, and an area inside the flash package 230 for which real block release is possible. In a case where it is not necessary to write the information pattern to the flash package 230, the execution part 4300 jumps to Step 8003.

Step 8002: The execution part 4300 stores the pattern data written to the flash package 230 in the cache memory 210. At this time, the address information specifying which area of which flash package 230 is to be written to is furnished to this pattern data. Thereafter, this pattern data is written to the flash package 230 the same as the write-targeted data appended to the write request.

Step 8003: The execution part 4300 determines whether a releasable real block and real page exist. When neither exist, this processing flow ends.

Step 8004: The execution part 4300 sends a release request specifying the storage area of the flash package 230 determined in Step 8001 to this flash package 230. It is possible for this release request to be sent to one or more flash packages 230 configuring the package group 280.

Step 8005: The execution part 4300 waits for the process reports from all of the flash packages 230 at the release request send destination.

Step 8006: In response to this release request, the package controllers 315 inside the respective flash packages 230 report to the storage controller 200 the number of virtual blocks that have actually been released (=number of real blocks) for the respective virtual blocks and the time at which the real block was allocated to each virtual block and the number of virtual block deletions for each virtual block. In this Step, the execution part 4300 determines the real block allocation time for each virtual block, and classifies the virtual blocks into a virtual block having a value of prior to the latest schedule time 2701 and a virtual block having a value of subsequent to the latest schedule time 2701. In the below Steps 8007 and 8008, the attribute (for example, allocation period) related to the released real block is deleted from the information of the real page information 2100 and the flash package information 2500.

Step 8007: The processing of this Step is directed at a group of virtual blocks having a value of prior to the latest schedule time 2701. The execution part 4300 executes (a) through (f) below:
(a) Calculates the value of (real block allocation time—latest schedule time 2701) for each real block allocation time, and adds this value to each corresponding real page and flash package 230 (the real block allocation time, for example, is the time furnished in the write request of the storage controller 200).
(b) Subtracts the respective added values from the cumulative period of allocated real blocks 2106 inside all corresponding real page information 2100 and from the cumulative period of allocated real blocks in package 2507 inside all corresponding flash package management information 2500;
(c) Adds the number of deletions for each virtual block to each corresponding real page and flash package 230;
(d) Subtracts the respective added values from the cumulative number of deleted blocks 2107 inside all corresponding real page information 2100 and from the cumulative number of deleted blocks in package 2508 inside all corresponding flash package management information 2500;
(e) Counts how many virtual blocks having the real block allocation time exist for each real page and flash package 230; and
(f) Subtracts the respective count values from the number of allocated real blocks 2104 inside all corresponding real page information 2100 and from the number of allocated real blocks in package 2505 inside all corresponding flash package management information 2500.

Step 8008: The processing of this Step is directed at a group of virtual blocks having a value of subsequent to the latest schedule time 2701. The execution part 4300 executes (a) through (f) below:
(a) Calculates the value of (next schedule time 2701—real block allocation time) for each real block allocation time, and adds this value to each corresponding real page and flash package 230;
(b) Subtracts the respective added values from the additional period of allocated real blocks 2108 inside all corresponding real page information 2100 and from the additional period of allocated blocks in package 2509 inside all corresponding flash package management information 2500;
(c) Adds the number of deletions for each virtual block to each corresponding real page and flash package 230;
(d) Subtracts the respective added values from the additional number of deleted real pages 2109 inside all corresponding real page information 2100 and from the additional number of deleted real pages in package 2510 inside all corresponding flash package management information 2500;
(e) Counts how many virtual blocks having the real block allocation time exist for each real page and flash package 230 (this processing may also be omitted since it was carried out in Step 8007); and
(f) Subtracts the respective count values from the additional number of real blocks 2105 inside all corresponding real page information 2100 and from the additional number of real blocks in package 2506 inside all corresponding flash package management information 2500.

Step 8009: The execution part 4300 determines whether or not there is a real page capable of being released from the virtual page by the above-mentioned received write same command. In a case where there is not, this processing flow ends.

Step 8010: The processing of this Step releases the real page from the virtual page. The execution part 4300 executes (a) through (e):
(a) Registers the real page information 2100 corresponding to the releasable real page in the queue of the empty physical page information management pointer 2200;
(b) Calculates the number of releasable real pages for each flash package group 280 constituting the basis for the releasable real page;
(c) Subtracts the value calculated for each package group 280 from the number of empty real pages 2304 inside the corresponding package group information 2300;
(d) Sets the real page pointer 2004 inside the logical volume information 2000 to the NULL value; and
(e) Sets the pattern data appended to the write same command in the format information 2005.

Consequently, the storage controller 200 is able to recognize that the pattern data included in the format information 2005 is stored in the virtual page related to the write-specified area.

Figure 24:
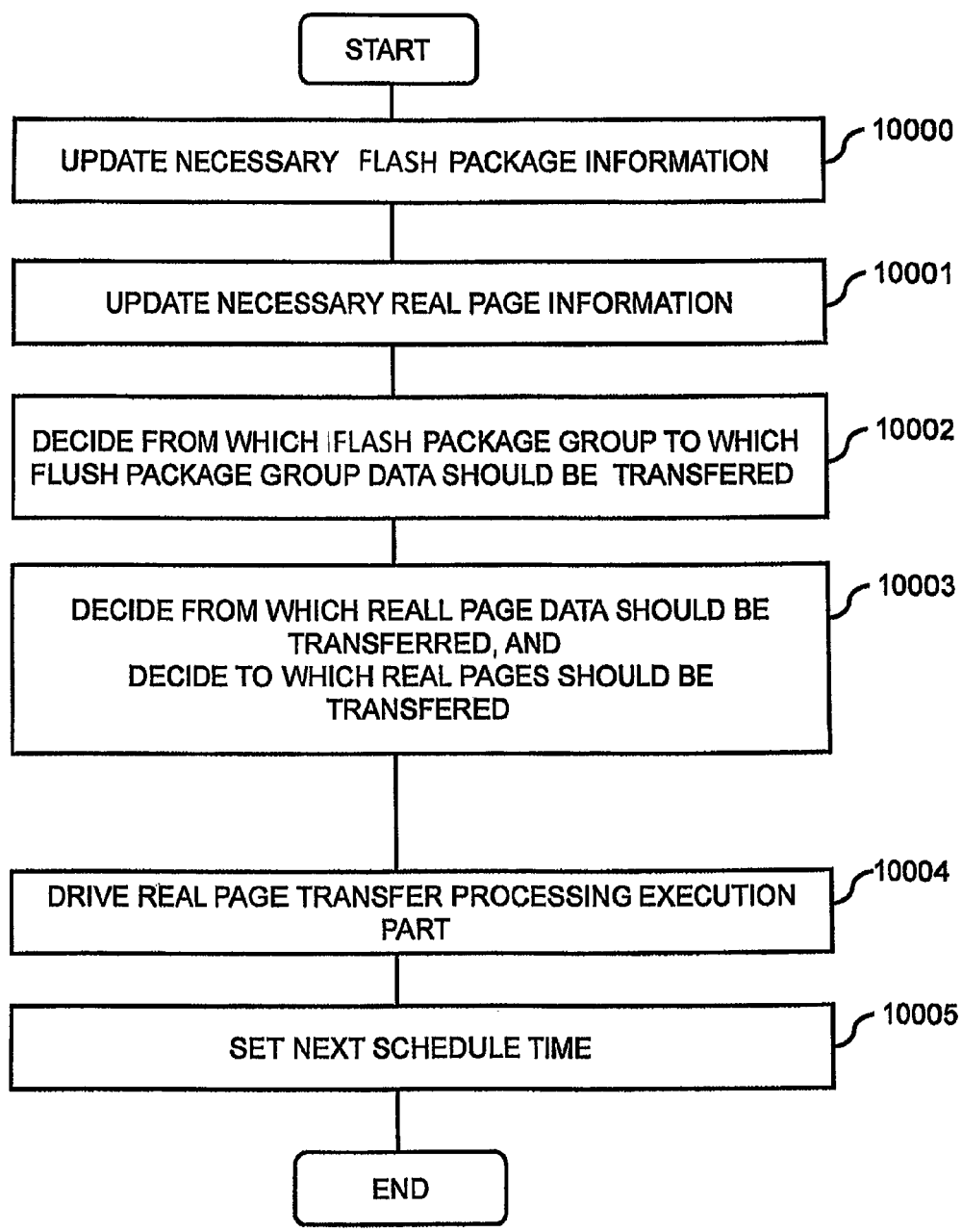
FIG. 24 is a diagram showing the flow of processing of a page transfer schedule part 4400.

FIG. 24 shows the flow of processing of the page transfer schedule part 4400.

The page transfer schedule part 4400 commences execution when the timer 240 reaches the next schedule time 2702.

Step 10000: The schedule part 4400 executes (a) through (e) below for each flash package 230:
(a) Adds a value obtained by multiplying the value of (the next schedule time 2702—the latest schedule time 2701) by the number of allocated real blocks in package 2505 to the cumulative period of allocated real blocks in package 2507;
(b) Adds the additional period of allocated blocks in package 2509 to the cumulative period of allocated real blocks in package 2507;
(c) Sets the additional period of allocated blocks in package 2509 to 0;
(d) Adds the additional number of real blocks in package 2506 to the number of allocated real blocks in package 2505; and
(e) Sets the additional number of real blocks in package 2506 to 0.

The allocation time of the real block allocated subsequent to the latest schedule time 2701 may be reflected (added) in accordance with (a) and (b). This is because the value of (the next schedule time 2702—the real block allocation time) has been added to the additional period of allocated blocks in package 2509 for each real block allocated subsequent to the latest schedule time 2701, in relevant flush package.

Step 10001: The schedule part 4400 executes (a) through (e) below for each real page:
(a) Adds a value obtained by multiplying the value of (the next schedule time 2702—the latest schedule time 2701) by the number of allocated real blocks 2104 to the cumulative period of allocated real blocks 2106;
(b) Adds the additional period of allocated real blocks 2108 to the cumulative period of allocated real blocks 2106;
(c) Sets the additional period of allocated real blocks 2108 to 0;
(d) Adds the additional number of real blocks 2105 to the number of allocated real blocks 2104; and
(e) Sets the additional number of real blocks 2105 to 0.

The allocation time of the real block allocated subsequent to the latest schedule time 2701 may be reflected (added) in accordance with (a) and (b). This is because the value of (the next schedule time 2702—the real block allocation time) has been added to the additional period of allocated real blocks 2108 for each real block allocated subsequent to the latest schedule time 2701, in relevant flush package.

Step 10002: The schedule part 4400 executes (a) through (d) below for each flash package 230:
(a) Divides the cumulative number of deleted blocks in package 2508 by the cumulative period of allocated real blocks in package 2507;
(b) Divides the number of allocated real blocks in package 2505 by the number of allocatable blocks in package 2504;
(c) Determines the transfer-source package group from a plurality of package groups 280; and
(d) Determines the transfer-destination package group from the plurality of package groups 280.

The value obtained in (a) constitutes the average number of deletions per unit of time (simply called the "average number of deletions" below) of the real blocks of the respective flash packages 230 in a case where the real page allocation was not changed. Furthermore, in a case where there is the cumulative write data amount in package 2510 instead of the cumulative number of deleted blocks in package 2508, the value of the cumulative number of deleted blocks in package 2508 is estimated from this write data amount 2510. Specifically, for example, a value calculated in accordance with the cumulative write data amount in package 2510/(the flash block capacity 3004—the package block capacity 3005) is the estimated value of the cumulative number of deleted blocks in package 2508. This is because initially (the flash block capacity 3004—the package block capacity 3005) constitutes an empty capacity, and a delete process is generated when this empty capacity ceases to exist.

The schedule part 4400 is able to determine a package group that has a short life expectancy as the transfer-source package group, and the "life expectancy" is calculated based on the average number of deletions and the deletion limitation times 2512. Specifically, for example, the life expectancy for one package group 230 is obtained by calculating {(the deletion limitation times 2512–the cumulative number of deleted blocks in package 2508)/the average number of deletions}+ the current time (the time acquired from the timer 240).

The value obtained in (b) constitutes the occupancy of the real blocks of the respective flash packages 230 in a case where the real page allocation was not changed.

In this embodiment, the transfer-source package group is determined on the basis of this average number of deletions and real block occupancy. Various cases will be explained below.

<Average Number of Deletions>

The schedule part 4400, for example, determines the package group having either a large average number of deletions or a short life expectancy as the transfer-source package group. Specifically, for example, the schedule part 4400 determines as the transfer-source package group a package group comprising a flash package that conforms to at least one of (A1) through (A3) below:
(A1) The average number of deletions exceeds a first predetermined threshold;
(A2) The life expectancy is shorter than the guarantee period end time 2511; and
(A3) The average number of deletions is greater than a fixed percentage compared to another flash package 230 (that is, there is a large average number of deletions imbalance between the flash packages 230).

The schedule part 4400, for example, determines as the transfer-destination package group a package group having either a small average number of deletions or a long life expectancy. Specifically, for example, the schedule part 4400 determines as the transfer-destination package group a package group comprising a flash package that conforms to at least one of (B1) through (B3) below:
(B1) The average number of deletions is not greater than a second predetermined threshold (the second threshold is not greater than the above-mentioned first threshold);
(B2) The life expectancy is longer than the guarantee period end time 2511; and
(B3) The average number of deletions is less than a fixed percentage compared to another flash package 230. More specifically, for example, the package group 280 comprising the flash package 230 of (B1) is determined as the transfer destination with respect to the transfer-source package group comprising the flash package 230 of the above-mentioned (A1), the package group 280 comprising the flash package 230 of (B2) is determined as the transfer destination with respect to the transfer-source package group comprising the flash package 230 of the above-mentioned (A2), and the package group 280 comprising the flash package 230 of (B3) is determined as the transfer destination with respect to the transfer-source package group comprising the flash package 230 of the above-mentioned (A3). The package group 280 that becomes the transfer destination at this time, for example, is determined based on either the difference of the average number of deletions or the difference in the life expectancy with the transfer source.

<Real Block Occupancy>

The schedule part 4400, for example, determines as the transfer-source package group a package group 280 comprising a flash package that conforms to at least one of (X1) and (X2) below:

(X1) The real block occupancy exceeds a third predetermined threshold (there is the possibility that the flash package 230 is full); and (X2) The number of allocatable blocks in package 2504 does not satisfy a certain criteria (for example, is not greater than a fifth predetermined threshold).

The schedule part 4400, for example, determines as the transfer-destination package group a package group comprising a flash package that conforms to at least one of (Y1) and (Y2) below:

(Y1) The average number of deletions is not greater than a fourth predetermined threshold (The fourth threshold is not greater than the above-mentioned third threshold); and (Y2) The number of allocatable blocks in package 2504 satisfies a certain criteria (for example, exceeds a sixth predetermined threshold (The sixth threshold is greater than the above-mentioned fifth threshold)).

Step 10003: The schedule part 4400 executes processes as follows:

(a) Determines the transfer-source page (the real page of the data transfer source) and the transfer-destination page (the real page of the data transfer destination) (That is, the schedule part 4400 determines the transfer-source page from a plurality of real pages based on the transfer-source package group, and, in addition, determines the transfer-destination page from a plurality of real pages based on the transfer-destination package group);

(b) Updates the waiting state for transferring 2111 corresponding to all the determined transfer-source pages to ON;

(c) Sets the real page information 2100 pointed to by the empty page information management pointer 2200 corresponding to the package group 280 that will allocate the transfer-destination page to the copy-destination transfer-to-real-page pointer 2110 of the transfer-source page;

(d) Updates the empty page information management pointer 2200 to show the page management information 2100, which is the next empty state.

The above-mentioned (c) and (d) are executed for all the determined transfer-source pages. Consequently, a transfer-source page and transfer-destination page pair are determined.

In (a), the schedule part 4400, for example, determines the transfer-source page based on at least one of the cumulative period of allocated real blocks 2106, cumulative number of deleted blocks 2107 (alternately, the write data amount 2112), and the number of allocated real blocks 2104 of the respective real block information 2100 belonging to the transfer-source package group 280. Specifically, for example, the transfer-source page determined by the schedule part 4400 is characterized by either (x) or (y) below:

(x) The cumulative number of deleted blocks 2107 of the determined transfer-source page is as close as possible to (preferably the same as) the difference between the cumulative number of deleted blocks 2107 of this transfer-source page and the cumulative number of deleted blocks 2107 of the transfer-destination page (the real page of the transfer destination); or (y) The real block occupancy of the determined transfer-source page is as close as possible to (preferably the same as) the difference between the real block occupancy of this transfer-source page and the real block occupancy of the transfer-destination page.

A transfer-source page having the characteristic feature of (x), for example, is determined in the case of a group in which the transfer-source package group corresponds to any of the above-mentioned (A1) through (A3). A transfer-source page having the characteristic feature of (y) is determined in the case of a group in which the transfer-source package group corresponds to either of the above-mentioned (B1) or (B2).

Step 10004: The schedule part 4400 starts up, from among the page transfer process execution part 4500 that exists for each package group 160, the page transfer process execution part 4500 corresponding to the package group 280 having at least one transfer-source page.

Step 10005: The schedule part 4400 executes (a) and (b) below:

(a) Copies the next schedule time 2701 to the latest schedule time 2701; and (b) Sets the subsequent schedule time period to the next schedule time 2701 (for example, updates the next schedule time 2701 to the time obtained by adding a predetermined time period to the current next schedule time 2701).

Figure 25:
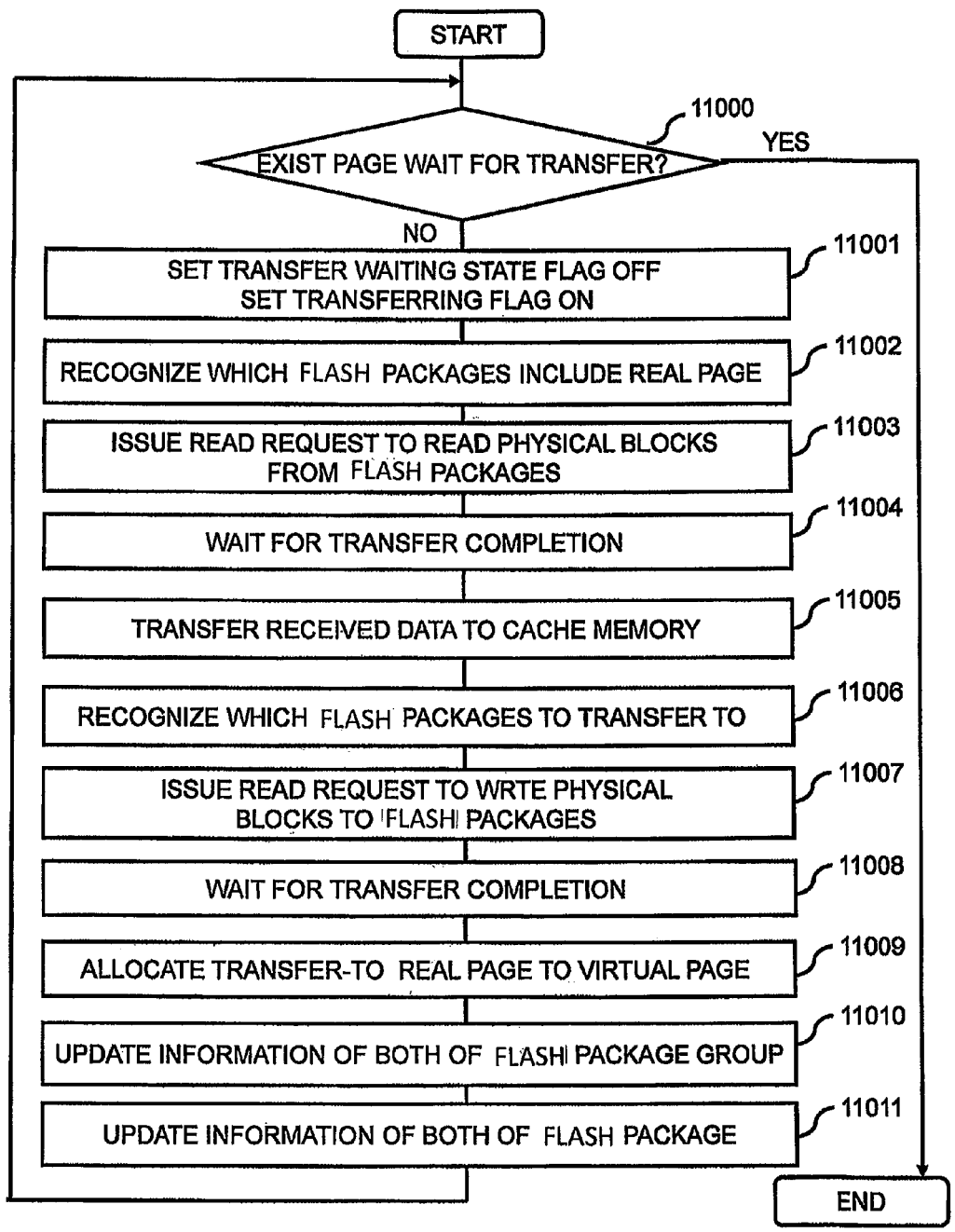
FIG. 25 is a diagram showing the flow of processing of a page transfer process execution part 4500.

FIG. 25 shows the flow of processing of the page transfer process execution part 4500.

The page transfer process execution part 4500 exists for each package group 280. Further, as described in Step 10004 of FIG. 24, the page transfer process execution part 4500 corresponding to the package group 280 having at least one transfer-source page is started up from the page transfer schedule part 4400.

Step 11000: The execution part 4500 retrieves real page information 2100 comprising the waiting state for transferring 2111 that is ON. The real page corresponding to this real page information 2100 is the transfer-source page. In a case where there is no real page information 2100 comprising the waiting state for transferring 2111 that is ON, this processing flow ends.

Step 11001: The execution part 4500 sets the waiting state for transferring 2111 inside the retrieved real page information 2100 to OFF, and sets the moving state flag 2109 to ON.

Step 11002: The execution part 4500 specifies a group of virtual blocks that is allocated to the transfer-source page. The package group information 2300 shown by the package group 2101 corresponding to the transfer-source page is the relevant package group information 2300. The flash package 230 corresponding to the flash package information 2500 shown by the flash package pointer 2305 inside this package group information 2300 is the flash package (transfer-source package) 230 constituting the basis of the transfer-source page. The execution part 4500, based on the real page address 2102 corresponding to the transfer-source page and the block capacity 2503 corresponding to the transfer-source package, specifies the group of virtual blocks targeted for transfer within the respective flash packages 230 for all the flash packages 230.

Step 11003: The execution part 4500 sends a request to the package controller 315 of each flash package 230 configuring the transfer-source group (the package group constituting the basis of the transfer-source page) 280 to read the data stored in the specified group of virtual blocks.

Step 11004: The execution part 4500 waits for completion reports from all the flash packages 230 of the request send destinations in Step 11003.

Step 11005: The execution part 4500 stores in the cache memory 210 the information included in the completion report from the flash package 230. Furthermore, this completion report comprises information denoting whether or not a real block has been allocated to each virtual block (read-source virtual block) specified in the request sent in Step 11003. In a case where the real block has been allocated to the read-source virtual block, the completion report comprises the following information (A) through (C):

(A) The data stored in the real block which has been allocated to the read-source virtual block;
(B) The time at which the real block (not limited to the currently allocated real block) was first allocated to the read-source virtual block during a state in which the real block was unallocated; and
(C) The number of deletions subsequent to the time of (D) for the real block allocated to the read-source virtual block.

Step 11006: The execution part 4500 specifies the group of virtual blocks allocated to the transfer-destination page. In this case, the real page information 2100 shown by the transfer-destination page pointer 2110 inside the real page information 2100 corresponding to the transfer-source page is the real page information 2100 corresponding to the transfer-destination page.

Step 11007: The execution part 4500 sends a write request for storing data in the specified virtual block (the write-destination virtual block) to the package controller 315 of each flash package 230 configuring the transfer-destination group (the package group constituting the basis of the transfer-destination page) 280. The information sent to each package controller 315 at this time is the information (information sent from the transfer-source package 230) that was stored in the cache memory 210 in Step 1105.

Step 11008: The execution part 4500 waits for completion reports from all the flash packages 230 of the write request sent destinations.

Step 11009: The execution part 4500 executes (a) through (c) below:
(a) Updates the transfer-source page to the empty page, and, in addition, allocates the transfer-destination page to the virtual page to which the transfer-source page had been allocated up until this point (Specifically, links the empty page management pointer 2200 to the real page information 2100 corresponding to the transfer-source page, and sets the real page pointer 2004, which has shown the transfer-source page up until this time, to show the real page information 2100 corresponding to the transfer-destination page);
(b) Copies the number of allocated real blocks 2104, the additional number of real blocks 2105, the cumulative period of allocated real blocks 2106, the cumulative number of deleted blocks 2107 (the write data amount 2112), and the additional period of allocated real blocks 2108 from among the real page information 2100 corresponding to the transfer-source page to the real page information 2100 corresponding to the transfer-destination page; and
(c) Clears the information 2104 through 2111 from the real page information 2100 corresponding to the transfer-source page.

Step 11010: The execution part 4500 updates all of the package group information 2300 corresponding to the transfer source and all of the package group information 2300 corresponding to the transfer destination. Specifically, the execution part 4500 subtracts the number (for example, 1) of transfer-source pages from the number of real pages 2303 inside the package group information 2300 corresponding to the transfer source, and adds the number of transfer-destination pages to the number of real pages 2303 inside the package group information 2300 corresponding to the transfer destination.

Step 11011: The execution part 4500 updates all of the flash package information 2500 corresponding to the transfer source, and all of the flash package information 2500 corresponding to the transfer destination. Specifically, the execution part 4500, for example, executes (a) and (b) below:
(a) Subtracts the respective values of the below-mentioned (U) through (Z) corresponding to the respective flash packages 230 of the real page information 2100 corresponding to the transfer-destination page from the respective values of the below-mentioned (A) through (F) inside the respective flash package information 2500 corresponding to the transfer source (that is, carries out (A)-(U), (B)-(V), (C)-(W), (D)-(X), (E)-(Y), and ((F)-(Z)));
(A) The number of allocated real blocks in package 2505,
(B) The additional number of real blocks in package 2506,
(C) The cumulative period of allocated real blocks in package 2507,
(D) The cumulative number of deleted blocks in package 2508,
(E) The additional period of allocated blocks in package 2509,
((F) The cumulative write data amount in package 2510)),
(U) The number of allocated real blocks 2104,
(V) The additional number of real blocks 2105,
(W) The cumulative period of allocated real blocks 2106,
(X) The cumulative number of deleted blocks 2107,
(Y) The additional period of allocated real blocks 2108,
((Z)) The write data amount 2112)).

(There are cases in which the cumulative write data amount in package 2510 and the write data amount 2112 do not exist, and in such cases, processing for subtracting the write data amount 2112 from the cumulative write data amount in package 2510 is not executed.)

(b) Adds the respective values of the below-mentioned (O) through (T) corresponding to the respective flash packages 230 of the real page information 2100 corresponding to the transfer-destination page to the respective values of the below-mentioned (G) through (L) inside the respective flash package information 2500 corresponding to the transfer source (that is, carries out (G)+(O), (H)+(P), (I)+(Q), (J)+(R), (K)+(S) and ((L)+(T)));
(G) The number of allocated real blocks in package 2505,
(H) The additional number of real blocks in package 2506,
(I) The cumulative period of allocated real blocks in package 2507,
(J) The cumulative number of deleted blocks in package 2508,
(K) The additional period of allocated blocks in package 2509,
((L) The cumulative write data amount in package 2510)),
(O) The number of allocated real blocks 2104,
(P) The additional number of real blocks 2105,
(Q) The cumulative period of allocated real blocks 2106,
(R) The cumulative number of deleted blocks 2107,
(S) The additional period of allocated real blocks 2108,
((T)) The write data amount 2112)).

(There are cases in which the cumulative write data amount in package 2510 and the write data amount 2112 do not exist, and in such cases, processing for subtracting the write data amount 2112 from the cumulative write data amount in package 2510 is not executed.)

Thereafter, the execution part 4500 returns to Step 11000.

The cumulative period of allocation of (a) may be managed more simply than in this embodiment. For example, even in a case where there is a change in the number of allocated real blocks between the carrying out of the higher-level long life control of the previous time and the carrying out of the higher-level long life control of this time, this change may be arbitrarily ignored.

The storage controller 200, based on the information received from the flash package 230, for example, is able to specify the number of deleted real blocks and the period of allocated real blocks, and is able to reflect the specified number of deletions and period of allocation in the cumulative period of allocation and overall number deletions for each flash package.

Next, an explanation of the operations executed by the flash package 230 will be given. The operation of the flash package 230 is executed by the package controller 315 (typically, the package processor 310), and the program is stored inside the package memory 320.

Figure 26:
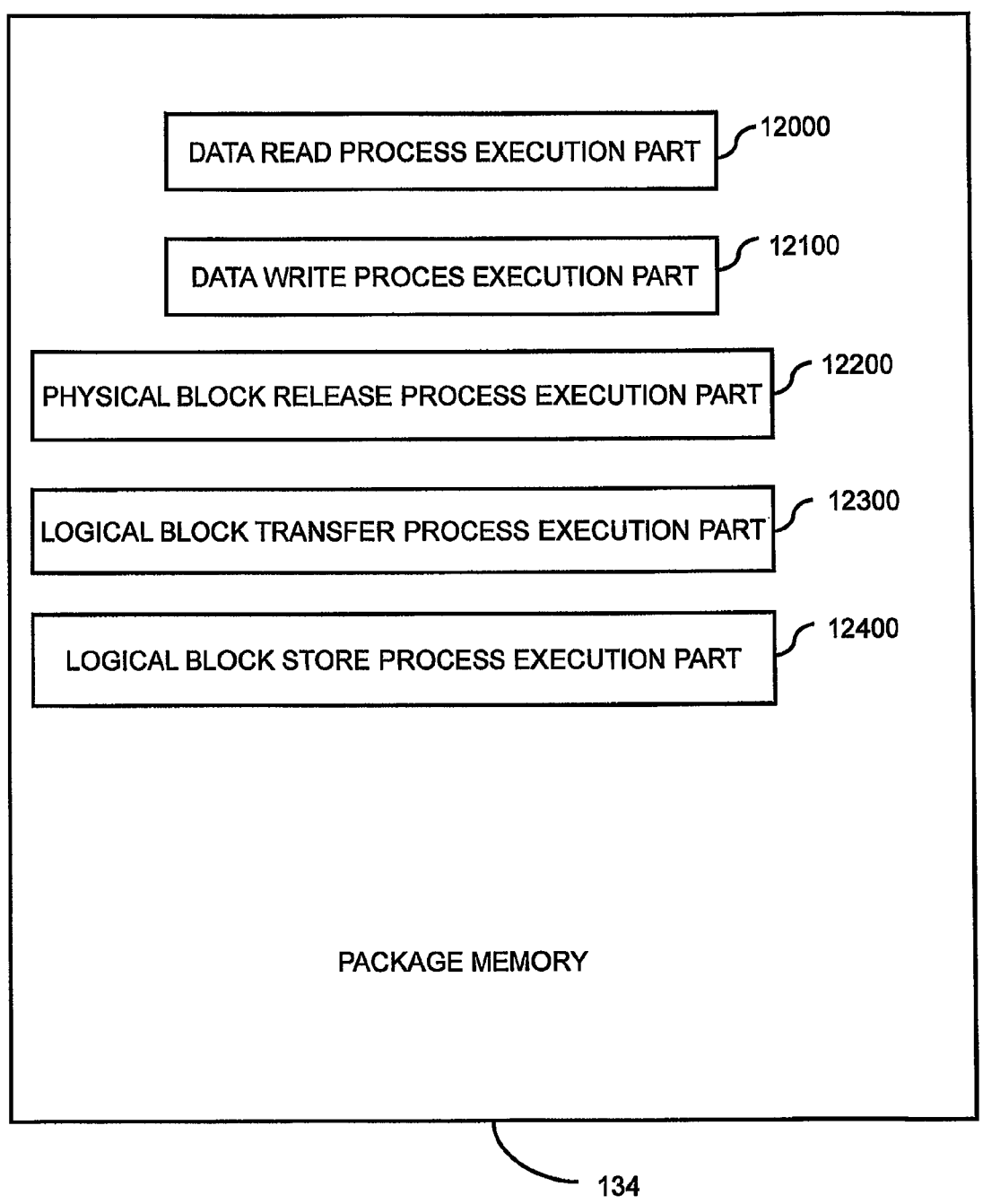
FIG. 26 is a diagram showing programs stored in the package memory 320.

FIG. 26 shows the programs stored in the package memory 320.

Figure 27:
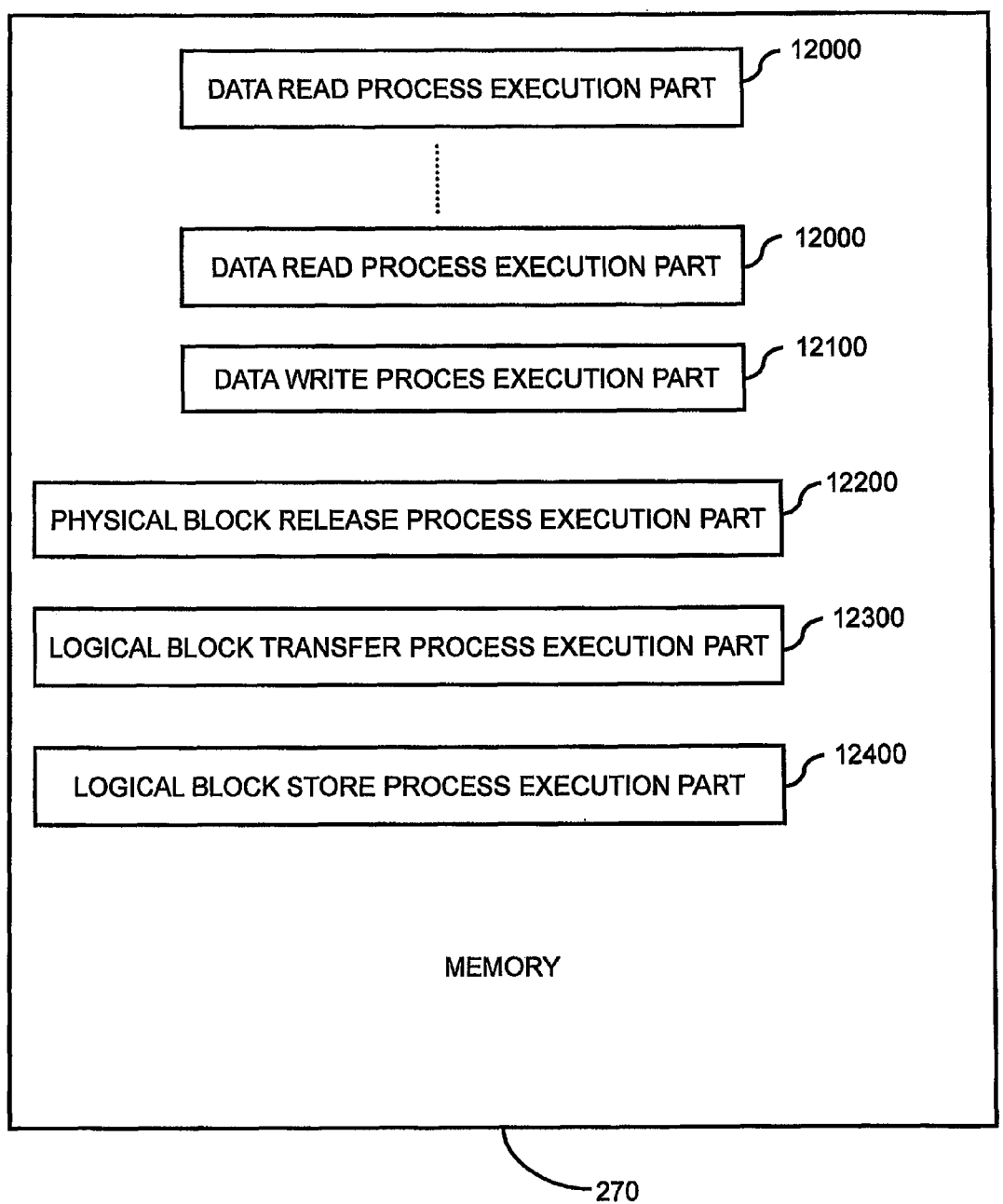
FIG. 27 is a diagram showing an example in which lower-level programs have been stored in the memory 270.

The programs, for example, include a data read process execution part 12000, a data write process execution part 12100, a real block release process execution part 12200, a virtual block transfer process execution part 12300, and a virtual block store process execution part 12400. These programs are for realizing the lower-level wear-leveling control and the lower-level capacity virtualization function. As described above, in this embodiment, the flash package 230 realizes the lower-level wear-leveling control and the lower-level capacity virtualization function, but these may also be realized by the storage controller 200. In accordance with this, as shown in FIG. 27, substantially the same programs as the programs shown in FIG. 26 are stored in the common memory 220. In the configuration shown in FIG. 27, since the storage controller 200 executes this information, slight differences occur in the respective programs shown in FIG. 26.

The processes explained below by giving the programs 12000, 12100, 12200, 12300 and 12400 inside the package memory 320 as the subjects are actually carried out by the package processor 310.

Figure 28:
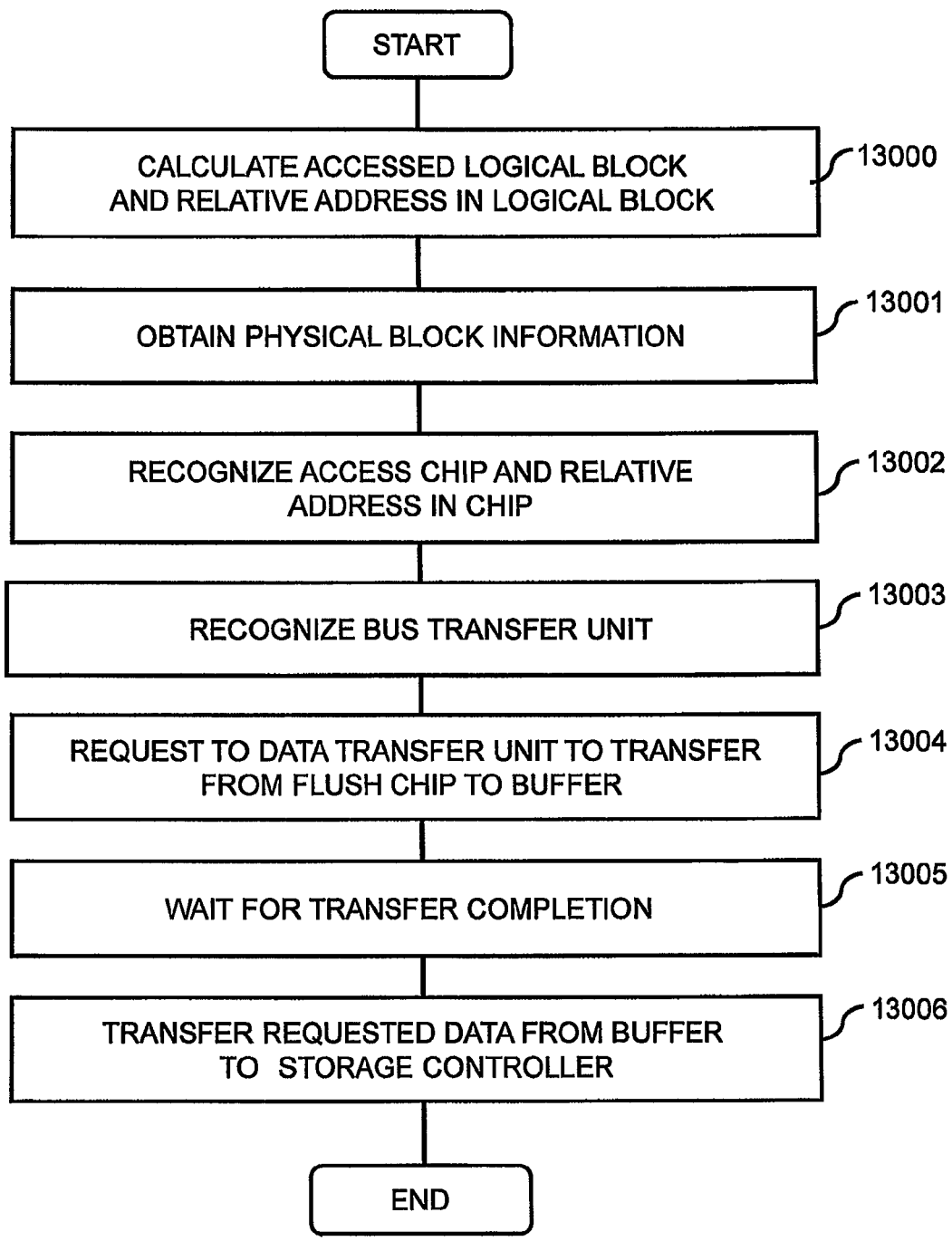
FIG. 28 is a diagram showing the flow of processing for a data read process execution part 12000.

FIG. 28 shows the flow of processing of the data read process execution part 12000.

The data read process execution part 12000 is executed when a read request is received from the storage controller 200. In the following explanation, an example will be given in which data is readout from a single virtual block, but the processing flow of FIG. 28 is also valid in a case where data is read out from a plurality of virtual blocks.

Step 13000: The execution part 12000, based on an address specified in the received read request and the package block capacity 3005, calculates the virtual block constituting the read source and the relative address inside the read-source virtual block.

Step 13001: The execution part 12000 acquires the real block information 3300 corresponding to the real block (read-source real block) allocated to the read-source virtual block from the real block information pointer 3202 inside the virtual block information 3200 corresponding to the read-source virtual block.

Step 13002: The execution part 12000 executes (a) and (b) below:
(a) Specifies from the real block ID 3301 inside the acquired real block information 3300 which address of which flash chip 300 is the first address of the real block corresponding to this ID 3301; and
(b) Calculates, based on the address specified in (a), the additional write data address information 3305 inside the above-mentioned acquired virtual block information 3300, and the relative address inside the real block targeted for access in the read request obtained in Step 13000, which relevant address of the relevant flash chip 300 that the real block specified from this read request is stored in.

Step 13003: The execution part 12000 references the chip information 3100 corresponding to the flash chip 300 in which the read-targeted data is stored, identifies the package bus 340 to which this flash chip 300 is connected, and recognizes the corresponding package bus transfer unit 350.

Step 13004: The execution part 12000 requests the package bus transfer unit 350 recognized in Step 13003 to transfer the data from the address (the real block address) of the flash chip 300 to the buffer 330.

Step 13005: The execution part 12000 waits for the transfer to be completed.

Step 13006: The execution part 12000 sends the data that has been stored in the buffer 330 (the data targeted in the read request from the storage controller 200) to the storage controller 200.

Figure 29:
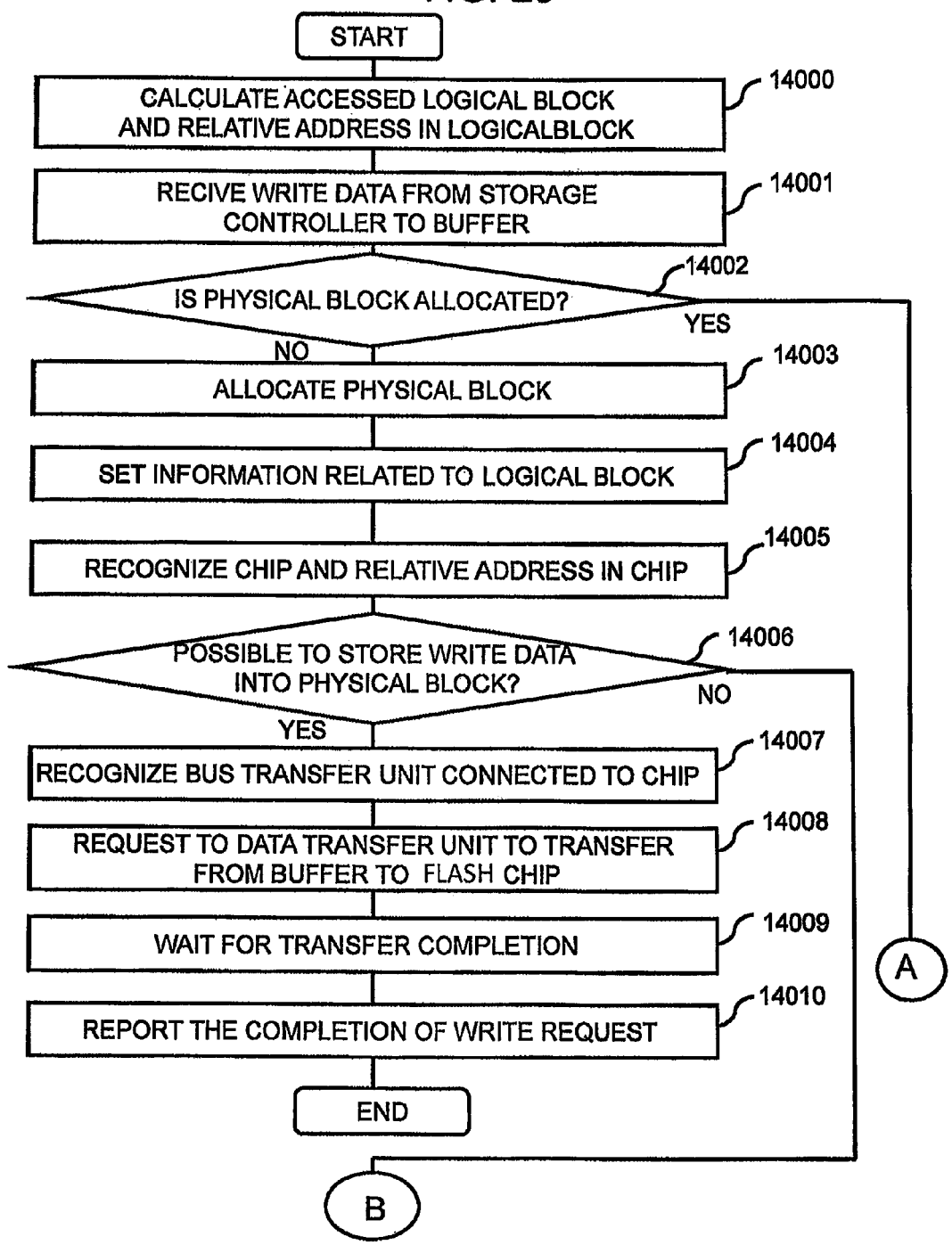
FIG. 29 is a diagram showing one part of the flow of processing for a data write process execution part 12100.
Figure 30:
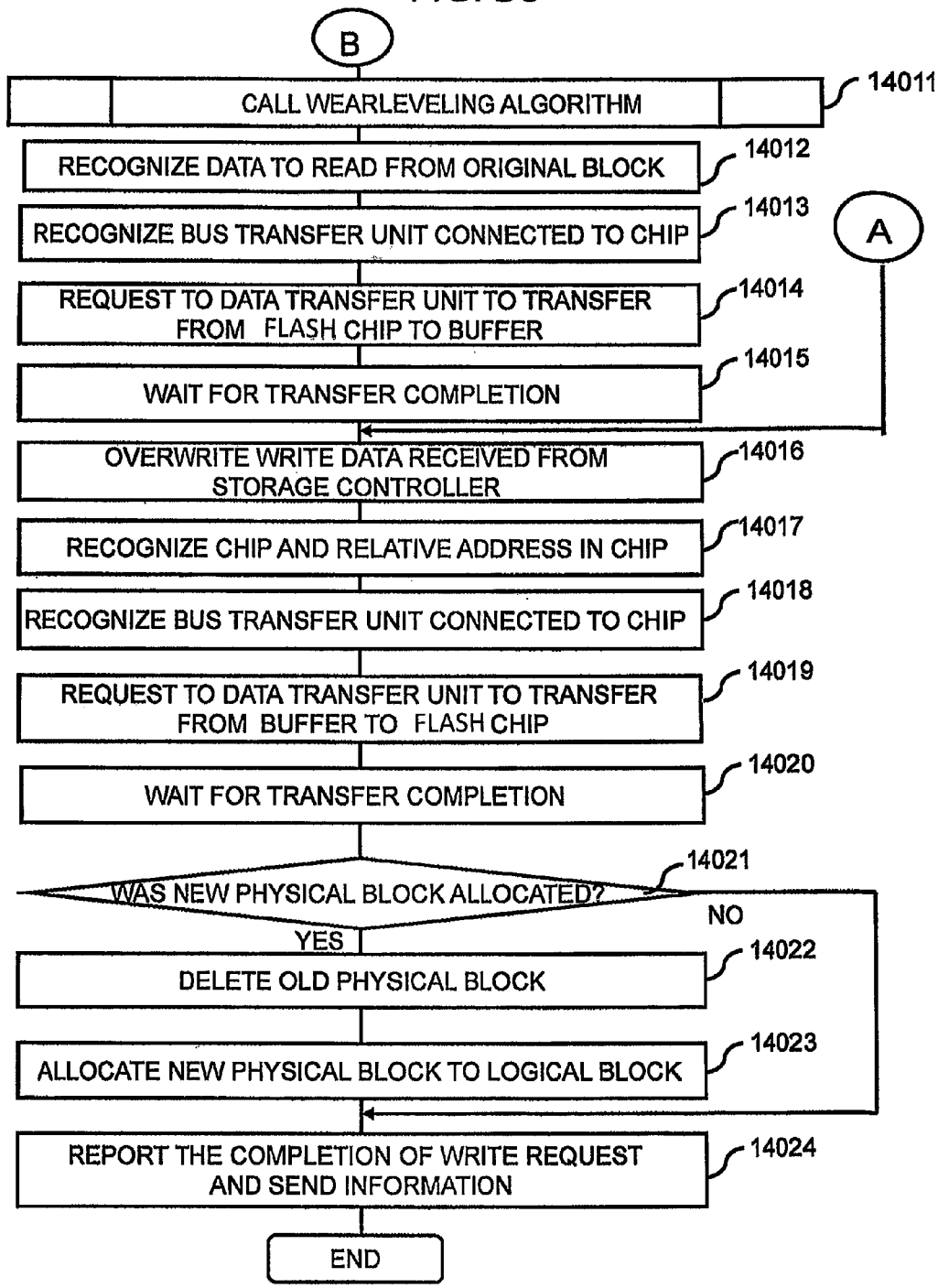
FIG. 30 is a diagram showing the remainder of the flow of processing for the data write process execution part 12100.

FIGS. 29 and 30 show the flow of processing of the data write process execution part 12100.

The data write process execution part 12100 is executed when the flash package 230 receives a write request from the storage controller 200. In the explanation that follows, an example is given in which data is written to a single virtual block, but the flow of processing of FIGS. 29 and 30 is also valid in a case where data is written to a plurality of virtual blocks.

Step 14000: Execution part 12100 calculates the write-destination virtual block and the relative address of this virtual block based on the address specified in the received write request and the package block capacity 3005.

Step 14001: The execution part 12100 stores the write-targeted data appended to the above-mentioned write request in the buffer 330.

Step 14002: The execution part 12100 references the real block information pointer 3202 inside the virtual block information 3200 corresponding to the write-destination virtual block. The execution part 12100 determines whether or not the value of this pointer 3202 is the NULL value, that is, whether or not a real block has been allocated. In a case where a real block has been allocated (in a case where the result of this determination is affirmative), the execution part 12100 jumps to Step 14005.

Step 14003: This step is for allocating an empty block to the write-destination virtual block. Furthermore, it is supposed that the empty block allocated here has been deleted and is not storing data. The execution part 12100 executes (a) through (e) below:
(a) References the number of empty blocks in chip 3103 of the respective chip information 3100, and determines which flash chip 300 empty block is to be allocated;
(b) References the empty block information management pointer 3400 corresponding to the flash chip 300 having the determined empty block, and performs updating so that the physical block information pointer 3302 corresponding to the write-destination virtual block shows the start of the real block information 3300 (This results in the real block being allocated to the write-destination virtual block);
(c) Performs updating so that the empty real block information management pointer 3400 shows the next real block information 3300 (the real block information 3300 shown by the empty block pointer 3302 inside the real block information 3300 corresponding to the real block allocated to the virtual block);

(d) Sets the empty block pointer 3302 inside the real block information 3300 corresponding to the real block allocated to the write-destination virtual block to the NULL value; and (e) Subtracts the number of allocated real blocks (for example, 1) from the value of the number of empty blocks in chip 3103 inside the chip information 3100 corresponding to this allocated real block.

Step 14004: The execution part 12100 executes (a) through (c) below:

(a) Sets the time information furnished in the above-mentioned write request in the virtual page allocation time 3203 inside the virtual block information 3200 corresponding to the write-destination virtual block;

(b) Sets the number of virtual block deletions 3204 corresponding to the write-destination virtual block to 0; and (c) Creates an initial pattern (the pattern signifying that the write-targeted data (the data appended to the write request in the explanation of FIGS. 29 and 30) has not been received from the storage controller 200) the size of the package block capacity 3005 in the buffer 330. Besides the write-targeted data, this initial pattern is written to the real block allocated to the write-destination virtual block (called the "write-destination real block" in the explanation of FIGS. 29 and 30). To execute this, the execution part 12100 jumps to Step 14016 of FIG. 30.

Step 14005: The execution part 12100 references the real block ID 3301 inside the real block information 3300 corresponding to the write-destination real block, and specifies which address of which flash chip 300 is the head address of the write-destination real block.

Step 14006: The execution part 12100, based on the empty capacity in real block 3304 corresponding to the write-destination real block and the length of the write-targeted data, determines whether or not the write-targeted data is able to be written to the empty capacity of the write-destination real block. In a case where this data is not able to be written (a case in which the result of this determination is negative), the execution part 12100 jumps to Step 14011 of FIG. 30.

Step 14007: The execution part 12100 references the chip information 3100 corresponding to the flash chip 300 having the write-destination real block, identifies the package bus 340 to which this flash chip 300 is connected, and recognizes the corresponding package bus transfer unit 350.

Step 14008: The execution part 12100 requests the package bus transfer unit 350 recognized in Step 14007 to write the write-targeted data from the buffer 330 to the address of the flash chip 300.

Step 14009: The execution part 12100 waits for the write to be completed.

Step 14010: The execution part 12100 executes (a) through (c) below:

(a) Subtracts the amount of write-targeted data from the empty capacity in real block 3304 corresponding to the write-destination real block;

(b) Adds the relative address inside the write-destination real block and the length of the write-targeted data to the additional write data address information 3305 corresponding to the write-destination real block; and (c) Sends the completion report denoting that the write request has been completed to the storage controller 200.

Step 14011: This Step is executed when the length of the write-targeted data is greater than the empty capacity of the write-destination real block. In accordance with this, the write-targeted data is not able to be stored in the write-destination real block without executing the delete process. In this embodiment, in order to minimize the imbalance of the number of deleted real blocks, the write-targeted data is stored in another real block. Therefore, in this Step, the execution part 12100 calls a lower-level wear-leveling algorithm. The execution part 12100 receives the address of the real block information 3300 corresponding to the real block in which the write-targeted data is to be stored from the lower-level wear-leveling algorithm. The lower-level wear-leveling control selects a new real block so as to minimize the imbalance of the number of real block deletions. This real block, for example, is in the deleted state, a state in which data is able to be written in directly. Furthermore, since the lower-level wear-leveling technology may use a known technique like that of Patent Literature 1, this technology will not be explained in detail here.

Step 14012: The execution part 12100 must write into the newly specified real block not only the write-targeted data, but also all of the data (data the size of the package block capacity 3005) inside the real block originally allocated to the write-destination virtual block (called the "original real block) in the explanation of FIGS. 29 and 30). For this reason, the execution part 12100 references the addition write data address information 3205 corresponding to the original real block, and creates a request to the flash chip 300 for storing data of a capacity the size of the package block capacity 3005 of the original real block in the buffer 330 in real block address order.

Step 14013: The execution part 12100 references the chip information 3100 corresponding to the flash chip 300 recognized in Step 14005, identifies the package bus 340 to which this flash chip 300 is connected, and recognizes the corresponding package bus transfer unit 350.

Step 14014: The execution part 12100 requests the package bus transfer unit 350 recognized in Step 14007 to read the data into the buffer 330 from the address of the flash chip 300 in accordance with the request created in Step 140011.

Step 14015: The execution part 12100 waits for the write to the buffer 330 to be completed.

Step 14016: The execution part 12100 writes the package block capacity 3005-size data to the newly allocated real block. Specifically, in this Step, the execution part 12100 writes the write-targeted data received from the storage controller 200 over the package block capacity 3005-size data (initial pattern data that was stored in Step 14004) stored in the buffer 330 in Step 14004 or Step 14014 starting at the relative address recognized in Step 14000.

Step 14017: Next, the execution part 12100 references the real block ID 3301 inside the real block information 3300 corresponding to the newly allocated real block, and specifies the address in the flash chip 300 to which the newly allocated real block is to be stored.

Step 14018: The execution part 12100 references the chip information 3100 corresponding to the flash chip 300 in which the write-targeted data recognized in Step 14017 is to be stored, identifies the package bus 340 to which this flash chip 300 is connected, and recognizes the corresponding package bus transfer unit 350.

Step 14019: The execution part 12100 requests the package bus transfer unit 350 recognized in Step 14018 to write the package block capacity 3005-size data from the buffer 330 to a certain address in a certain flash chip 300.

Step 14020: The execution part 12100 waits for the write from the buffer 330 to be completed.

Step 14021: The execution part 12100 carries out Steps 14022 and 14023 in a case where a new real block has been allocated because the write-targeted data is unable to be stored in the original real block. When this is not the case, the execution part 12100 jumps to Step 14024.

Step 14022: This Step is for the execution part 12100 to set the real block to the empty state. The execution part 12100 executes (a) through (f) below:
(a) Carries out a delete process with respect to the original real block;
(b) Adds 1 to the value of the number of real block deletions corresponding to the original real block;
(c) In a case where the number of real block deletions 3306 exceeds the upper limit value, sets the real block error flag 3303 corresponding to the original real block to ON, and stores the fact that this limit was exceeded in the real block that transitioned to an error state due to the above-mentioned write request;
(d) Adds 1 to the value of the number of virtual block deletions 3204 corresponding to the virtual block to which the original real block was allocated;
(e) Sets the address of the real block information 3300 shown by the empty real block information management pointer 3400 in the empty block pointer 3302 corresponding to the original real block;
(f) Sets the address of the real block information 3300 corresponding to the original real block in the empty real block information management pointer 3400.

Step 14023: This Step is for allocating a new real block to the write-destination virtual block. Specifically, the execution part 12100 updates the real block information pointer 3202 corresponding to the write-destination virtual block to a value showing real block information 3300 corresponding to a new real block.

Step 14024: The execution part 12100 sends a write completion report to the storage controller 200. In a case where there exists a real block for which the delete process was performed in line with the write request from the storage controller 200, this completion report, for example, will include the number of these real blocks. Further, in a case where there exists a real block which transitioned to an error state in line with this write request, this completion report will include the number of these real blocks. In Step 14004, in a case where a real block was newly allocated to the virtual block in a state in which a real block had not been allocated, the number of real blocks allocated as well as the time information included in the write request are included in the completion report to the storage controller 200.

Figure 31:
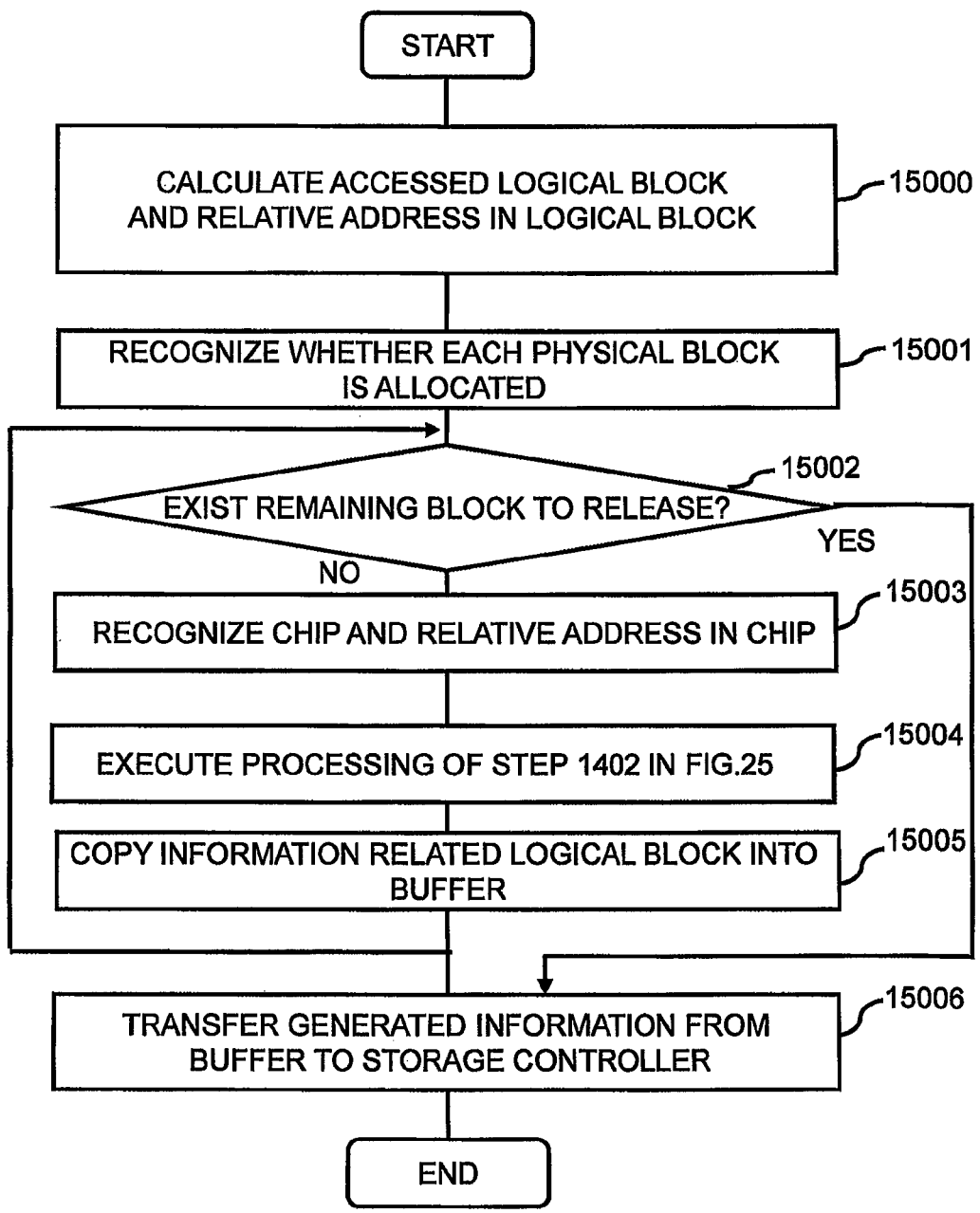
FIG. 31 is a diagram showing the flow of processing for a real block release process execution part 12200.

FIG. 31 shows the flow of processing of the real block release process execution part 12200.

The real block release process execution part 12200 is executed when a release request for releasing a range of areas (a group of real blocks) is received from the storage controller 200.

Step 15000: The execution part 12200 calculates the set of virtual blocks for which release was requested based on the range of areas specified in the release request and the package block capacity 3005.

Step 15001: The execution part 12200 references the real block information pointer 3202 of the virtual block information 3200 corresponding to the respective virtual blocks with respect to the group of virtual blocks specified in Step 15000, and determines whether or not the real block has been allocated. At this point, the execution part 12200 creates information showing whether or not a real block has been allocated to each virtual block for all specified virtual blocks. The execution part 12200 writes the created information to the buffer 330 so it can be sent to the storage controller 200.

Step 15002: The execution part 12200 searches for the virtual block to which the real block is allocated from among the group of virtual blocks specified in Step 15000. In a case where no such virtual block exists, the execution part 12200 jumps to Step 15006.

Step 15003: The execution part 12200 carries out the release process for the real block corresponding to the real block information 3300 shown by the real block information pointer 3202 corresponding to the retrieved virtual block. For this reason, the execution part 12200 analyzes the real block ID 3301 inside this real block information 3300, and specifies the address in the flash chip 1302 where the real block to be released exists.

Step 15004: This Step is for setting the real block to the empty state. The targeted real block is the real block specified in Step 15003, but the contents of the processing are the same as Step 14022 of FIG. 30. For this reason, an explanation will be omitted here.

Step 15005: The execution part 12200 copies to the buffer 330 the virtual block allocation time 3203 and the number of virtual block deletions 3204 corresponding to the virtual block (the empty virtual block) allocated to the real block that has been set to the empty state. This is so this information 3203 and 3204 can be sent to the storage controller 200. After the copy, the execution part 12200 initializes the virtual page allocation time 3203 and the number of virtual block deletions 3204 inside the virtual block information 2000 corresponding to the empty virtual block. Thereafter, the execution part 12300 returns to Step 15002.

Step 15006: The execution part 12200 sends to the storage controller 200 the release completion report including the information of (A) and (B) below:
(A) Information showing whether or not the real block has been allocated to each virtual block belonging to the range of areas specified in the release request; and
(B) The virtual block allocation time 3203 and the number of virtual block deletions 3204 for each virtual block to which the released real block was allocated.

Figure 32:
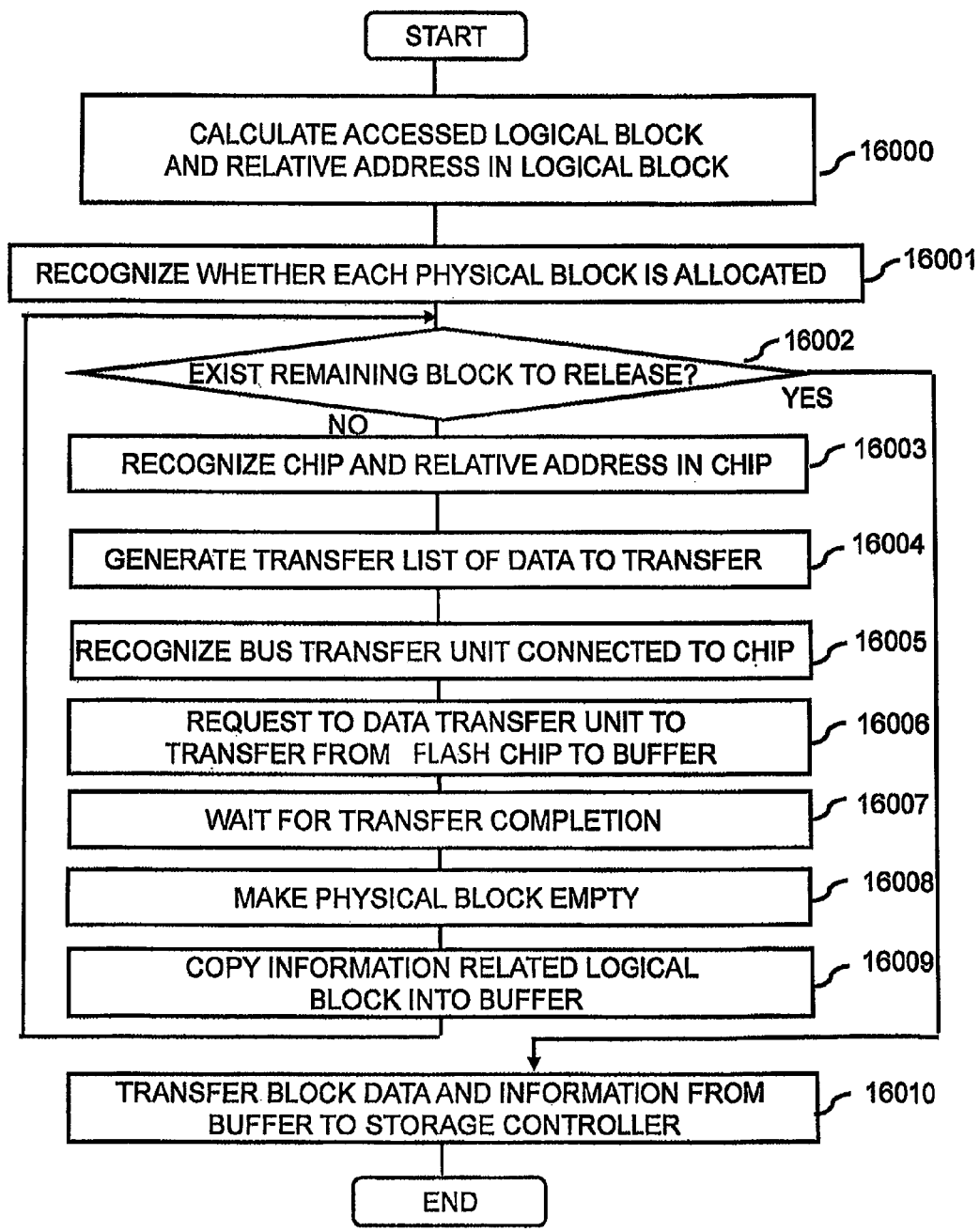
FIG. 32 is a diagram showing the flow of processing for a virtual block transfer process execution part 12300.

FIG. 32 shows the flow of processing of the virtual block transfer process execution part 12300.

The virtual block transfer process execution part 12300 is executed when a request to send to the storage controller 200 the data stored in a specified set of virtual blocks is received from the storage controller 200. This differs from FIG. 31 in that since the real block that had stored the transferred data is released, the data stored in the real block is sent to the storage controller 200. For this reason, FIG. 32 will be explained while citing the Steps of the processing flow of FIG. 31.

Step 16000: This is the same as Step 15000. The execution part 12300 specifies the set of virtual blocks for which release was requested.

Step 16001: This is the same as in Step 15001. The execution part 12300 creates information showing whether or not a real block has been allocated for all the specified virtual blocks, and copies this information to the buffer 330.

Step 16002: This is the same as in Step 15002. The execution part 12300 searches for a virtual block to which a real block is allocated. If there is no virtual block to which a real block has been allocated, the execution part 12300 jumps to Step 16010.

Step 16003: This is basically the same as Step 15003. For this reason, the execution part 12300 analyzes the real block ID 3301 corresponding to the transfer-source real block, and specifies from which address of which flash chip 300 the transfer-source real block exists.

Step 16004: The execution part 12300 creates an address list based on the start address of the real block information 3300 corresponding to the transfer-source real block, the additional write data address information 3305 inside this information 3300, and the storage-destination address obtained in Step 16003. This address list is the address list for the transfer-source real block, and is a list of addresses in which the package block capacity 3005-size data to be sent to the storage controller 200 is stored.

Step 16005: The execution part 12300 references the chip information 3100 corresponding to the flash chip 300 having the transfer-source real block, identifies the package bus 340 to which this flash chip 300 is connected, and recognizes the corresponding package bus transfer unit 350.

Step 16006: The execution part 12300 delivers the address list in the flash chip 300 that has the transfer-source real block to the package bus transfer unit 350 recognized in Step 16005, and, in addition, requests that the data be transferred to the buffer 330 in accordance with this address list.

Step 16007: The execution part 12300 waits for the transfer to be completed.

Step 16008: This Step is for setting the real block to the empty state. The target real block is the transfer-source real block, but the content of the processing is the same as that of Step 14022 of FIG. 30. For this reason, an explanation will be omitted here.

Step 16009: This is the same as Step 15005. The execution part 12300 copies to the buffer 330 the virtual block allocation time 3203 and the number of virtual block deletions 3204 corresponding to the virtual block (the empty virtual block) allocated to the real block that has been set to the empty state. After the copy, the execution part 12300 initializes the virtual page allocation time 3203 and the number of virtual block deletions 3204 inside the virtual block information 2000 corresponding to the empty virtual block. Thereafter, the execution part 12300 returns to Step 16002.

Step 16010: The execution part 12300 sends the data stored in the buffer 330 to the storage controller 200. Specifically, for example, the execution part 12300 sends the storage controller 200 a completion report including the information of the below (A) through (C):

(A) Information showing whether or not a real page has been allocated to each transfer-source virtual block;
(B) The virtual page allocation time 3203 and the number of virtual block deletions 3204 for each virtual block to which the released real block was allocated; and
(C) The data stored in the buffer 330 (the data inside the real block allocated to the transfer-source virtual block).

Figure 33:
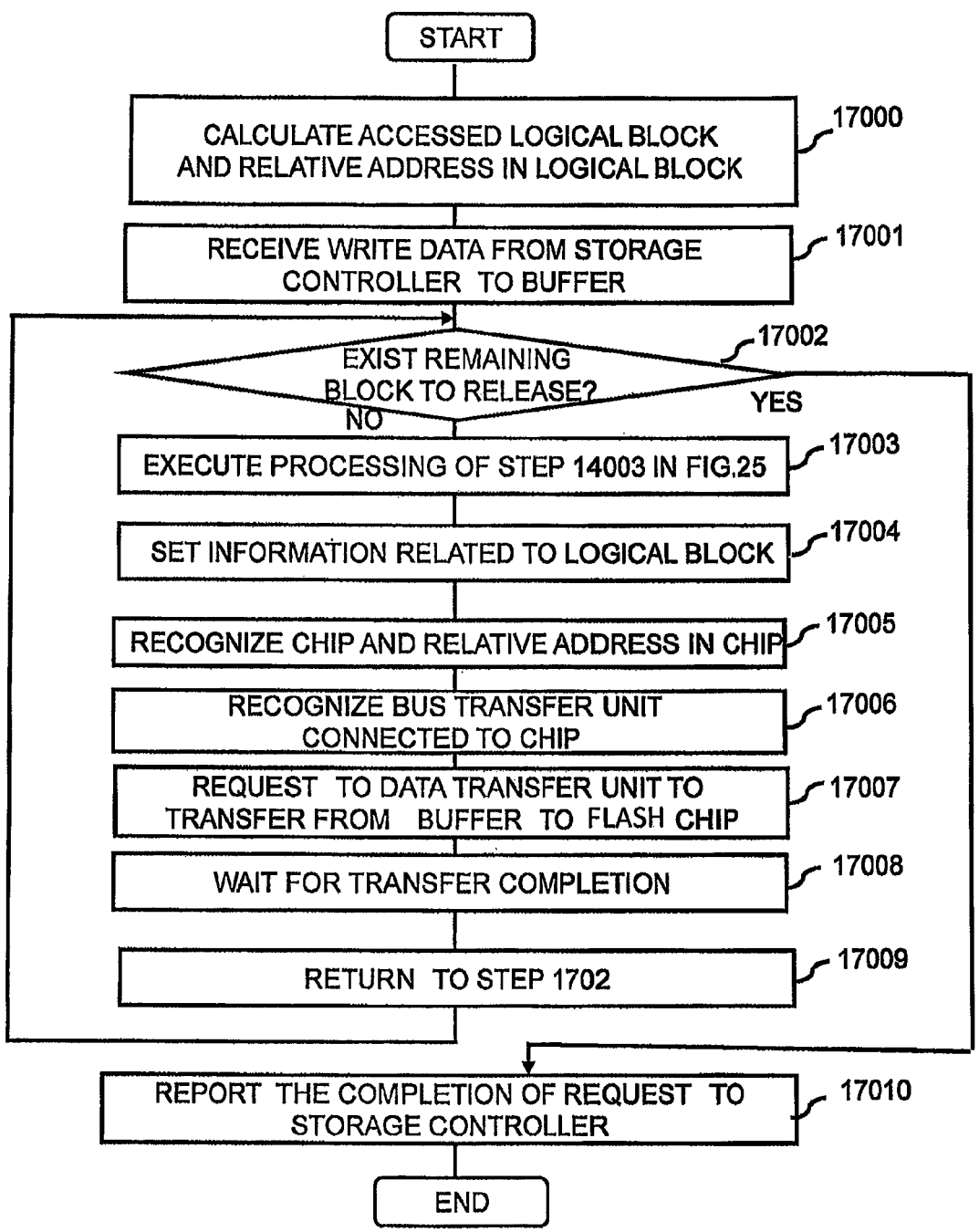
FIG. 33 is a diagram showing the flow of processing for a virtual block store process execution part 12400.

FIG. 33 shows the processing flow of the virtual block store process execution part 12400.

The virtual block store process execution part 12400 respectively allocates real blocks to a set of specified virtual blocks, and, in addition, is executed when a write request to store data sent from the storage controller 200 has been received. The flow of data is the opposite of that of the virtual block transfer process execution part 12300, but since the two parts 12300 and 12400 have many points in common, the explanation will be given while citing the respective Steps of the processing flow of FIG. 32.

Step 17000: This is the same as Step 16000. The execution part 12400 calculates the set of virtual blocks for which storage was requested.

Step 17001: The package controller 315 inside the flash package 230 receives from the storage controller 200 information including the below (A) through (C):

(A) Information showing whether or not a real block has been allocated to each virtual block of the set of storage-destination virtual blocks;
(B) All the data of this virtual block for all the virtual blocks to which a real block has been allocated (Specifically, the data inside the real block allocated to this virtual block); and
(C) The virtual page allocation time 3203 and the number of virtual block deletions 3204 corresponding to the virtual block to which the real block has been allocated.

This information is stored in the buffer 330. In addition, the package controller 315 (the package processor 310) acquires from the buffer 330 the information of each virtual block (the information showing whether or not a real block has been allocated).

Step 17002: This is the same as Step 16002. The execution part 12400 searches for a virtual block to which a real block has been allocated on the basis of the acquired information. If no such virtual block exists, the execution part 12400 jumps to Step 17010.

Step 17003: The execution part 12400 allocates an empty block to the virtual block found in Step 17002. Since this process is the same as that in Step 14003 of FIG. 29, a detailed explanation will be omitted.

Step 17004: The execution part 12400 copies the information (the virtual page allocation time 3203 and the number of virtual block deletions 3204 to which the real block has been allocated) of (C) stored in the buffer 330 to the virtual page allocation time 3203 and the number of virtual block deletions 3204 inside the virtual block information 3200 corresponding to the empty block allocation-destination virtual block.

Step 17005: This is basically the same as Step 16004. The execution part 12400 analyzes the real block ID 3301 corresponding to the allocated real block, and specifies from which address of which flash chip 300 the real block allocated in Step 17003 exists.

Step 17006: This is basically the same as Step 16005. The execution part 12400 references the chip information 3100 corresponding to the flash chip 300 in which the specified real block is stored, identifies the package bus 340 to which this flash chip 300 is connected, and recognizes the corresponding package bus transfer unit 350.

Step 17007: The execution part 12400 instructs the package bus transfer unit 350 recognized in Step 17006 from which address of which flash chip 300 the data inside the buffer 330 (the data of (B) in Step 17001) is to be written.

Step 17008: The execution part 12400 waits for the transfer to be completed.

Step 17009: The execution part 12400 returns to Step 17002.

Step 17010: The execution part 12400 sends a completion report to the storage controller 200.

The preceding has been an explanation of one embodiment of the present invention, but this embodiment is merely an example for explaining the present invention, and does not purport to limit the scope of the present invention solely to this embodiment. The present invention may be put into practice in a variety of other modes.

For example, the package controller 315 may be disposed externally to the flash package 230. In accordance with this, the number of package controllers 315 may be greater or fewer than the number of flash packages 230. Specifically, for example, one package controller 315 may be provided for X (where X is an integer of 2 or higher) flash packages 230. In this case, the one package controller 315 will manage the corresponding relationship between a logical address and a physical address for each of X flash packages 230.

Also, for example, a data transfer (a data transfer in page units) between package groups may be carried out without going through the storage controller 200. Specifically, for example, the storage controller 200 may notify the package controller(s) 315 corresponding to the transfer source and/or the transfer destination of the transfer-source address and the transfer-destination address, and the data inside the real block allocated to the virtual block corresponding to the transfer-source page may be transferred to the real block allocated to the virtual block corresponding to the transfer-destination page between the package controller 315 corresponding to the transfer source and the package controller 315 corresponding to the transfer destination without going through the storage controller 200.

[Reference Signs List]
100 Storage system

The invention claimed is:

1. A storage system comprising:
a plurality of first storage devices and a plurity of second storage devices, each of the plurality of first storage devices including a plurality of flash chips, each having a plurality of physical blocks as a unit of data deletion, and a first device controller balancing data deletion among the physical blocks within the first storage devices;
each of the plurality of second storage devices including a second device controller; and
a storage controller configured to:
configure a plurality of first RAID groups,
each of which has a set of first storage devices in the plurality of first storage devices and includes a plurality of first data areas,
each of the plurality of first data areas being divided into each of the set of first storage devices in the first RAID group; and
configure a plurality of second RAID groups,
each of which has a set of second storage devices in the plurality of second storage devices and includes a plurality of second data areas,
each of the plurality of second data areas, being divided into each of the set of second storage devices in the second RAID group, and
each of the plurality of first and second data areas being for storing at least one record set including a plurality of data records and the parity record generated from the plurality of data records,
wherein the storage controller is configured to:
obtain a first information relating to data deletion of each of the plurality of first storage devices;
select at least one first RAID group of the plurality of first RAID groups from which a record set is transferred based on the first information of first storage devices and at least one second RAID group of the plurality of second RAID groups to which the record set is transferred; and
transfer the record set in one of the plurality of data areas from the first RAID group to the second RAID group.

2. A storage system according to claim 1, wherein the storage controller is configured to provide a host computer with a virtual volume including a plurality of virtual data areas, and wherein the plurality of first and second data areas is allocatable to one of the plurality of virtual data areas.

3. A storage system according to claim 2, wherein the storage controller is configured to:
obtain a second information relating to a data write of each of the plurality of first and second data areas,
transfer the record set from a particular first data area which is selected from the first RAID group based on the second information to a particular second data area which is selected from the second RAID group and is not allocated to any of the plurality of virtual data areas, and
change allocation of a data area to a virtual data area, to which the particular first data area is allocated, from the particular first data area to the particular second data area.

4. A storage system according to claim 1, wherein
the number of deletion times in a first storage device of the first RAID group is higher than a first prescribed threshold.

5. A storage system according to claim 1, wherein
the storage controller is configured to receives a write request corresponding to data which have a specific pattern from a host computer to a storage region, specify a first storage device related to the storage region, and send a deletion request to the specified first storage device, wherein
the first device controller of the specified first storage device deletes a plurality of physical blocks designated by the deletion request in response to receiving the deletion request.

6. A storage system according to claim 1, wherein
a total storage capacity of logical blocks provided by the first device controller to the storage controller is larger than a total storage capacity of the plurality of physical blocks in one of the plurality of first storage devices.

7. A storage system according to claim 6, wherein
the first device controller is configured to receive a write request from the storage controller, and allocate one of the plurality of physical blocks to one of the plurality of logical blocks for storing data corresponding to the write request if the physical block is not allocated to the logical block designated by the write request.

8. In a storage system including: a plurality of first storage devices and a plurality of second storage devices, each of the plurality of first storage devices including a plurality of flash chips, each having a plurality of physical blocks as a unit of data deletion, and a first device controller balancing data deletion among the physical blocks within the first storage devices; each of the plurality of second storage devices including a second device controller; and a storage controller, a method comprising the steps of:
configuring, by the storage controller, a plurality of first RAID groups, each of which has a set of first storage devices in the plurality of first storage devices and includes a plurality of first data areas, each of the plurality of first data areas being divided into each of the set of first storage devices in the first RAID group;
configuring, by the storage controller, a plurality of second RAID groups, each of which has a set of second storage devices in the plurality of second storage devices and includes a plurality of second data areas, each of the plurality of second data areas being divided into each of the set of second storage devices in the second RAID group, and each of the plurality of first and second data areas being for storing at least one record set including a plurality of data records and the parity record generated from the plurality of data records;
obtaining, by the storage controller, a first information relating to data deletion of each of the plurality of first storage devices;
selecting, by the storage controller, at least one first RAID group of the plurality of first RAID groups from which a record set is transferred based on the first information of first storage devices and at least one second RAID group of the plurality of second RAID groups to which the record set is transferred; and transferring the record set in one of the plurality of data areas from the first RAID group to the second RAID group.

9. A method according to claim 8, further comprising the step of:

providing, by the storage controller, a host computer with a virtual volume including a plurality of virtual data areas, wherein the plurality of first and second data areas is allocatable to one of the plurality of virtual data areas.

10. A method according to claim 9, further comprising the steps of:

obtaining, by the storage controller, a second information relating to a data write of each of the plurality of first and second data areas;

transferring, by the storage controller, the record set from a particular first data area which is selected from the first RAID group based on the second information to a particular second data area which is selected from the second RAID group and is not allocated to any of the plurality of virtual data areas; and changing, by the storage controller, allocation of a data area to a virtual data area, to which the particular first data area is allocated, from the particular first data area to the particular second data area.

11. A method according to claim 8, wherein the number of deletion times in a first storage device of the first RAID group is higher than a first prescribed threshold.

12. A method according to claim 8, further comprising the steps of:

receiving, by the storage controller, a write request corresponding to data which have a specific pattern from a host computer to a storage region;

specifying, by the storage controller, a first storage device related to the storage region;

sending, by the storage controller, a deletion request to the specified first storage device; and deleting, by the first device controller of the specified first storage device, a plurality of physical blocks designated by the deletion request in response to receiving the deletion request.

13. A method according to claim 8, wherein a total storage capacity of logical blocks provided by the first device controller to the storage controller is larger than a total storage capacity of the plurality of physical blocks in one of the plurality of first storage devices.

14. A method according to claim 13, further comprising the steps of:

receiving, by the first device controller, a write request from the storage controller; and allocating, by the first device controller, one of the plurality of physical blocks to one of the plurality of logical blocks for storing data corresponding to the write request if the physical block is not allocated to the logical block designated by the write request.

* * * * *